(12) United States Patent
Hatakeyama et al.

(10) Patent No.: US 8,057,982 B2
(45) Date of Patent: *Nov. 15, 2011

(54) MONOMER, RESIST COMPOSITION, AND PATTERNING PROCESS

(75) Inventors: Jun Hatakeyama, Joetsu (JP); Takeshi Kinsho, Joetsu (JP); Masaki Ohashi, Joetsu (JP); Kazuhiro Katayama, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 227 days.

This patent is subject to a terminal disclaimer.

(21) Appl. No.: 12/398,483

(22) Filed: Mar. 5, 2009

(65) Prior Publication Data
US 2009/0226843 A1 Sep. 10, 2009

(30) Foreign Application Priority Data

Mar. 5, 2008 (JP) ................................. 2008-054561
Aug. 4, 2008 (JP) ................................. 2008-200430

(51) Int. Cl.
*G03F 7/00* (2006.01)
*G03F 7/004* (2006.01)
*G03F 7/26* (2006.01)
*G03F 7/40* (2006.01)

(52) U.S. Cl. .................... 430/270.1; 430/312; 430/330; 430/331

(58) Field of Classification Search ............... 430/270.1, 430/330, 331, 312
See application file for complete search history.

(56) References Cited

U.S. PATENT DOCUMENTS

| 5,652,084 | A | * | 7/1997 | Cleeves | 430/315 |
| 5,686,223 | A | * | 11/1997 | Cleeves | 430/312 |
| 5,741,625 | A | * | 4/1998 | Bae et al. | 430/312 |
| 6,448,420 | B1 | | 9/2002 | Kinsho et al. | |
| 6,692,893 | B2 | * | 2/2004 | Ohsawa et al. | 430/270.1 |
| 6,743,565 | B2 | * | 6/2004 | Mizutani et al. | 430/270.1 |
| 6,806,026 | B2 | | 10/2004 | Allen et al. | |
| 6,891,596 | B2 | * | 5/2005 | Rostalski et al. | 355/53 |
| 6,908,724 | B2 | * | 6/2005 | Araki et al. | 430/270.1 |
| 7,037,994 | B2 | * | 5/2006 | Sugita et al. | 526/284 |
| 7,399,577 | B2 | | 7/2008 | Yamato et al. | |
| 7,449,277 | B2 | * | 11/2008 | Hatakeyama et al. | 430/270.1 |

(Continued)

FOREIGN PATENT DOCUMENTS

JP 2000-327633 A 11/2000

(Continued)

OTHER PUBLICATIONS

Machine translation of JP2006-169302.*

(Continued)

*Primary Examiner* — Amanda C. Walke
(74) *Attorney, Agent, or Firm* — Westerman, Hattori, Daniels & Adrian, LLP

(57) ABSTRACT

A pattern is formed by applying a positive resist composition comprising a polymer comprising hydroxyalkylnaphthalene-bearing recurring units and acid labile group-bearing recurring units onto a substrate to form a resist film, heat treating and exposing the resist film to radiation, heat treating and developing the resist film with a developer to form a first pattern, and causing the resist film to crosslink and cure with the aid of heat or of acid and heat. A second pattern is then formed in the space area of the first pattern. The double patterning process reduces the pitch between patterns to one half.

17 Claims, 6 Drawing Sheets

U.S. PATENT DOCUMENTS

| | | | |
|---|---|---|---|
| 7,569,326 B2 * | 8/2009 | Ohsawa et al. | 430/270.1 |
| 7,592,125 B2 * | 9/2009 | Suzuki et al. | 430/270.1 |
| 7,741,015 B2 * | 6/2010 | Hatakeyama et al. | 430/312 |
| 7,771,914 B2 * | 8/2010 | Hatakeyama et al. | 430/270.1 |
| 2008/0096134 A1 * | 4/2008 | Sugimoto et al. | 430/287.1 |
| 2009/0087786 A1 * | 4/2009 | Hatakeyama | 430/285.1 |
| 2010/0062379 A1 * | 3/2010 | Iwashita | 430/326 |

FOREIGN PATENT DOCUMENTS

| | | | |
|---|---|---|---|
| JP | 2000310863 A * | 11/2000 | |
| JP | 2004-168748 A | 6/2004 | |
| JP | 2005008769 A * | 1/2005 | |
| JP | 2005-330369 A | 12/2005 | |
| JP | 3762758 B2 | 4/2006 | |
| JP | 2007-293294 A | 11/2007 | |
| JP | 2007293294 A * | 11/2007 | |
| WO | 2004/074242 A2 | 9/2004 | |
| WO | WO 2007142209 A1 * | 12/2007 | |

OTHER PUBLICATIONS

Machine translation of JP2005-008769.*

Machine translation of JP 2007-293294.*

B. J. Lin "Semiconductor Foundry, Lithography, and Partners," Micropatterning Division; TSMC; Inc., 2002; vol. 4690.

S. Owa et al. "Immersion lithography; its potential performance and issues," Optical Microlithography XVI; 2003; vol. 5040; p. 724.

M. Maenhoudt et al. "Double Patterning scheme for sub-0.25 k1 single damascene structures at NA=0.75, λ=193nm," Optical Microlithography XVIII; 2005; vol. 5754; p. 1508.

M. J. Nasrullah et al. "Poly(4-(1-hydroxyalkyl)styrene based photoresist materials: Design, synthesis and their lithographic performance," Advances in Resist Technology and Processing XXIII; 2006; vol. 6153; p. 61532F-1-6153F-8.

* cited by examiner

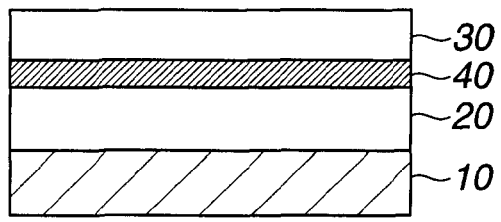
FIG.1A PRIOR ART — APPLY PHOTORESIST
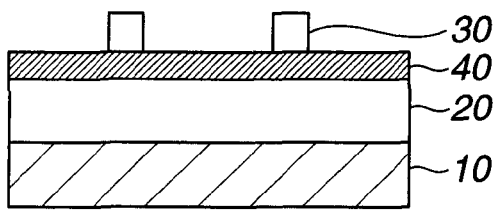
FIG.1B PRIOR ART — EXPOSE AND DEVELOP PHOTORESIST
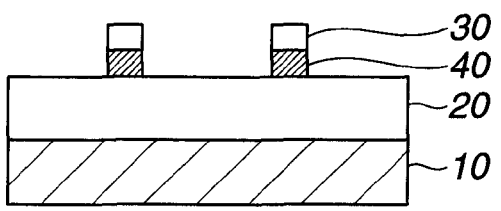
FIG.1C PRIOR ART — ETCH HARD MASK
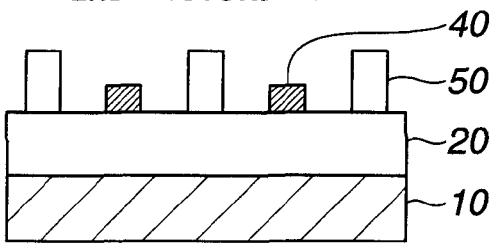
FIG.1D PRIOR ART — APPLY, EXPOSE AND DEVELOP 2ND PHOTORESIST
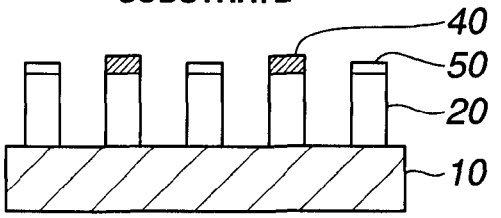
FIG.1E PRIOR ART — ETCH PROCESSABLE SUBSTRATE

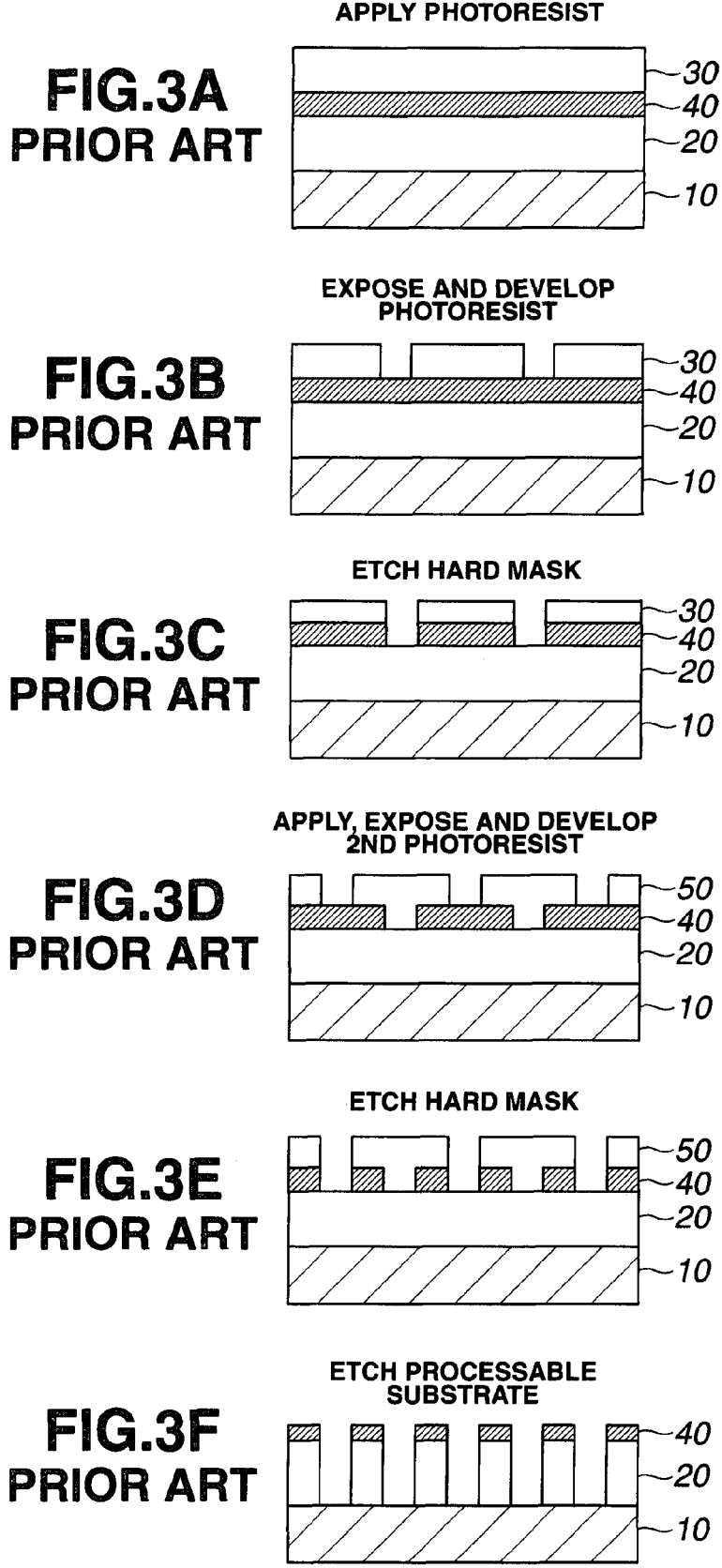

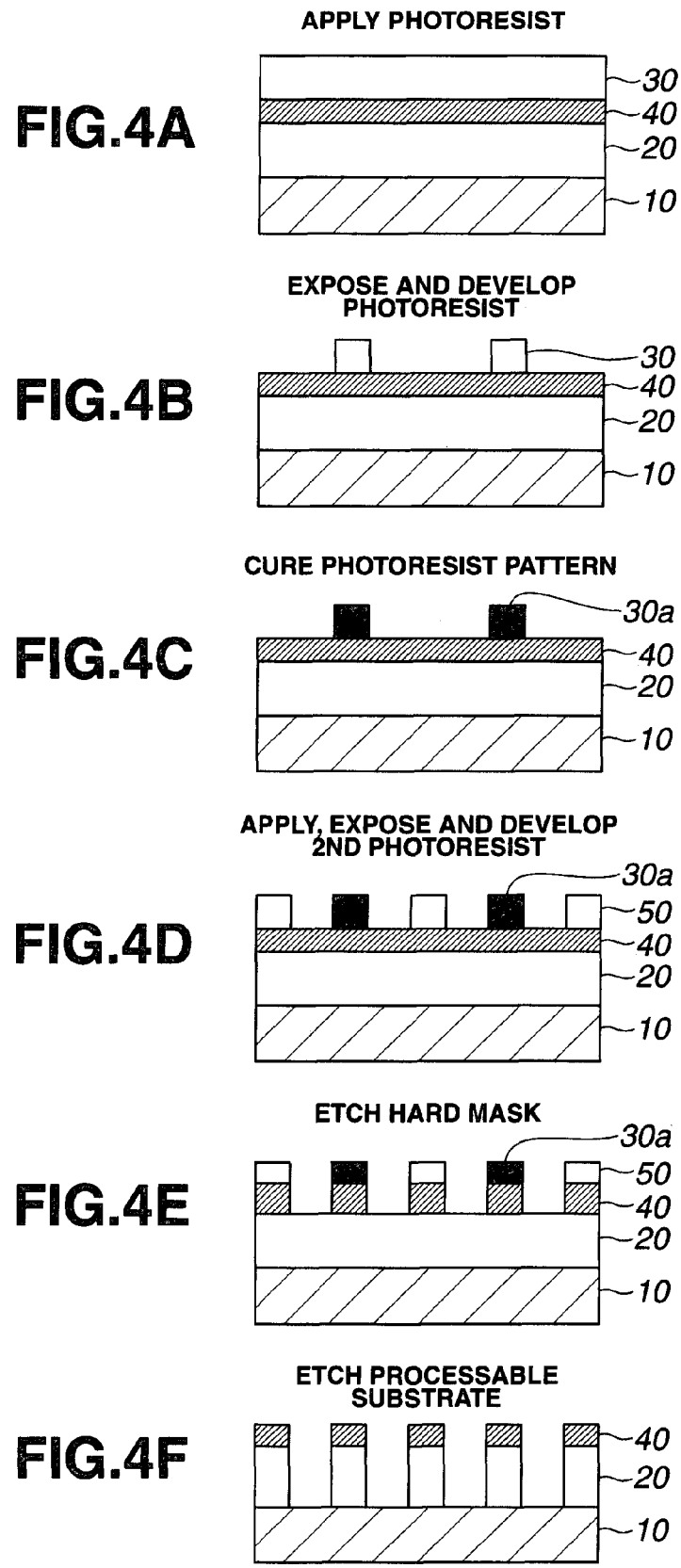

1ST PATTERN

COMBINATION OF 1ST AND 2ND PATTERNS

1ST PATTERN

COMBINATION OF 1ST AND 2ND PATTERNS

1ST PATTERN      2ND PATTERN

MONOMER, RESIST COMPOSITION, AND PATTERNING PROCESS

CROSS-REFERENCE TO RELATED APPLICATION

This non-provisional application claims priority under 35 U.S.C. §119(a) on Patent Application Nos. 2008-054561 and 2008-200430 filed in Japan on Mar. 5, 2008 and Aug. 4, 2008, respectively, the entire contents of which are hereby incorporated by reference.

TECHNICAL FIELD

This invention relates to a pattern forming process including effecting first exposure to form a first pattern, and effecting second exposure to form a second line pattern, typically in a space portion of the first pattern, for thereby reducing the distance between the first and second patterns; and a resist composition for use in the process. It also relates to a polymerizable compound which is a useful monomer to produce a base polymer in the resist composition.

BACKGROUND ART

In the recent drive for higher integration and operating speeds in LSI devices, the pattern rule is made drastically finer. The photolithography which is currently on widespread use in the art is approaching the essential limit of resolution determined by the wavelength of a light source. As the light source used in the lithography for resist pattern formation, g-line (436 nm) or i-line (365 nm) from a mercury lamp was widely used in 1980's. Reducing the wavelength of exposure light was believed effective as the means for further reducing the feature size. For the mass production process of 64 MB dynamic random access memories (DRAM, processing feature size 0.25 µm or less) in 1990's and later ones, the exposure light source of i-line (365 nm) was replaced by a KrF excimer laser having a shorter wavelength of 248 nm. However, for the fabrication of DRAM with a degree of integration of 256 MB and 1 GB or more requiring a finer patterning technology (processing feature size 0.2 µm or less), a shorter wavelength light source was required. Over a decade, photolithography using ArF excimer laser light (193 nm) has been under active investigation. It was expected at the initial that the ArF lithography would be applied to the fabrication of 180-nm node devices. However, the KrF excimer lithography survived to the mass-scale fabrication of 130-nm node devices. So, the full application of ArF lithography started from the 90-nm node. The ArF lithography combined with a lens having an increased numerical aperture (NA) of 0.9 is considered to comply with 65-nm node devices. For the next 45-nm node devices which required an advancement to reduce the wavelength of exposure light, the $F_2$ lithography of 157 nm wavelength became a candidate. However, for the reasons that the projection lens uses a large amount of expensive $CaF_2$ single crystal, the scanner thus becomes expensive, hard pellicles are introduced due to the extremely low durability of soft pellicles, the optical system must be accordingly altered, and the etch resistance of resist is low; the postponement of $F_2$ lithography and the early introduction of ArF immersion lithography were advocated (see Proc. SPIE Vol. 4690 xxix (2002)).

In the ArF immersion lithography, the space between the projection lens and the wafer is filled with water. Since water has a refractive index of 1.44 at 193 nm, pattern formation is possible even using a lens having a numerical aperture (NA) of 1.0 or greater. Theoretically, it is possible to increase the NA to nearly 1.44. It was initially recognized that the resolution could be degraded and the focus be shifted by a variation of water's refractive index with a temperature change. The problem of refractive index variation could be solved by controlling the water temperature within a tolerance of $1/100°$ C. while it was recognized that the impact of heat from the resist film upon light exposure drew little concern. There was a likelihood that micro-bubbles in water could be transferred to the pattern. It was found that the risk of bubble generation is obviated by thorough deaeration of water and the risk of bubble generation from the resist film upon light exposure is substantially nil. At the initial phase in 1980's of the immersion lithography, a method of immersing an overall stage in water was proposed. Later proposed was a partial-fill method of using a water feed/drain nozzle for introducing water only between the projection lens and the wafer so as to comply with the operation of a high-speed scanner. In principle, the immersion technique using water enabled lens design to a NA of 1 or greater. In optical systems based on traditional refractive index materials, this leads to giant lenses, which would deform by their own weight. For the design of more compact lenses, a catadioptric system was proposed, accelerating the lens design to a NA of 1.0 or greater. A combination of a lens having NA of 1.2 or greater with strong resolution enhancement technology suggests a way to the 45-nm node (see Proc. SPIE, Vol. 5040, p 724 (2003)). Efforts have also been made to develop lenses of NA 1.35.

One candidate for the 32-nm node lithography is lithography using extreme ultraviolet (EUV) radiation with wavelength 13.5 nm. The EUV lithography has many accumulative problems to be overcome, including increased laser output, increased sensitivity, increased resolution and minimized line edge roughness (LER) of resist coating, defect-free MoSi laminate mask, reduced aberration of reflection mirror, and the like.

The water immersion lithography using a NA 1.35 lens achieves an ultimate resolution of 40 to 38 nm at the maximum NA, but cannot reach 32 nm. Efforts have been made to develop higher refractive index materials in order to further increase NA. It is the minimum refractive index among projection lens, liquid, and resist film that determines the NA limit of lenses. In the case of water immersion, the refractive index of water is the lowest in comparison with the projection lens (refractive index 1.5 for synthetic quartz) and the resist film (refractive index 1.7 for prior art methacrylate-based film). Thus the NA of projection lens is determined by the refractive index of water. Recent efforts succeeded in developing a highly transparent liquid having a refractive index of 1.65. In this situation, the refractive index of projection lens made of synthetic quartz is the lowest, suggesting a need to develop a projection lens material with a higher refractive index. LuAG (lutetium aluminum garnet $Lu_3Al_5O_{12}$) having a refractive index of at least 2 is the most promising material, but has the problems of birefringence and noticeable absorption. Even if a projection lens material with a refractive index of 1.8 or greater is developed, the liquid with a refractive index of 1.65 limits the NA to 1.55 at most, failing in resolution of 32 nm. For resolution of 32 nm, a liquid with a refractive index of 1.8 or greater is necessary. Such a liquid material has not been discovered because of a tradeoff between absorption and refractive index. In the case of alkane compounds, bridged cyclic compounds are preferred to linear ones in order to increase the refractive index, but the cyclic compounds undesirably have too high a viscosity to follow high-speed scanning on the exposure tool stage. If a liquid with a refractive index of 1.8 is developed, then the component having the lowest refractive index is the resist film, suggesting a need to increase the refractive index of a resist film to 1.8 or higher.

The process that now draws attention under the above-discussed circumstances is a double patterning process involving a first set of exposure and development to form a first pattern and a second set of exposure and development to form a pattern between features of the first pattern. See Proc. SPIE, Vol. 5754, p 1508 (2005). A number of double patterning processes are proposed. One exemplary process involves a first set of exposure and development to form a photoresist pattern having lines and spaces at intervals of 1:3, processing the underlying layer of hard mask by dry etching, applying another layer of hard mask thereon, a second set of exposure and development of a photoresist film to form a line pattern in the spaces of the first exposure, and processing the hard mask by dry etching, thereby forming a line-and-space pattern at a half pitch of the first pattern. An alternative process involves a first set of exposure and development to form a photoresist pattern having spaces and lines at intervals of 1:3, processing the underlying layer of hard mask by dry etching, applying a photoresist layer thereon, a second set of exposure and development to form a second space pattern on the remaining hard mask portion, and processing the hard mask by dry etching. In either process, the hard mask is processed by two dry etchings.

While the former process requires two applications of hard mask, the latter process uses only one layer of hard mask, but requires to form a trench pattern which is difficult to resolve as compared with the line pattern. The latter process includes the use of a negative resist material in forming the trench pattern. This allows for use of high contrast light as in the formation of lines as a positive pattern. However, since the negative resist material has a lower dissolution contrast than the positive resist material, a comparison of the formation of lines from the positive resist material with the formation of a trench pattern of the same size from the negative resist material reveals that the resolution achieved with the negative resist material is lower. After a wide trench pattern is formed from the positive resist material by the latter process, there may be applied a thermal flow method of heating the substrate for shrinkage of the trench pattern, or a RELACS method of coating a water-soluble film on the trench pattern as developed and heating to induce crosslinking at the resist film surface for achieving shrinkage of the trench pattern. These have the drawbacks that the proximity bias is degraded and the process is further complicated, leading to reduced throughputs.

Both the former and latter processes require two etchings for substrate processing, leaving the issues of a reduced throughput and deformation and misregistration of the pattern by two etchings.

One method that proceeds with a single etching is by using a negative resist material in a first exposure and a positive resist material in a second exposure. Another method is by using a positive resist material in a first exposure and a negative resist material in a higher alcohol of 4 or more carbon atoms, in which the positive resist material is not dissolvable, in a second exposure. However, these methods using negative resist materials with low resolution entail degradation of resolution.

A method which dispenses with post-exposure bake (PEB) and development between first and second exposures is the simplest method. This method involves first exposure, replacement by a mask having a shifted pattern drawn, second exposure, PEB, development and dry etching. Since the throughput is substantially reduced by mask replacement on every exposure, the first exposure is carried out in a somewhat integrated manner before the second exposure is carried out. Then, depending on the holding time between the first exposure and the second exposure, a dimensional variation due to acid diffusion and a profile variation such as T-top profile formation occur. To suppress the T-top formation, application of a resist protective film is effective. Application of a resist protective film for immersion lithography enables a process involving two exposures, one PEB, development and dry etching. First exposure and second exposure may be consecutively carried out by two scanners arranged side by side. This gives rise to such problems as misregistration due to lens aberration between the two scanners and the doubled scanner cost.

The critical issue associated with double patterning is an overlay accuracy between first and second patterns. Since the magnitude of misregistration is reflected by a variation of line size, an attempt to form 32-nm lines at an accuracy of 10%, for example, requires an overlay accuracy within 3.2 nm. Since currently available scanners have an overlay accuracy of the order of 8 nm, a significant improvement in accuracy is necessary.

The issue of line edge roughness (LER) of resist patterns becomes serious. While a dimensional variation of gate electrodes is a problem that governs the transistor performance, the magnitude of LER becomes a factor of causing variations to the threshold current of transistors as the feature size becomes increasingly finer. It is intended to reduce the LER through improvements in the resist material, dry etching technology or photoresist process. As to the resist material, a contrast increase by increasing the amounts of both acid generator and quencher added, a reduction of swelling in alkaline developer by incorporating adhesive groups such as fluoroalcohol or lactone, and the like contribute to the roughness reduction. As to the photoresist process, flow processes such as thermal flow after development and bromine plasma treatment are effective. However, the flow processes have the problem of size changes due to pattern deformation and pattern shrinkage.

The crosslinking reaction of benzyl alcohol in the presence of acid is well known from the past, and it is generally used as a curing agent. This crosslinking reaction is utilized in many compositions including a crosslinkable antireflective coating (ARC) composition comprising acenaphthylene methanol as disclosed in JP-A 2004-168748, and a pattern shrinking agent comprising a copolymer of acenaphthylene methanol and vinylnaphthalene methanol and capable of acid-catalyzed crosslinking as disclosed in JP-A 2007-293294. Further JP-A 2005-330369 describes a positive resist composition comprising a copolymer of acenaphthylene methanol and acid labile group-substituted hydroxystyrene, and U.S. Pat. No. 6,806,026 (JP 3762758) describes 2-methacryloxy-6-hydroxymethylnaphthalene, a copolymer thereof and a negative resist. Further, a negative resist using hydroxyalkylstyrene and its crosslinking reaction mechanism are reported in Proc. SPIE Vol. 6153 p 61532 F-1 (2006).

CITATION LIST

Patent Document 1a: JP-A 2004-168748
Patent Document 2: JP-A 2007-293294
Patent Document 3: JP-A 2005-330369
Patent Document 4: U.S. Pat. No. 6,806,026 (JP 3762758)
Non-patent Document 1a: Proc. SPIE Vol. 4690 xxix (2002)
Non-patent Document 2: Proc. SPIE Vol. 5040 p 724 (2003)

Non-patent Document 3: Proc. SPIE Vol. 5754 P 1508 (2005)
Non-patent Document 4: Proc. SPIE Vol. 6153 p 61532 F-1 (2006)

SUMMARY OF INVENTION

As discussed above, when substrate processing is carried out by double dry etchings using a resist pattern fabricated by double exposures and developments, the throughput is reduced to one half. Also an issue of pattern misregistration by dry etchings occurs.

An object of the invention is to provide a pattern forming process which involves curing of a resist coating having specific functional groups for preventing intermixing between first and second resist films, in order to enable a double patterning process of processing a substrate by a single dry etching; and a resist composition for use with the process. Another object is to provide a polymerizable compound which is a useful monomer to prepare a base polymer for use in the resist composition.

The above and other objects can be achieved by a pattern forming process, a resist composition, and a monomer, as defined below.

[1a] A process for forming a pattern, comprising the steps of:
applying a positive resist composition onto a substrate to form a resist film, said resist composition comprising a polymer comprising recurring units derived from a substituted or unsubstituted hydroxyalkylnaphthalene and recurring units which become alkali soluble under the action of an acid,
heat treating the resist film and exposing it to high-energy radiation,
heat treating the exposed resist film and developing it with a developer, and
then causing the resist film to crosslink and cure with the aid of heat or of acid and heat.

[2] The pattern forming process of [1a] comprising the steps of:
applying a positive resist composition onto a substrate to form a resist film, said resist composition comprising a polymer comprising recurring units derived from a substituted or unsubstituted hydroxyalkylnaphthalene and recurring units which become alkali soluble under the action of an acid,
heat treating the resist film and exposing it to high-energy radiation,
heat treating the exposed resist film and developing it with a developer, and
then causing the resist film to crosslink and cure with the aid of heat or of acid and heat,
said substituted or unsubstituted hydroxyalkylnaphthalene-bearing recurring units being recurring units (a-1a) and/or (a-2) represented by the general formula (1a):

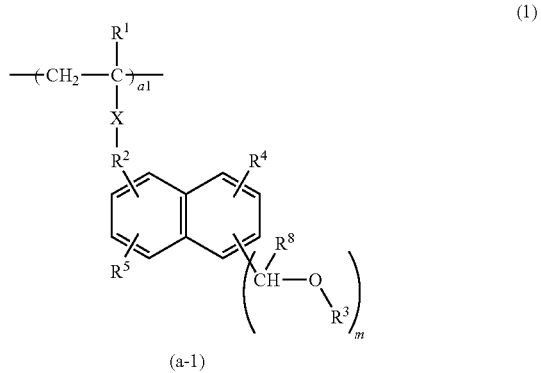

(a-1)

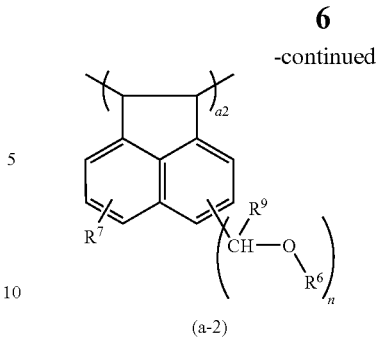

(a-2)

wherein $R^1$ is each independently hydrogen or methyl, X is a single bond, —C(=O)—O—, —O— or —C(=O)—NH—, $R^2$ is a single bond, or a straight, branched, cyclic or bridged cyclic $C_1$-$C_6$ alkylene group which may have an ether, thioether or ester group, $R^3$ and $R^6$ are hydrogen, straight, branched or cyclic $C_1$-$C_{10}$ alkyl, acyl or alkoxycarbonyl, or an acid labile group, $R^4$ and $R^5$ are hydrogen, hydroxy, alkoxy, or $C_1$-$C_4$ alkyl, or $R^2$ and $R^4$, or $R^4$ and $R^5$ may bond together to form a $C_2$-$C_6$ non-aromatic ring with the carbon atoms to which they are attached, $R^7$ is hydrogen, hydroxy, alkoxy, or $C_1$-$C_6$ alkyl, $R^8$ and $R^9$ are hydrogen or straight, branched or cyclic $C_1$-$C_6$ alkyl, m and n each are an integer of 1 to 6, and a1 and a2 are numbers in the range: $0 \leq a1 < 1.0$, $0 \leq a2 < 1.0$, and $0 < a1+a2 < 1.0$.

[3] A process for forming a pattern, comprising the steps of:
applying a positive resist composition onto a substrate to form a resist film, said resist composition comprising a polymer comprising recurring units (a-1a) and/or (a-2) represented by the general formula (1a) and recurring units which become alkali soluble under the action of an acid,
heat treating the resist film and exposing it to high-energy radiation,
heat treating the exposed resist film and developing it with a developer,
then causing the resist film to crosslink and cure with the aid of heat or of acid and heat, to form a first pattern,
applying a second positive resist composition on the substrate to form a second resist film on the substrate and the first pattern,
heat treating the second resist film and exposing it to high-energy radiation,
heat treating the exposed second resist film and developing it with a developer to form a second pattern,
said recurring units (a-1a) and (a-2) being represented by the general formula (1a):

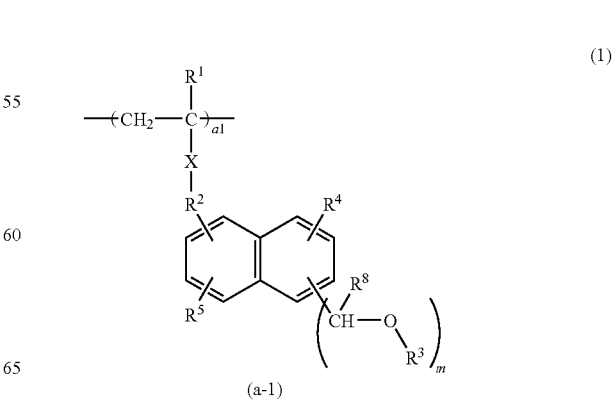

(a-1)

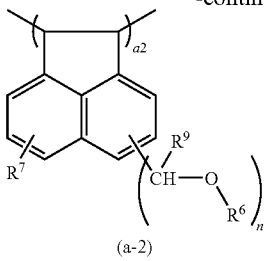

(a-2)

wherein $R^1$ is each independently hydrogen or methyl, X is a single bond, —C(=O)—O—, —O— or —C(=O)—NH—, $R^2$ is a single bond, or a straight, branched, cyclic or bridged cyclic $C_1$a-$C_6$ alkylene group which may have an ether, thioether or ester group, $R^3$ and $R^6$ are hydrogen, straight, branched or cyclic $C_1$-$C_{10}$ alkyl, acyl or alkoxycarbonyl, or an acid labile group, $R^4$ and $R^5$ are hydrogen, hydroxy, alkoxy, or $C_1$a-$C_4$ alkyl, or $R^2$ and $R^4$, or $R^4$ and $R^5$ may bond together to form a $C_2$-$C_6$ non-aromatic ring with the carbon atoms to which they are attached, $R^7$ is hydrogen, hydroxy, alkoxy, or $C_1$a-$C_6$ alkyl, $R^8$ and $R^9$ are hydrogen or straight, branched or cyclic $C_1$a-$C_6$ alkyl, m and n each are an integer of 1 to 6, and a1 and a2 are numbers in the range: $0 \leq a1 < 1.0$, $0 \leq a2 < 1.0$, and $0 < a1+a2 < 1.0$.

[4] The pattern forming process of [3] wherein the first pattern includes spaces where the second resist film is left behind to form the second pattern so that the distance between the patterns is reduced by one half.

[5] The pattern forming process of [3] wherein the second pattern is formed as intersecting the first pattern.

[6] The pattern forming process of [3] wherein the second pattern is formed in a space portion of the first pattern where first pattern features are absent and in a different direction from the first pattern.

[7] The pattern forming process of any one of [3] to [6] wherein after formation of the first and second patterns, the substrate is processed by dry etching.

[8] The pattern forming process of any one of [3] to [7] wherein the exposure steps for forming the first and second resist patterns are performed by immersion lithography including projecting radiation from an ArF excimer laser of wavelength 193 nm through a lens and holding a liquid having a refractive index of at least 1.4 between the lens and the coated substrate.

[9] The pattern forming process of [8] wherein the liquid having a refractive index of at least 1.4 is water.

[10] The pattern forming process of any one of [2] to [7] wherein said polymer further comprises recurring units (a-3) having the general formula (3):

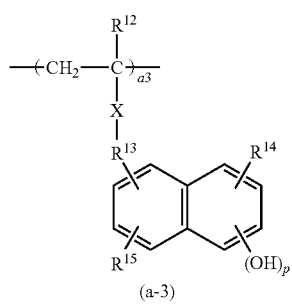

(a-3)

wherein $R^{12}$ is hydrogen or methyl, X is a single bond, —C(=O)—O—, —O— or —C(=O)—NH—, $R^{13}$ is a single bond, or a straight, branched, cyclic or bridged cyclic $C_1$a-$C_6$ alkylene group which may have an ether, thioether or ester group, $R^{14}$ and $R^{15}$ are hydrogen or $C_1$a-$C_4$ alkyl, p is an integer of 1 to 3, and a3 is a number in the range: $0 < a3 < 1.0$.

[11a] The pattern forming process of any one of [1a] to [10] wherein the step of causing the resist film to crosslink and cure with the aid of heat or acid and heat includes exposing to radiation or heating the resist film to cause an acid to generate in the resist film and then heating the resist film at 130 to 300° C. to introduce crosslinks in the resist film to convert it to be insoluble in solvent and alkaline developer.

[12] The pattern forming process of any one of [1a] to [11a] wherein said recurring units which become alkali soluble under the action of an acid are recurring units (b) having the general formula (2):

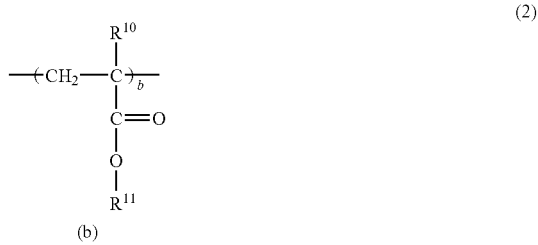

(b)

wherein $R^{10}$ is hydrogen or methyl, $R^{11}$ is an acid labile group, and b is a number in the range: $0 < b \leq 0.8$.

[13] A positive resist composition for use in the pattern forming process of any one of [1a] to [9], comprising a polymer, an organic solvent, and an acid generator. The polymer comprises recurring units (a-1a) and/or (a-2) represented by the general formula (1a) and recurring units (b) represented by the general formula (2):

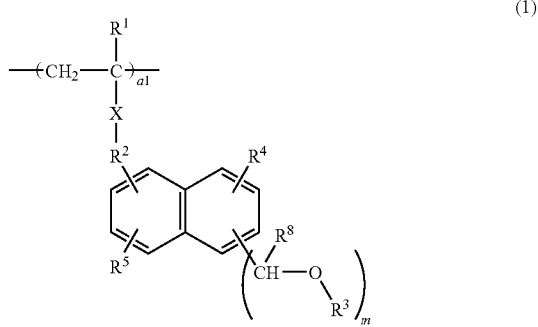

(a-1)

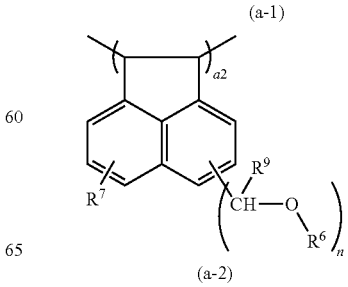

(a-2)

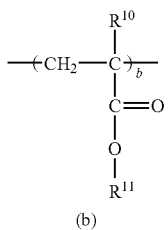

(b)

wherein $R^1$ is each independently hydrogen or methyl, X is a single bond, —C(=O)—O—, —O— or —C(=O)—NH—, $R^2$ is a single bond, or a straight, branched, cyclic or bridged cyclic $C_1$-$C_6$ alkylene group which may have an ether, thioether or ester group, $R^3$ and $R^6$ are hydrogen, straight, branched or cyclic $C_1$-$C_{10}$ alkyl, acyl or alkoxycarbonyl, or an acid labile group, $R^4$ and $R^5$ are hydrogen, hydroxy, alkoxy, or $C_1$-$C_4$ alkyl, or $R^2$ and $R^4$, or $R^4$ and $R^5$ may bond together to form a $C_2$-$C_6$ non-aromatic ring with the carbon atoms to which they are attached, $R^7$ is hydrogen, hydroxy, alkoxy, or $C_1$-$C_6$ alkyl, $R^8$ and $R^9$ are hydrogen or straight, branched or cyclic $C_1$-$C_6$ alkyl, $R^{10}$ is hydrogen or methyl, $R^{11}$ is an acid labile group, m and n each are an integer of 1 to 6, a1a, a2 and b are numbers in the range: $0 \leq a1 < 1.0$, $0 \leq a2 < 1.0$, $0 < a1a+a2 < 1.0$, $0 < b \leq 0.8$, and $0.1a \leq a1a+a2+b \leq 1.0$. The acid generator is represented by the general formula (P1aa-1a), (P1aa-2) or (P1aa-3):

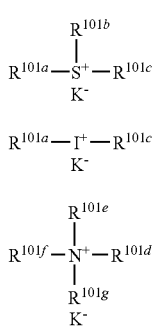

wherein $R^{101a}$, $R^{101b}$, and $R^{101c}$ are each independently straight, branched or cyclic $C_1$-$C_{12}$ alkyl, alkenyl, oxoalkyl or oxoalkenyl, $C_6$-$C_{20}$ aryl, or $C_7$-$C_{12}$ aralkyl or aryloxoalkyl group, in which some or all hydrogen atoms may be replaced by alkoxy groups, $R^{101b}$ and $R^{101c}$ may bond together to form a ring with the sulfur atom to which they are attached, each of $R^{101b}$ and $R^{101c}$ is $C_1$-$C_6$ alkylene when they form a ring, $K^-$ is a sulfonate having at least one α-position fluorinated, perfluoroalkylimidate or perfluoroalkylmethidate, $R^{101d}$, $R^{101e}$, $R^{101f}$, and $R^{101g}$ are each independently hydrogen, straight, branched or cyclic $C_1$-$C_{12}$ alkyl, alkenyl, oxoalkyl or oxoalkenyl group, $C_6$-$C_{20}$ aryl group, or $C_7$-$C_{12}$ aralkyl or aryloxoalkyl group, in which some or all hydrogen atoms may be substituted by alkoxy groups, or $R^{101d}$ and $R^{101d}$, or $R^{101e}$, $R^{101d}$, $R^{101e}$ and $R^{101f}$ may bond together to form a ring with the nitrogen atom to which they are attached, and each of $R^{101d}$ and $R^{101e}$, or $R^{101d}$, $R^{101e}$ and $R^{101f}$ is an $C_3$-$C_{10}$ alkylene group or a group forming a hetero-aromatic ring having the nitrogen atom therein when they form a ring.

[14] The positive resist composition of [13] wherein said polymer comprising recurring units (a-1a) and/or (a-2) represented by the general formula (1a) and recurring units (b) represented by the general formula (2) further comprises hydroxynaphthyl-bearing recurring units (a-3) represented by the general formula (3):

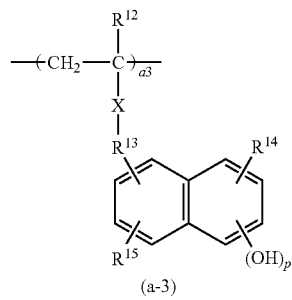

wherein $R^{12}$ is hydrogen or methyl, X is a single bond, —C(=O)—O—, —O— or —C(=O)—NH—, $R^{13}$ is a single bond, or a straight, branched, cyclic or bridged cyclic $C_1$-$C_6$ alkylene group which may have an ether, thioether or ester group, $R^{14}$ and $R^{15}$ are hydrogen or $C_1$-$C_4$ alkyl, p is an integer of 1 to 3, and a3 is a number in the range: $0 < a3 < 1.0$.

[15] The positive resist composition of [13] or [14], further comprising a crosslinker.

[16] The positive resist composition of [13], [14] or [15], further comprising a basic compound and/or a surfactant.

[17] A polymerizable monomer compound having the general formula (4):

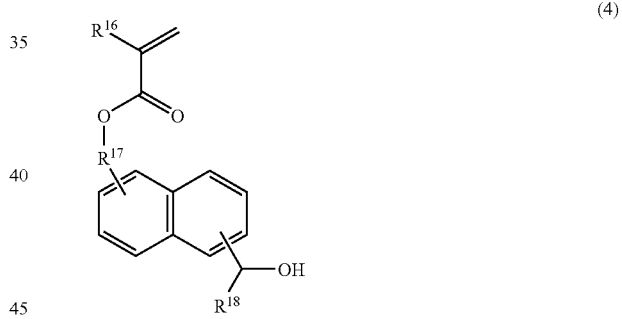

wherein $R^{16}$ is hydrogen or methyl, $R^{17}$ is a single bond, or a straight, branched, cyclic or bridged cyclic $C_1$-$C_6$ alkylene group which may have an ether, thioether or ester group, $R^{18}$ is hydrogen or straight, branched or cyclic $C_1$-$C_6$ alkyl, with the combination being excluded that $R^{17}$ is a single bond, $R^{18}$ is hydrogen, and the oxygen atom and —$CH_2OH$ bond to the naphthalene at 2- and 6-positions.

ADVANTAGEOUS EFFECTS OF INVENTION

According to the invention, a first pattern is formed through exposure and development using a resist composition comprising a polymer obtained through copolymerization of hydroxyalkylnaphthalene-bearing recurring units and acid labile group-bearing recurring units and an acid generator. Through heat- or acid and heat-induced crosslinking reaction, the first pattern is then insolubilized in alkaline developer and resist solution. Another resist solution is further applied onto the first pattern, exposed and developed to form a second pattern in the space area of the first pattern. This double patterning process reduces the pitch between patterns to one half. The substrate can be processed by a single dry etching.

BRIEF DESCRIPTION OF THE DRAWINGS

FIG. 1 is a cross-sectional view of an exemplary prior art double patterning process. FIG. 1-A shows a laminate of substrate, processable substrate, hard mask and resist film, FIG. 1-B shows the resist film being exposed and developed, FIG. 1-C shows the hard mask being etched, FIG. 1-D shows a second resist film being formed, exposed and developed, and FIG. 1-E shows the processable substrate being etched.

FIG. 2-A shows a laminate of substrate, processable substrate, 1st and 2nd hard masks and resist film, FIG. 2-B shows the resist film being exposed and developed, FIG. 2-C shows the 2nd hard mask being etched, FIG. 2-D shows, after removal of the first resist film, a second resist film being formed, exposed and developed, FIG. 2-E shows the 1st hard mask being etched, and FIG. 2-F shows the processable substrate being etched.

FIG. 3 is a cross-sectional view of a further exemplary prior art double patterning process. FIG. 3-A shows a laminate of substrate, processable substrate, hard mask and resist film, FIG. 3-B shows the resist film being exposed and developed, FIG. 3-C shows the hard mask being etched, FIG. 3-D shows, after removal of the first resist film, a second resist film being formed, exposed and developed, FIG. 3-E shows the hard mask being etched, and FIG. 3-F shows the processable substrate being etched.

FIG. 4 is a cross-sectional view of a double patterning process according one embodiment of the invention. FIG. 4-A shows a laminate of substrate, processable substrate, hard mask and resist film, FIG. 4-B shows the resist film being exposed and developed, FIG. 4-C shows the resist film being crosslinked, FIG. 4-D shows a second resist film being formed, exposed and developed, FIG. 4-E shows the hard mask being etched, and FIG. 4-F shows the processable substrate being etched.

FIG. 5-A shows a first pattern being formed, and FIG. 5-B shows a second pattern being formed, after formation of the first pattern, so as to intersect the first pattern.

FIG. 6-A shows a first pattern being formed, and FIG. 6-B shows a second pattern being formed after formation of the first pattern, and spaced from the first pattern.

DESCRIPTION OF EMBODIMENTS

Figure 2A:
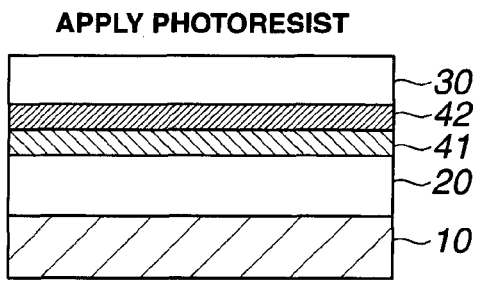
FIG. 2 is a cross-sectional view of another exemplary prior art double patterning process.
Figure 2B:
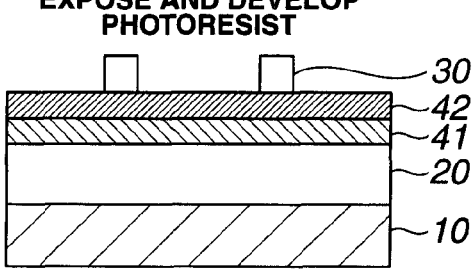
Figure 2C:
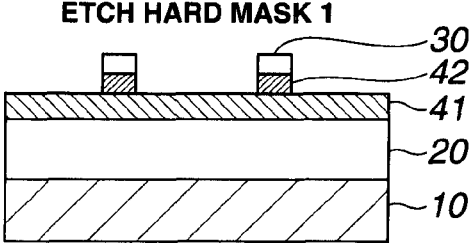
Figure 2D:
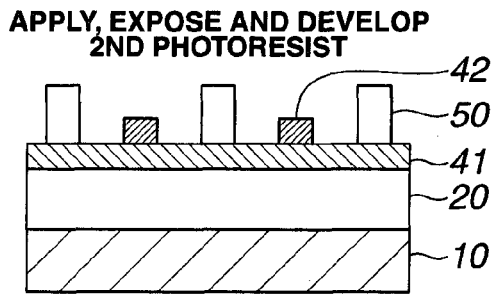
Figure 2E:
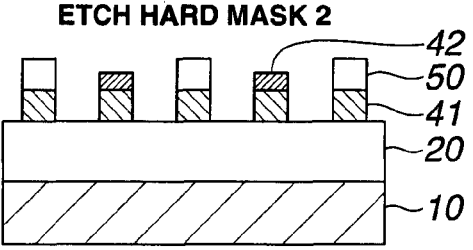
Figure 2F:
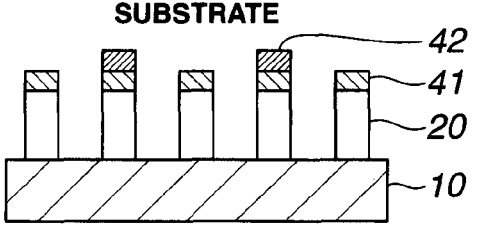

The singular forms "a," "an" and "the" include plural referents unless the context clearly dictates otherwise.

As used herein, the terminology "($C_x$-$C_y$)", as applied to a particular unit, such as, for example, a chemical compound or a chemical substituent group, means having a carbon atom content of from "x" carbon atoms to "y" carbon atoms per such unit.

In connection with the double patterning lithography involving double exposures and developments to form a half-pitch pattern, the inventors made efforts to develop a positive resist material which enables to process a substrate by a single dry etching.

The inventors have discovered that a double patterning process capable of reducing the pitch between patterns to one half can be practiced by applying to a substrate a resist composition comprising a polymer obtained through copolymerization of optionally substituted hydroxyalkylnaphthalene-bearing recurring units and acid labile group-bearing recurring units and an acid generator, and effecting exposure and development to form a first pattern of the positive resist composition on the substrate. Then crosslinking reaction is effected with the aid of heat or of acid and heat, for rendering the first pattern insoluble in alkaline developer and resist solution. A second resist solution is further applied onto the first pattern, followed by exposure and development to form a second pattern, typically in the space area of the first pattern. Then the substrate can be processed by a single dry etching. The present invention is predicated on this discovery.

The polymer used in the pattern forming process of the invention is defined as comprising optionally substituted hydroxyalkylnaphthalene-bearing recurring units and specifically, recurring units (a-1a) and/or (a-2) represented by the general formula (1a):

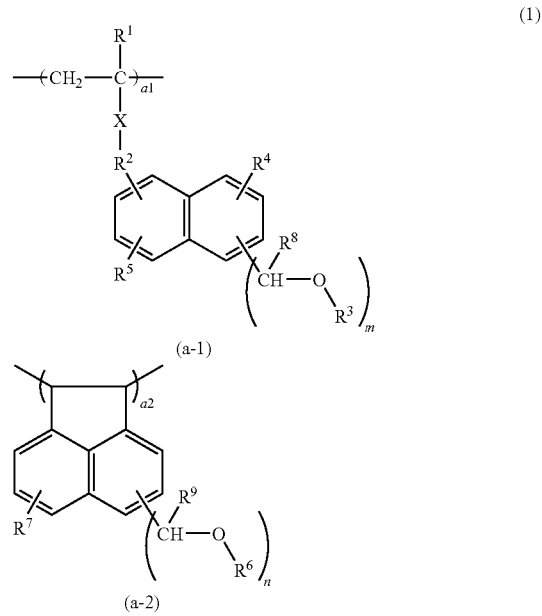

Herein $R^1$ is each independently hydrogen or methyl, X is a single bond, —C(=O)—O—, —O— or —C(=O)—NH—, $R^2$ is a single bond, or a straight, branched, cyclic or bridged cyclic $C_1$a-$C_6$ alkylene group which may have an ether, thioether or ester group, $R^3$ and $R^6$ each are hydrogen, a straight, branched or cyclic $C_1$a-$C_{10}$ alkyl, acyl or alkoxycarbonyl group, or an acid labile group, $R^4$ and $R^5$ each are hydrogen, hydroxy, alkoxy, or $C_1$a-$C_4$ alkyl group, or a pair of $R^2$ and $R^4$, or $R^4$ and $R^5$ may bond together to form a $C_2$-$C_6$ non-aromatic ring with the carbon atoms to which they are attached, $R^7$ is hydrogen, hydroxy, alkoxy, or $C_1$a-$C_6$ alkyl group, $R^8$ and $R^9$ each are hydrogen or a straight, branched or cyclic $C_1$a-$C_6$ alkyl group, m and n each are an integer of 1 to 6, and a1 and a2 are numbers in the range: $0 \leq a1 < 1.0$, $0 \leq a2 < 1.0$, and $0 < a1+a2 < 1.0$.

Exemplary $C_1$a-$C_6$ alkyl groups include methyl, ethyl, n-propyl, isopropyl, n-butyl, isobutyl, sec-butyl, n-pentyl, isopentyl, cyclopentyl, n-hexyl, and cyclohexyl. Exemplary $C_1$a-$C_6$ alkylene groups include methylene, ethylene, n-propylene, isopropylene, n-butylene, isobutylene, sec-butylene, n-pentylene, isopentylene, cyclopentylene, n-hexylene, and cyclohexylene.

Monomers from which recurring units (a-1a) and (a-2) of formula (1a) are derived include those having the following general formulae Ma1 and Ma2 wherein $R^1$ to $R^9$, m and n are as defined above.
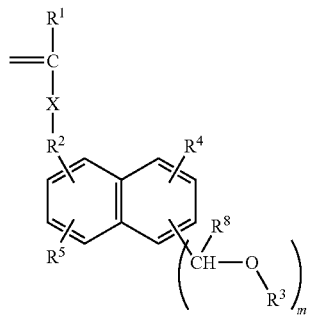
Ma1
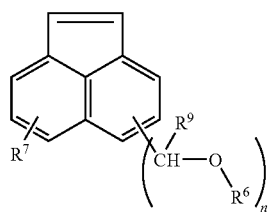
Ma2
Examples of suitable monomers of formulae Ma1 and Ma2 are illustrated below.
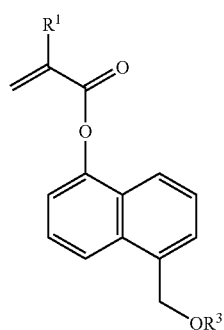
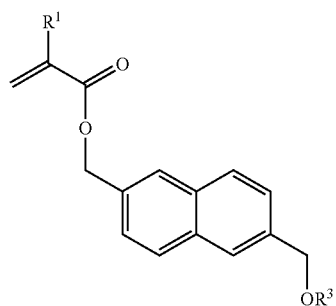
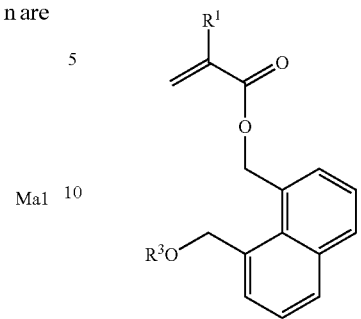
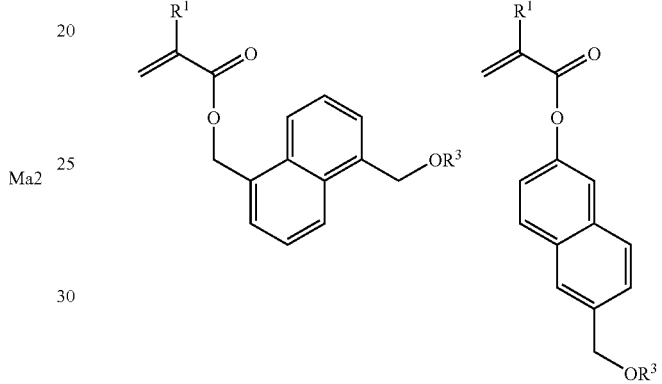
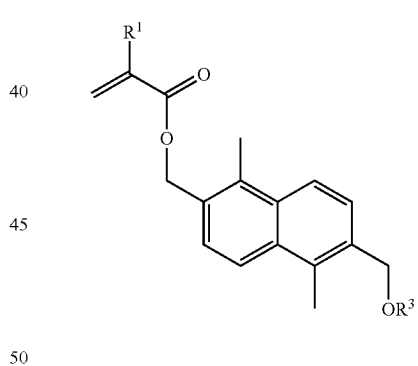
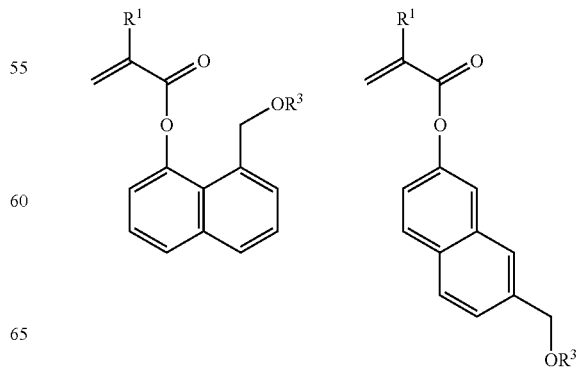

15
-continued
16
-continued
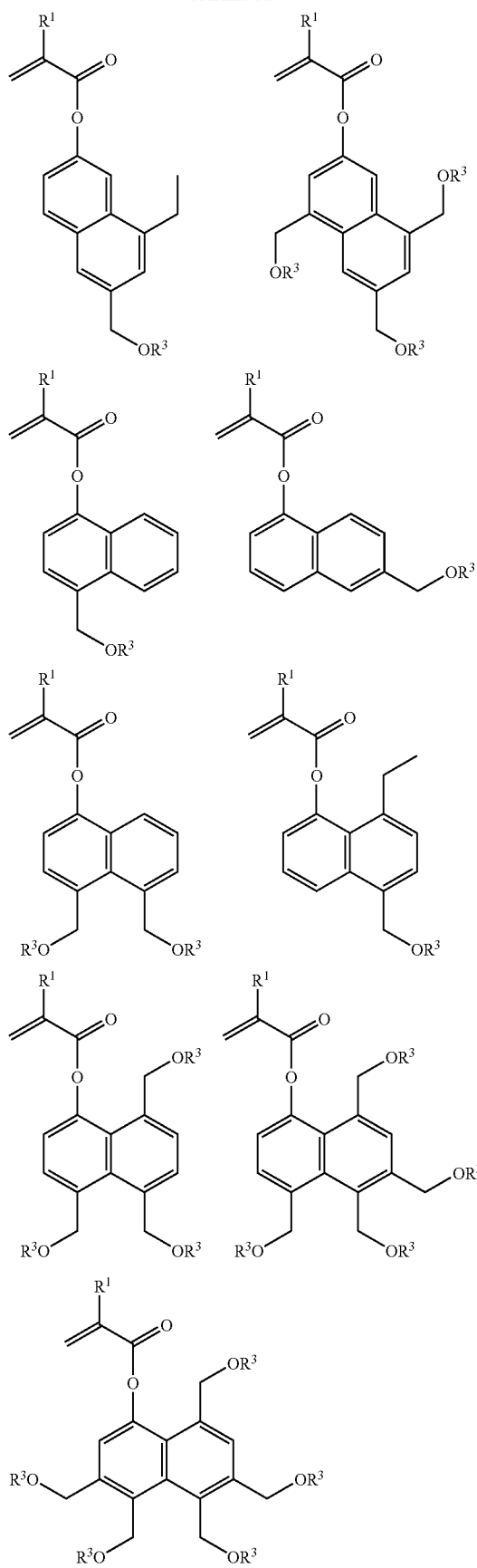
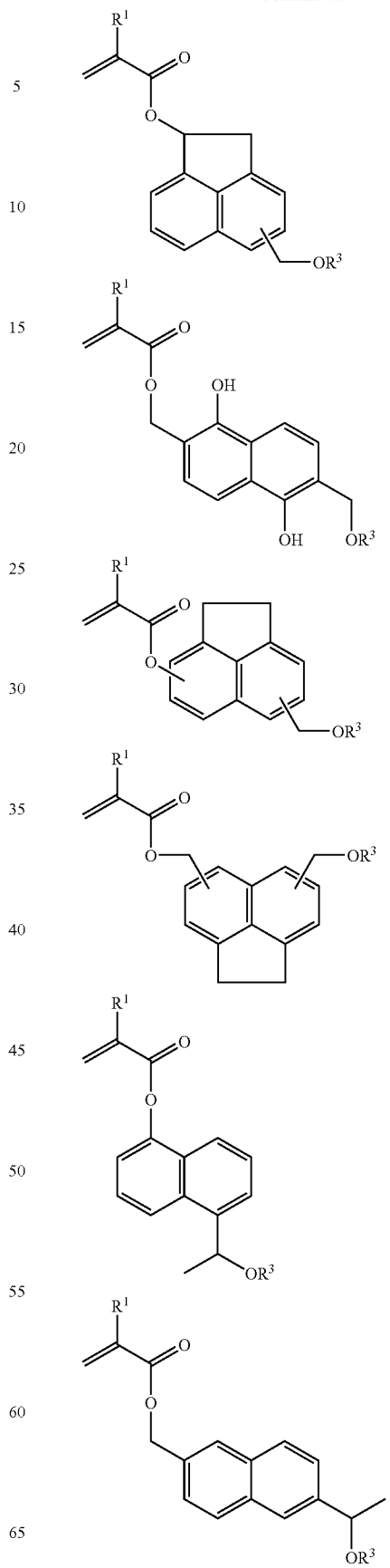

17
-continued
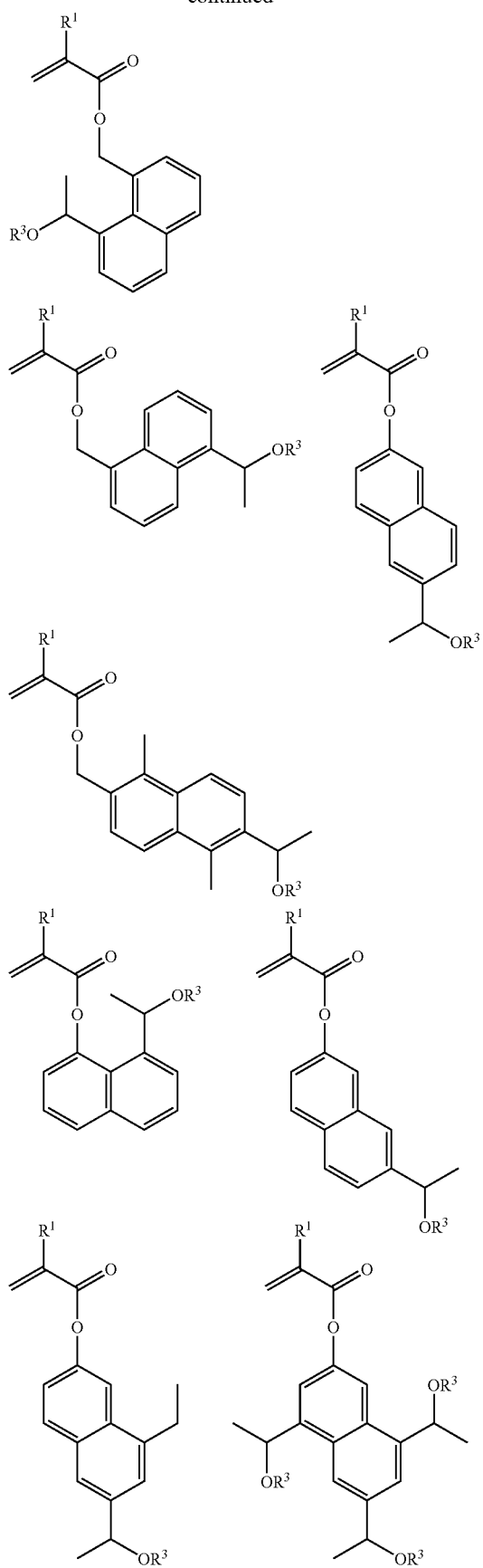
18
-continued
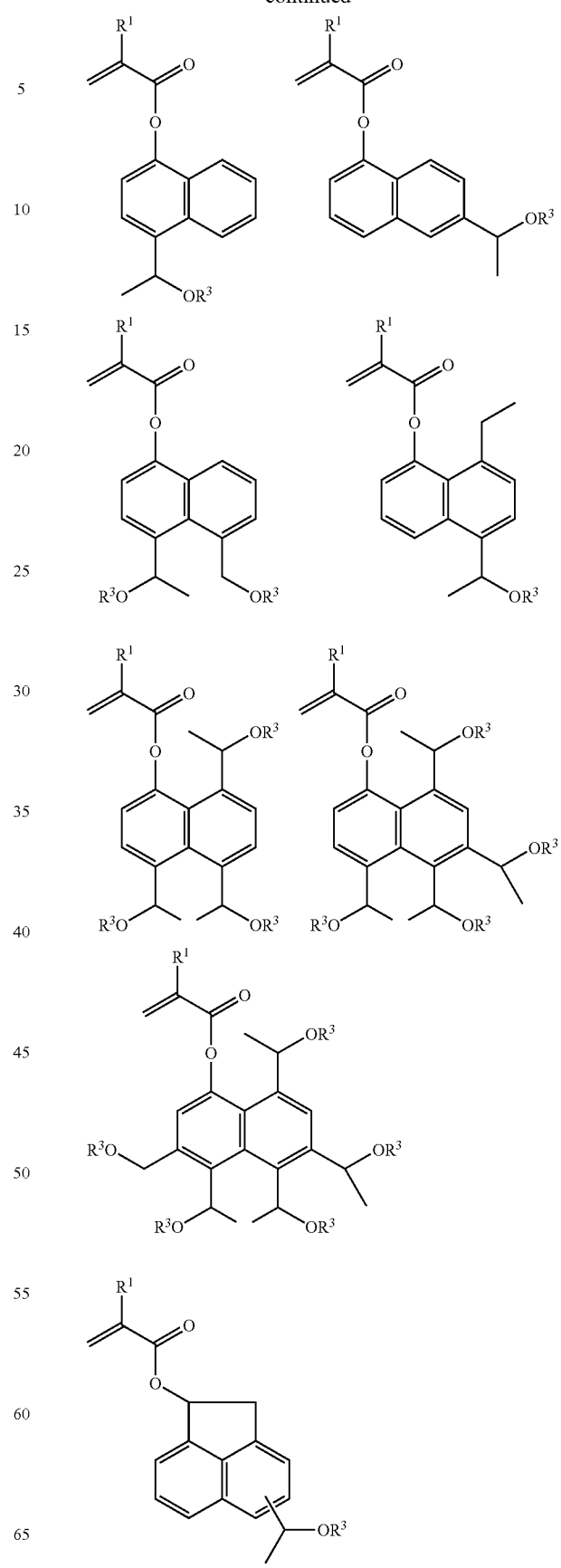

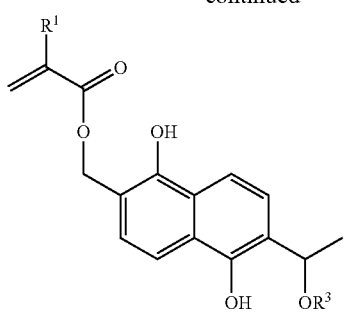
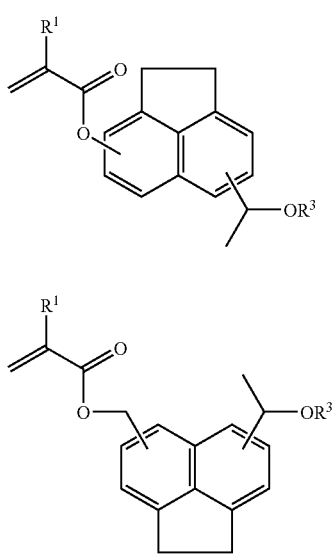
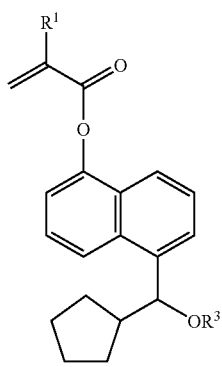
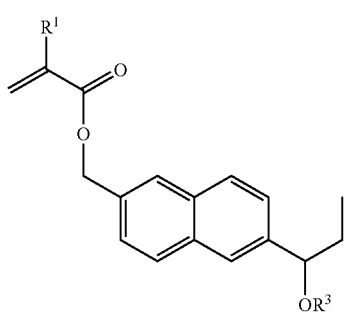
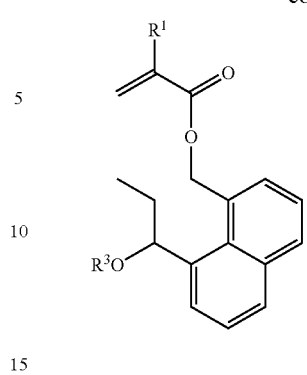
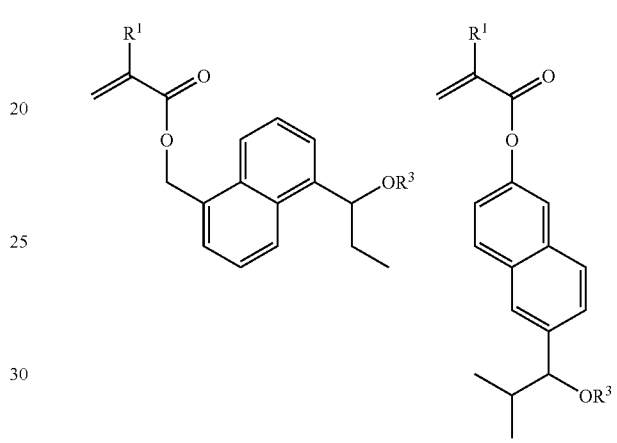
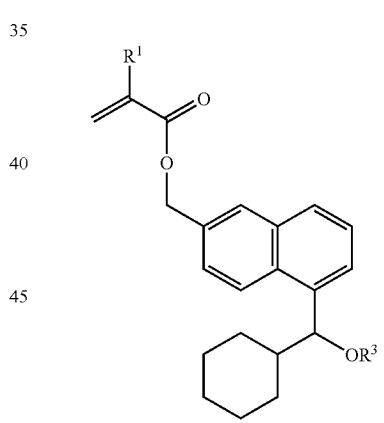
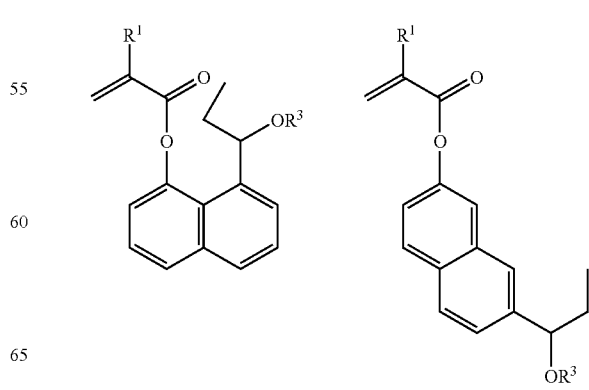

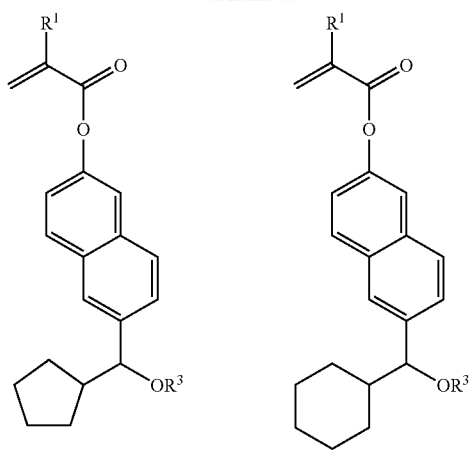
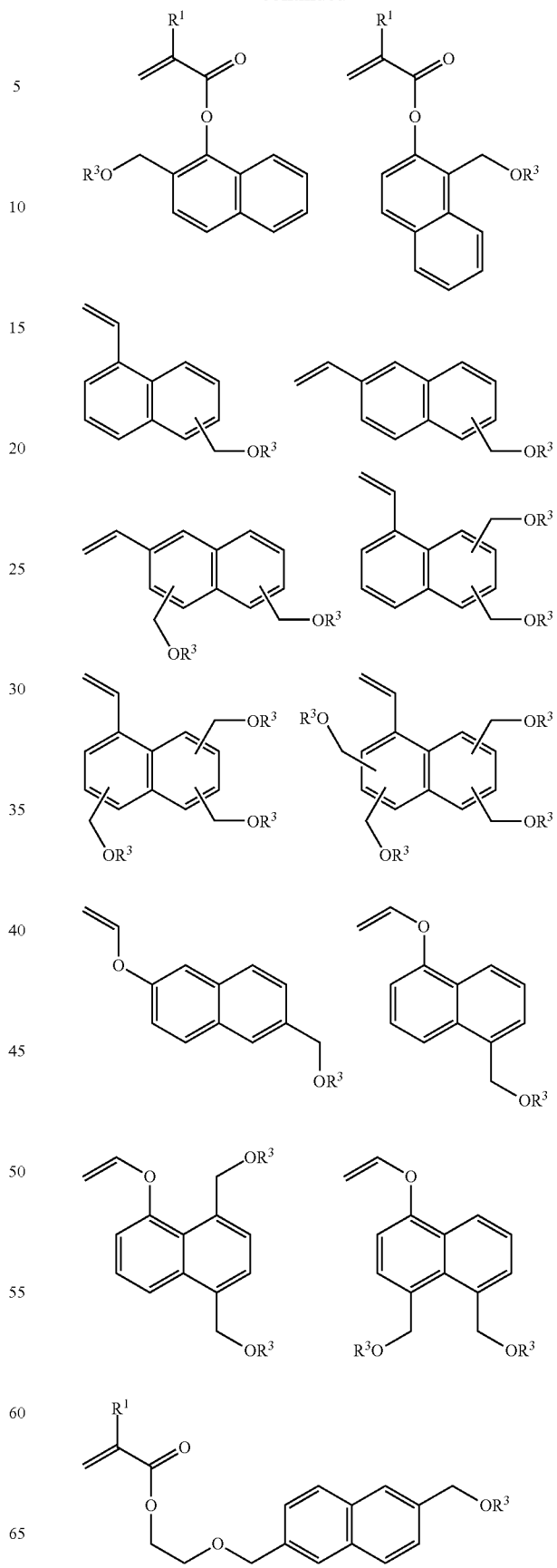

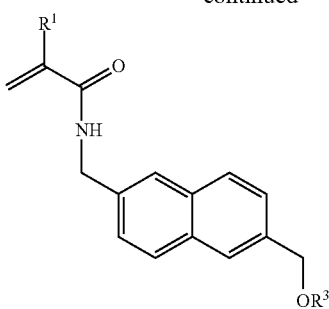
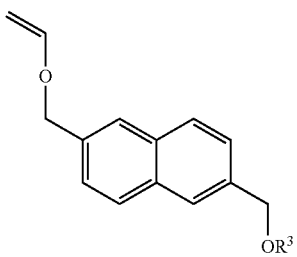
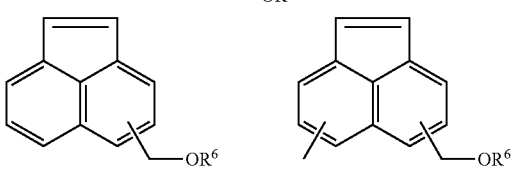
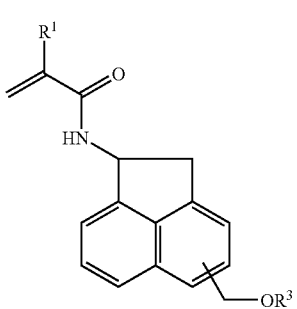
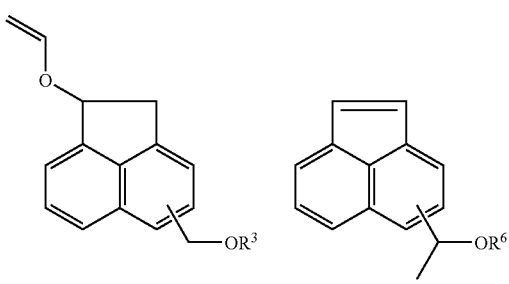
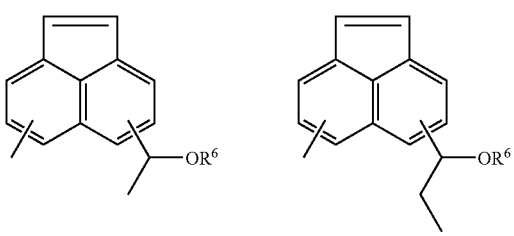

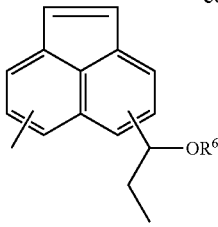

Note that $R^1a$, $R^3$ and $R^6$ are as defined above.

Of the monomers described above, those polymerizable monomer compounds having the general formula (4) are novel.

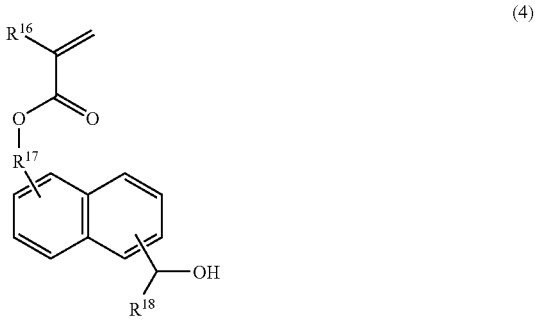

(4)

Herein $R^{16}$ is hydrogen or methyl, $R^{17}$ is a single bond, or a straight, branched, cyclic or bridged cyclic $C_1a$-$C_6$ alkylene group which may have an ether, thioether or ester group, $R^{18}$ is hydrogen or straight, branched or cyclic $C_1a$-$C_6$ alkyl, with the proviso that the combination that $R^{17}$ is a single bond, $R^{18}$ is hydrogen, and the oxygen atom and —$CH_2OH$ bond to the naphthalene nucleus at 2- and 6-positions is excluded.

The monomers of formula (4) may be prepared via reaction of (meth)acrylic acid chloride or (meth)acrylic anhydride with hydroxyalkylnaphthalenes.

After the first pattern is formed through exposure and development, a photoresist composition is coated thereon and processed to form a second pattern in the space area of the first pattern. This sequence requires that the first pattern after its formation must be insoluble in photoresist solution and alkaline developer. To this end, the first pattern after its formation must be insolubilized by crosslinking so that it is insoluble in photoresist solution and alkaline developer.

When a polymer comprising recurring units having oxirane or oxetane is used as a base polymer for resist, crosslinking takes place at the temperature of resist process such as post-exposure bake (PEB) at about 90 to 130° C. because the oxirane or oxetane ring has a very high rate of acid-induced cleavage reaction. Then the polymer becomes alkali insoluble, failing to function as the positive resist material. In contrast, benzyl alcohol has a lower reactivity than the oxirane and oxetane rings so that crosslinking does not take place in the temperature range of PEB. Then the hydroxyalkylnaphthalene-bearing recurring units exhibiting least absorption in the wavelength 193 nm band are stable against acid during the process until development, and exert a function of enhancing adhesion and alkali solubility as a hydrophilic group. However, it is believed that under the action of the acid generated by pattern flood exposure or heating after development, the optionally substituted hydroxyalkylnaphthalene undergoes crosslinking reaction, whereby the polymer becomes insoluble in alkaline developer and resist solvent. Under the action of the acid generated by pattern flood exposure or heating after development as described above and upon heating at or above 130° C., the acid labile groups are deprotected. Owing to their alicyclic structure, the acid labile groups are effective in improving dry etch resistance. Although deprotection of acid labile groups leads to a lowering of dry etch resistance, the crosslinking reaction of optionally substituted hydroxyalkylnaphthalene achieves an improvement in dry etch resistance. These lead to an eventual improvement in etch resistance.

Accordingly, the invention provides a double patterning process capable of forming a half-pitch fine-feature-size pattern through double exposures and a single dry etching, by using as the resist base polymer a polymer comprising recurring units of an optionally substituted hydroxyalkylnaphthalene-bearing compound which do not crosslink at the temperature of the resist process, for example, at pre-baking and PEB temperatures of about 90 to 130° C., but crosslink with the aid of the acid generated by exposure and heat after development and upon high-temperature baking. The positive resist composition for use in the process is also contemplated.

While the positive resist composition comprising a specific polymer as the base polymer is used in the pattern forming process of the invention, a preferred embodiment uses a polymer comprising crosslinkable recurring units (a-1a) and/or (a-2) represented by formula (1a), defined above, and acid labile group-bearing recurring units (b) represented by the general formula (2).

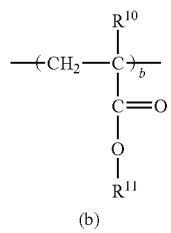

(b)

Herein $R^{10}$ is hydrogen or methyl, $R^{11}$ is an acid labile group, and b is a number in the range: $0 < b \leq 0.8$.

Monomers from which recurring units (b) are derived include those having the following general formula Mb wherein $R^{10}$ and $R^{11}$ are as defined above.

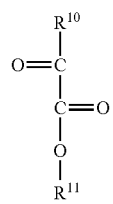

Mb

The acid labile groups represented by $R^3$, $R^6$ and $R^{11}$ in formulae (1a) and (2) may be selected from a variety of such groups. Preferred acid labile groups are groups of formulae (AL-10) and (AL-11a), tertiary alkyl groups of 4 to 40 carbon atoms represented by formula (AL-12), and oxoalkyl groups of 4 to 20 carbon atoms, but not limited thereto.

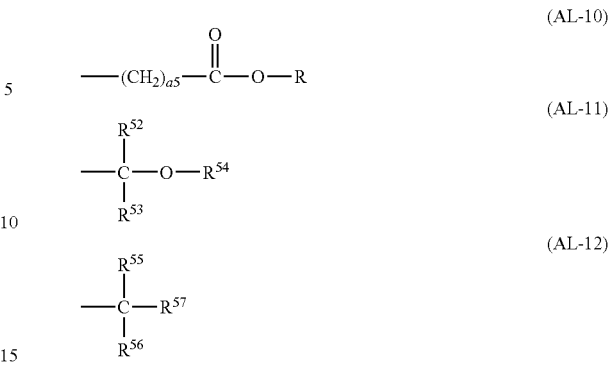

In formulae (AL-10) and (AL-11a), $R^{51}$ and $R^{54}$ each are a monovalent hydrocarbon group, typically a straight, branched or cyclic alkyl group of 1 to 40 carbon atoms, more specifically 1 to 20 carbon atoms, which may contain a heteroatom such as oxygen, sulfur, nitrogen or fluorine. The subscript "a5" is an integer of 0 to 10. $R^{52}$ and $R^{53}$ each are hydrogen or a monovalent hydrocarbon group, typically a straight, branched or cyclic $C_1$-$C_{20}$ alkyl group, which may contain a heteroatom such as oxygen, sulfur, nitrogen or fluorine. Alternatively, a pair of $R^{52}$ and $R^{53}$, $R^{52}$ and $R^{54}$, or $R^{53}$ and $R^{54}$, taken together, may form a ring, specifically aliphatic ring, with the carbon atom or the carbon and oxygen atoms to which they are attached, the ring having 3 to 20 carbon atoms, especially 4 to 16 carbon atoms.

In formula (AL-12), $R^5$, $R^{56}$ and $R^{57}$ each are a monovalent hydrocarbon group, typically a straight, branched or cyclic $C_1$-$C_{20}$ alkyl group, which may contain a heteroatom such as oxygen, sulfur, nitrogen or fluorine. Alternatively, a pair of $R^{55}$ and $R^{56}$, $R^{55}$ and $R^{57}$, or $R^{56}$ and $R^{57}$, taken together, may form a ring, specifically aliphatic ring, with the carbon atom to which they are attached, the ring having 3 to 20 carbon atoms, especially 4 to 16 carbon atoms.

Illustrative examples of the groups of formula (AL-10) include tert-butoxycarbonyl, tert-butoxycarbonylmethyl, tert-amyloxycarbonyl, tert-amyloxycarbonylmethyl, 1a-ethoxyethoxycarbonylmethyl, 2-tetrahydropyranyloxycarbonylmethyl and 2-tetrahydrofuranyloxycarbonylmethyl as well as substituent groups of the following formulae (AL-10)-1 to (AL-10)-10.

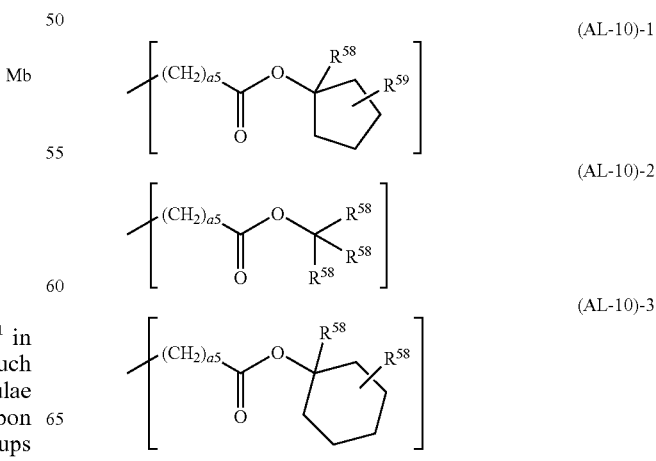

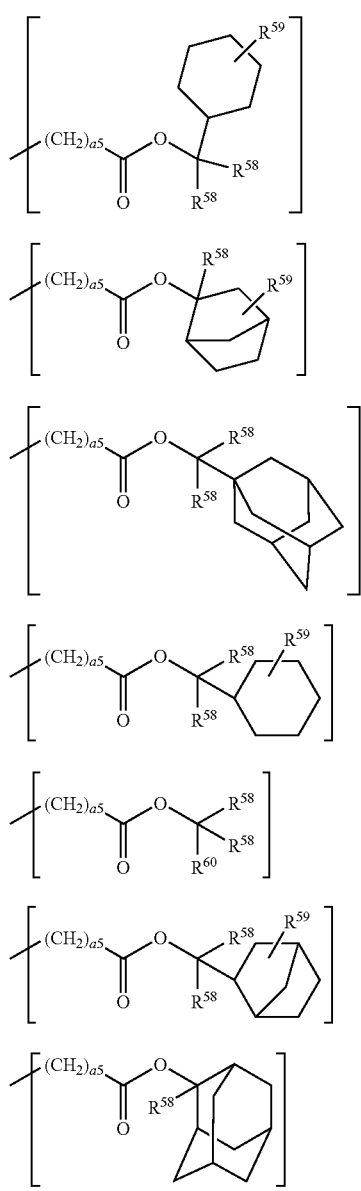

(AL-10)-4

(AL-10)-5

(AL-10)-6

(AL-10)-7

(AL-10)-8

(AL-10)-9

(AL-10)-10

In formulae (AL-10)-1 to (AL-10)-10, $R^{58}$ is independently a straight, branched or cyclic $C_1$-$C_8$ alkyl group, $C_6$-$C_{20}$ aryl group or $C_7$-$C_{20}$ aralkyl group; $R^{59}$ is hydrogen or a straight, branched or cyclic $C_1$-$C_{20}$ alkyl group; $R^{60}$ is a $C_6$-$C_{20}$ aryl group or $C_7$-$C_{20}$ aralkyl group; and "a5" is an integer of 0 to 10.

Illustrative examples of the acetal group of formula (AL-11a) include those of the following formulae (AL-11a)-1 to (AL-11a)-34.

—CH$_2$—O—CH$_3$ (AL-11)-1

—CH$_2$—O—CH$_2$—CH$_3$ (AL-11)-2

—CH$_2$—O—(CH$_2$)$_2$—CH$_3$ (AL-11)-3

—CH$_2$—O—(CH$_2$)$_3$—CH$_3$ (AL-11)-4

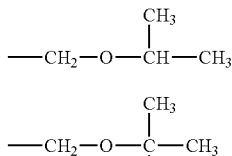 (AL-11)-5

(AL-11)-6

(AL-11)-7

(AL-11)-8

(AL-11)-9

(AL-11)-10

(AL-11)-11

(AL-11)-12

(AL-11)-13

(AL-11)-14

(AL-11)-15

(AL-11)-16

(AL-11)-17

(AL-11)-18

(AL-11)-19

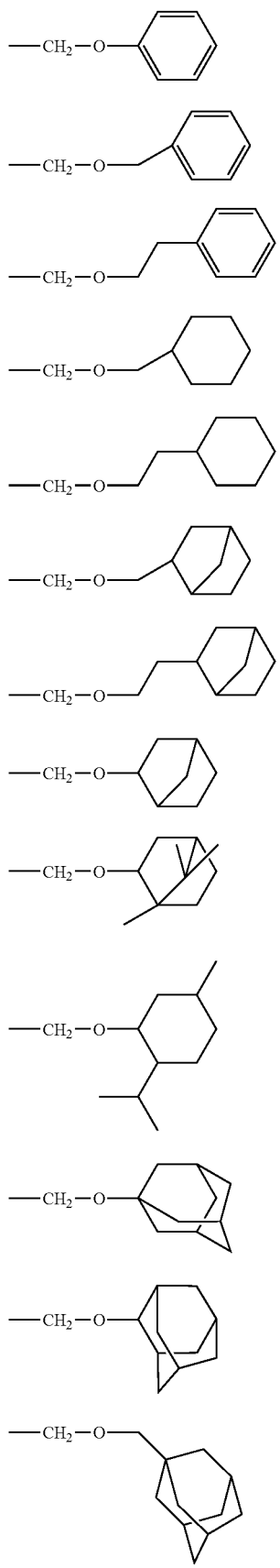

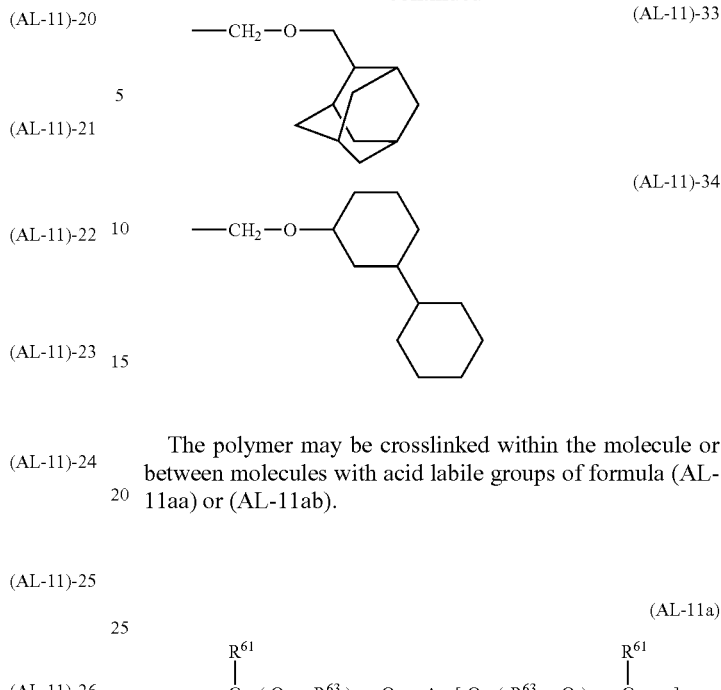

The polymer may be crosslinked within the molecule or between molecules with acid labile groups of formula (AL-11aa) or (AL-11ab).

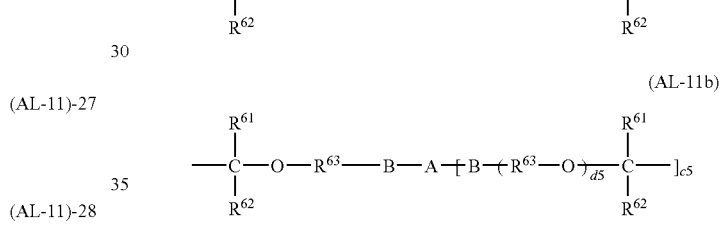

Herein $R^{61}$ and $R^{62}$ each are hydrogen or a straight, branched or cyclic $C_1$-$C_8$ alkyl group, or $R^{61}$ and $R^{62}$, taken together, may form a ring with the carbon atom to which they are attached, and $R^{61}$ and $R^{62}$ are straight or branched $C_1$-$C_8$ alkylene groups when they form a ring. $R^{63}$ is a straight, branched or cyclic $C_1$-$C_{10}$ alkylene group. Each of b5 and d5 is 0 or an integer of 1 to 10, preferably 0 or an integer of 1 to 5, and c5 is an integer of 1 to 7. "A" is a (c5+1a)-valent aliphatic or alicyclic saturated hydrocarbon group, aromatic hydrocarbon group or heterocyclic group having 1 to 50 carbon atoms, which may be separated by a heteroatom such as oxygen, sulfur or nitrogen or in which some of the hydrogen atoms attached to carbon atoms may be substituted by hydroxyl, carboxyl, carbonyl groups or fluorine atoms. "B" is —CO—O—, —NHCO—O— or —NHCONH—.

Preferably, "A" is selected from divalent to tetravalent, straight, branched or cyclic $C_1$-$C_{20}$ alkylene, alkanetriyl and alkanetetrayl groups, and $C_6$-$C_{30}$ arylene groups, which may be separated by a heteroatom such as oxygen, sulfur or nitrogen or in which some of the hydrogen atoms attached to carbon atoms may be substituted by hydroxyl, carboxyl, acyl groups or halogen atoms. The subscript c5 is preferably an integer of 1 to 3.

The crosslinking acetal groups of formulae (AL-11aa) and (AL-11ab) are exemplified by the following formulae (AL-11a)-35 through (AL-11a)-42.

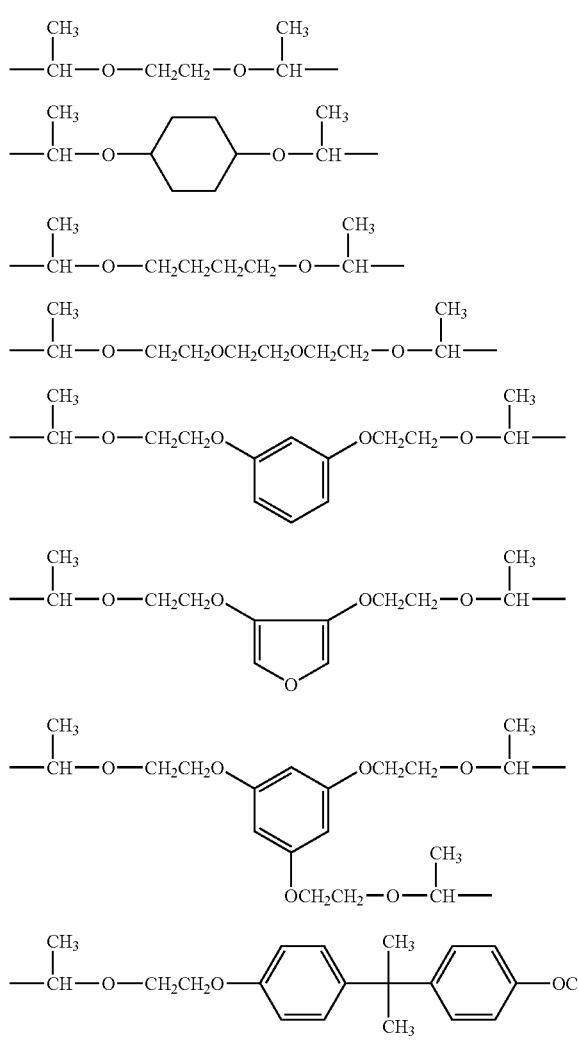
(AL-11)-35
(AL-11)-36
(AL-11)-37
(AL-11)-38
(AL-11)-39
(AL-11)-40
(AL-11)-41
(AL-11)-42
Illustrative examples of the tertiary alkyl of formula (AL-12) include tert-butyl, triethylcarbyl, 1a-ethylnorbornyl, 1a-methylcyclohexyl, 1a-ethylcyclopentyl, and tert-amyl groups as well as those of (AL-12)-1 to (AL-12)-16.
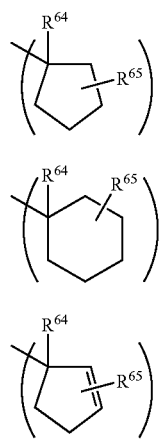
(AL-12)-1
(AL-12)-2
(AL-12)-3
-continued
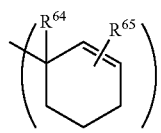
(AL-12)-4
(AL-12)-5
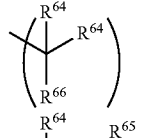
(AL-12)-6
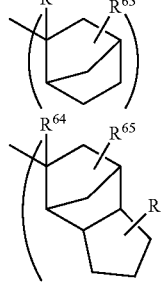
(AL-12)-7

(AL-12)-8

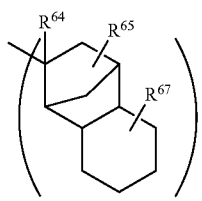

(AL-12)-9

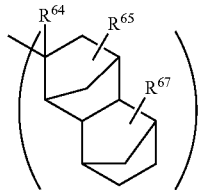

(AL-12)-10

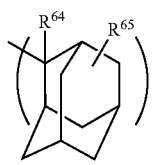

(AL-12)-11

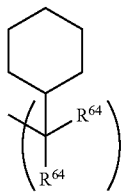

(AL-12)-12

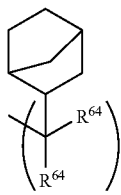

(AL-12)-13

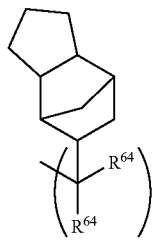

(AL-12)-14

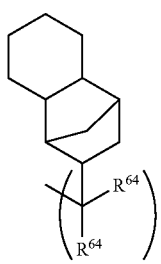

(AL-12)-15

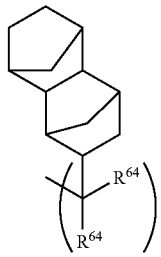

(AL-12)-16

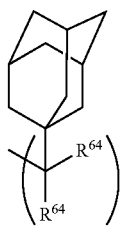

Herein $R^{64}$ is independently a straight, branched or cyclic $C_1$-$C_8$ alkyl group, $C_6$-$C_{20}$ aryl group or $C_7$-$C_{20}$ aralkyl group; $R^{65}$ and $R^{67}$ each are hydrogen or a straight, branched or cyclic $C_1$-$C_{20}$ alkyl group; and $R^{66}$ is a $C_6$-$C_{20}$ aryl group or $C_7$-$C_{20}$ aralkyl group.

With $R^{68}$ representative of a di- or more valent alkylene or arylene group included as shown in formulae (AL-12)-17 and (AL-12)-18, the polymer may be crosslinked within the molecule or between molecules. In formulae (AL-12)-17 and (AL-12)-18, $R^{64}$ is as defined above; $R^{68}$ is a straight, branched or cyclic $C_1$-$C_{20}$ alkylene group or arylene group which may contain a heteroatom such as oxygen, sulfur or nitrogen; and b6 is an integer of 1 to 3.

(AL-12)-17

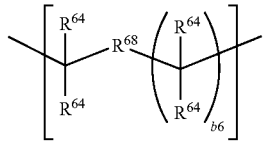

(AL-12)-18

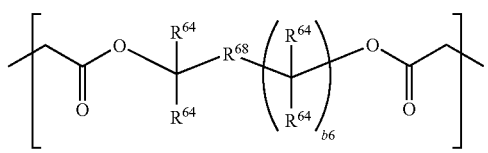

The groups represented by $R^{64}$, $R^{65}$, $R^{66}$ and $R^{67}$ may contain a heteroatom such as oxygen, nitrogen or sulfur. Such groups are exemplified by those of the following formulae (AL-13)-1 to (AL-13)-7.

(AL-13)-1
—(CH$_2$)$_4$OH (AL-13)-2
—(CH$_2$)$_2$O(CH$_2$)$_3$CH$_3$ (AL-13)-3
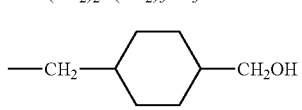

-continued

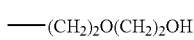 (AL-13)-4

 (AL-13)-5

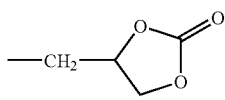 (AL-13)-6

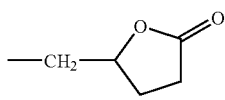 (AL-13)-7

Of the acid labile groups of formula (AL-12), those having an exo-form structure represented by the formula (AL-12)-19 are preferred.

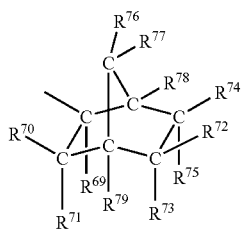 (AL-12)-19

Herein, $R^{69}$ is a straight, branched or cyclic $C_1a$-$C_8$ alkyl group or an optionally substituted $C_6$-$C_{20}$ aryl group; $R^{70}$ to $R^{75}$, $R^{78}$ and $R^{79}$ are each independently hydrogen or a monovalent hydrocarbon group, typically alkyl, of 1 to 15 carbon atoms which may contain a heteroatom; and $R^{76}$ and $R^{77}$ are hydrogen. Alternatively, a pair of $R^{70}$ and $R^{71}$a, $R^{72}$ and $R^{74}$, $R^{72}$ and $R^{75}$, $R^{73}$ and $R^{75}$, $R^{73}$ and $R^{79}$, $R^{74}$ and $R^{78}$, $R^{76}$ and $R^{77}$, or $R^{77}$ and $R^{78}$, taken together, may form a ring with the carbon atom(s) to which they are attached, and in this case, each R is a divalent hydrocarbon group, typically alkylene, of 1 to 15 carbon atoms which may contain a heteroatom. Also, a pair of $R^{70}$ and $R^{79}$, $R^{76}$ and $R^{79}$, or $R^{72}$ and $R^{74}$ which are attached to vicinal carbon atoms may bond together directly to form a double bond. The formula also represents an enantiomer.

The ester form monomers from which recurring units having an exo-form structure represented by the formula (AL-12)-19:

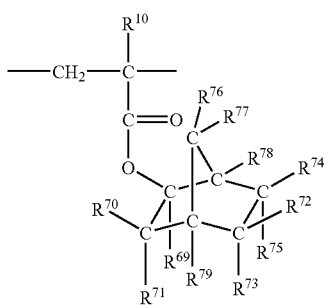

are derived are described in U.S. Pat. No. 6,448,420 (JP-A 2000-327633). Illustrative non-limiting examples of suitable monomers are given below.

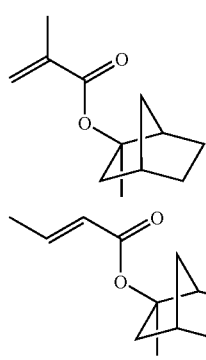
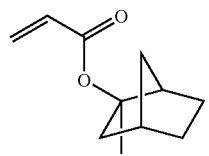
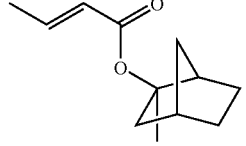
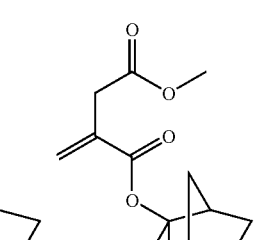
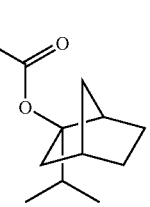
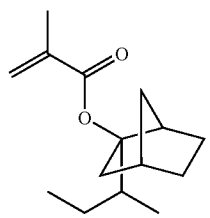
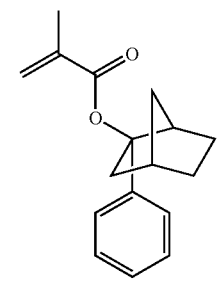
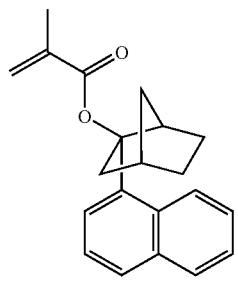
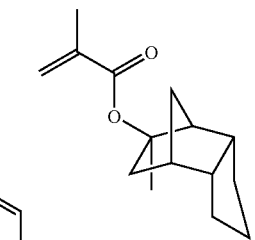
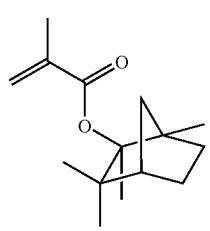
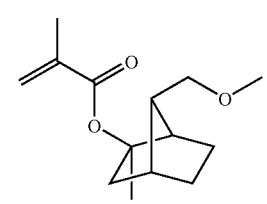

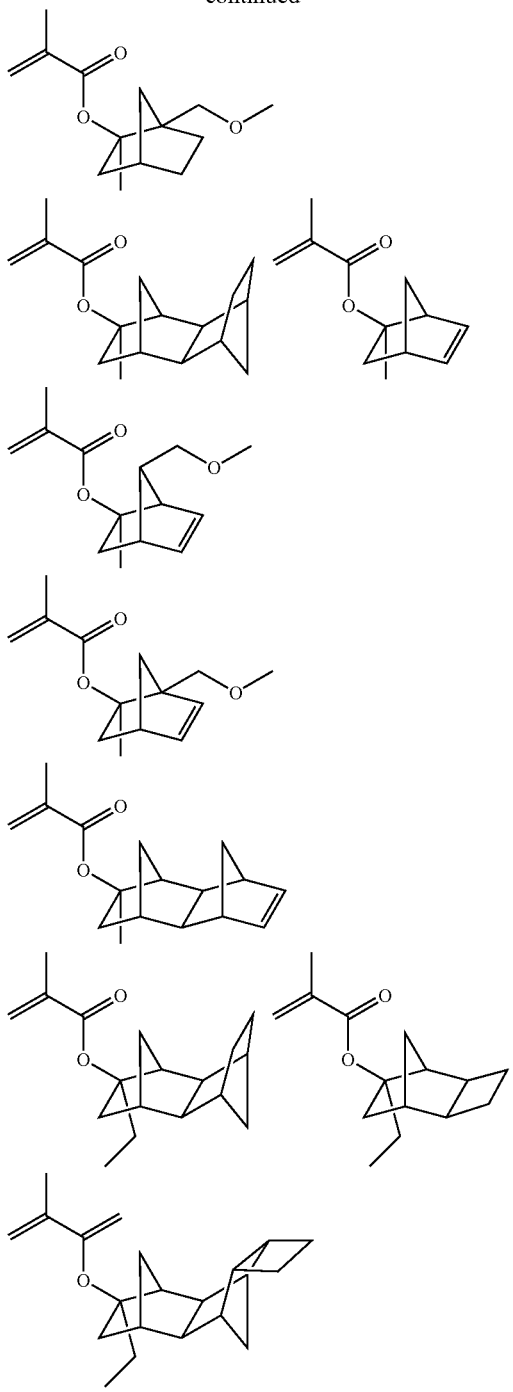

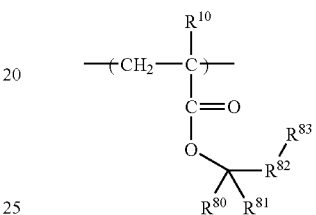

Also included in the acid labile groups of formula (AL-12) are acid labile groups having furandiyl, tetrahydrofurandiyl or oxanorbornanediyl as represented by the following formula (AL-12)-20.

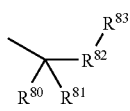

(AL-12)-20

Herein, $R^{80}$ and $R^{81}$ are each independently a monovalent hydrocarbon group, typically a straight, branched or cyclic alkyl of 1 to 10 carbon atoms. $R^{80}$ and $R^{81}$a, taken together, may form an aliphatic hydrocarbon ring of 3 to 20 carbon atoms with the carbon atom to which they are attached. $R^{82}$ is a divalent group selected from furandiyl, tetrahydrofurandiyl and oxanorbornanediyl. $R^{83}$ is hydrogen or a monovalent hydrocarbon group, typically a straight, branched or cyclic alkyl of 1 to 10 carbon atoms, which may contain a heteroatom.

Examples of the monomers from which the recurring units substituted with acid labile groups having furandiyl, tetrahydrofurandiyl and oxanorbornanediyl as represented by the formula:

$$-(CH_2-\underset{\underset{\underset{R^{80}}{|}}{\underset{|}{O}}{\overset{R^{10}}{\underset{|}{C}}}-)-$$

(wherein $R^{10}$, $R^{80}$ to $R^{83}$ are as defined above) are derived are shown below. Note that Me is methyl and Ac is acetyl.

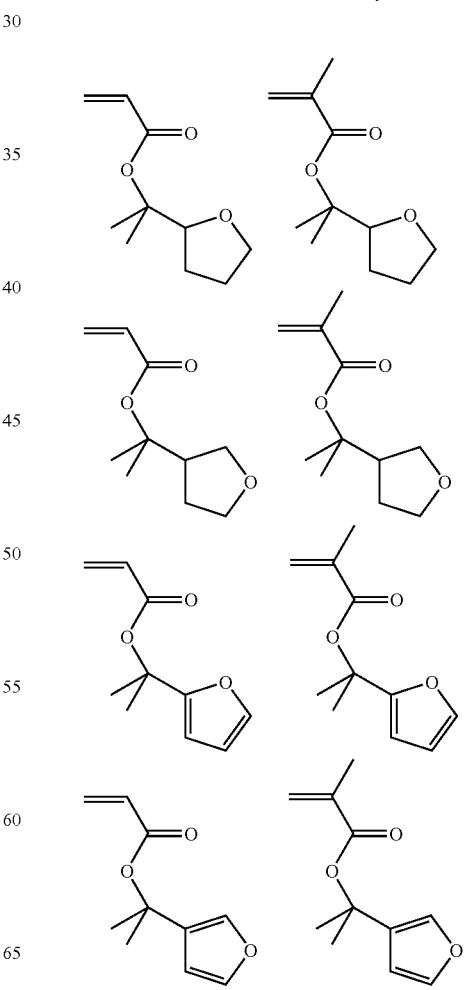

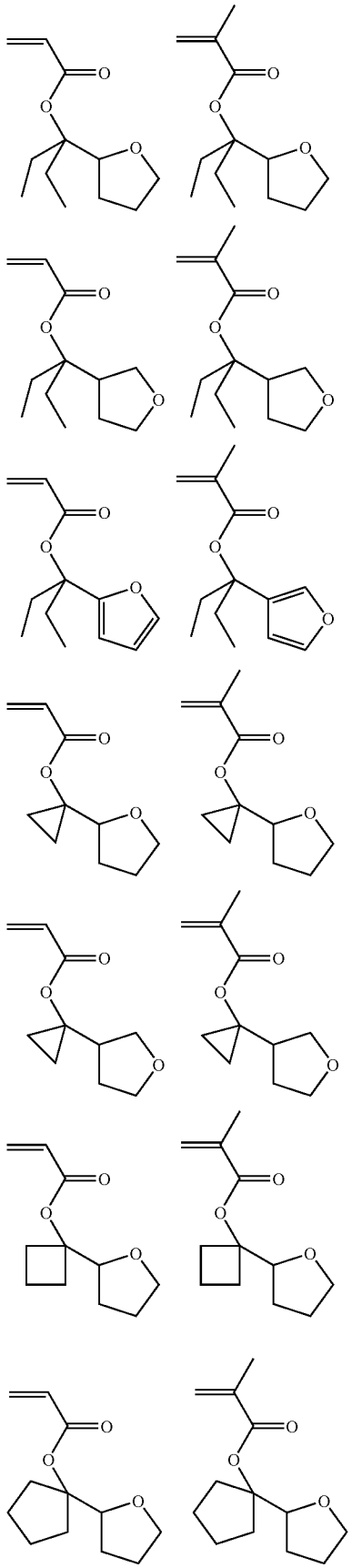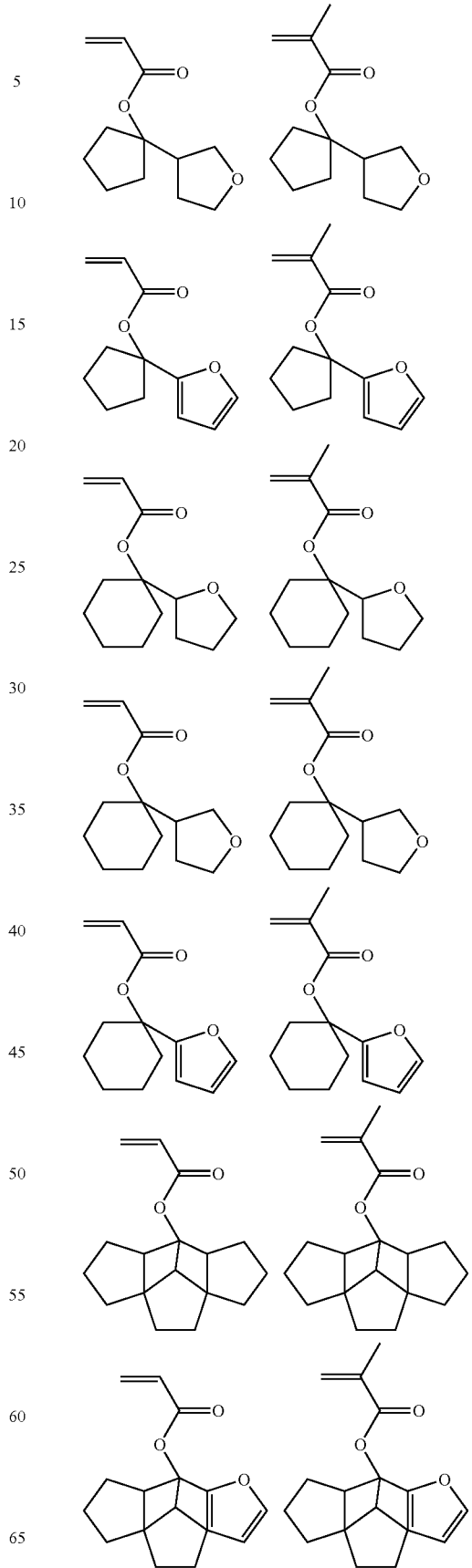

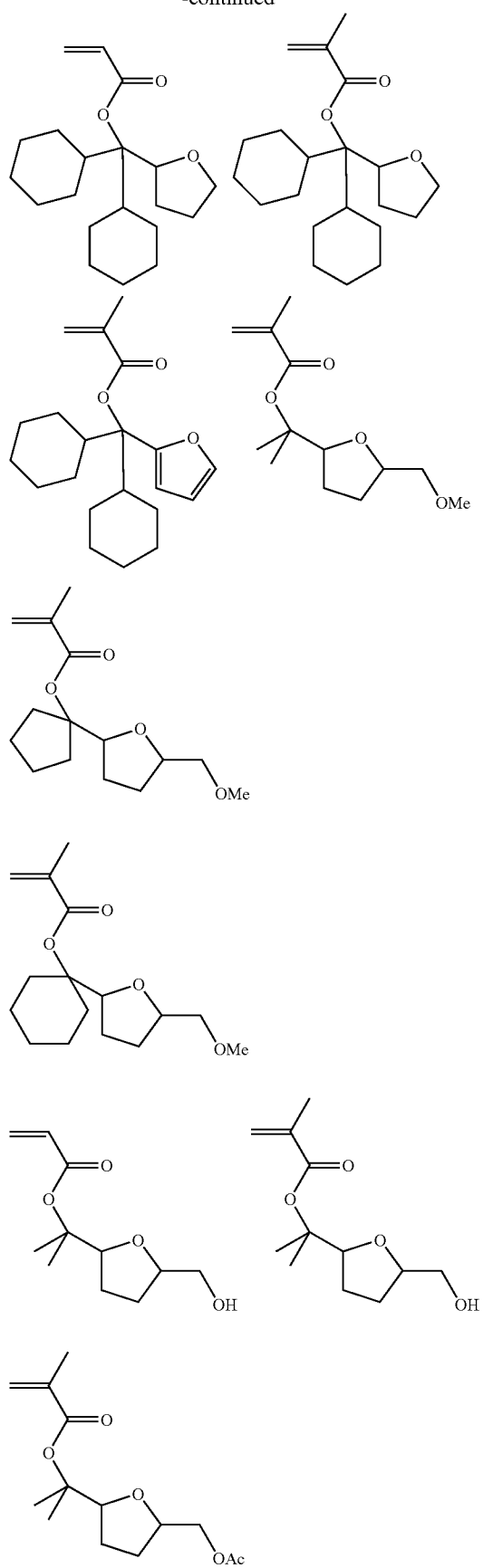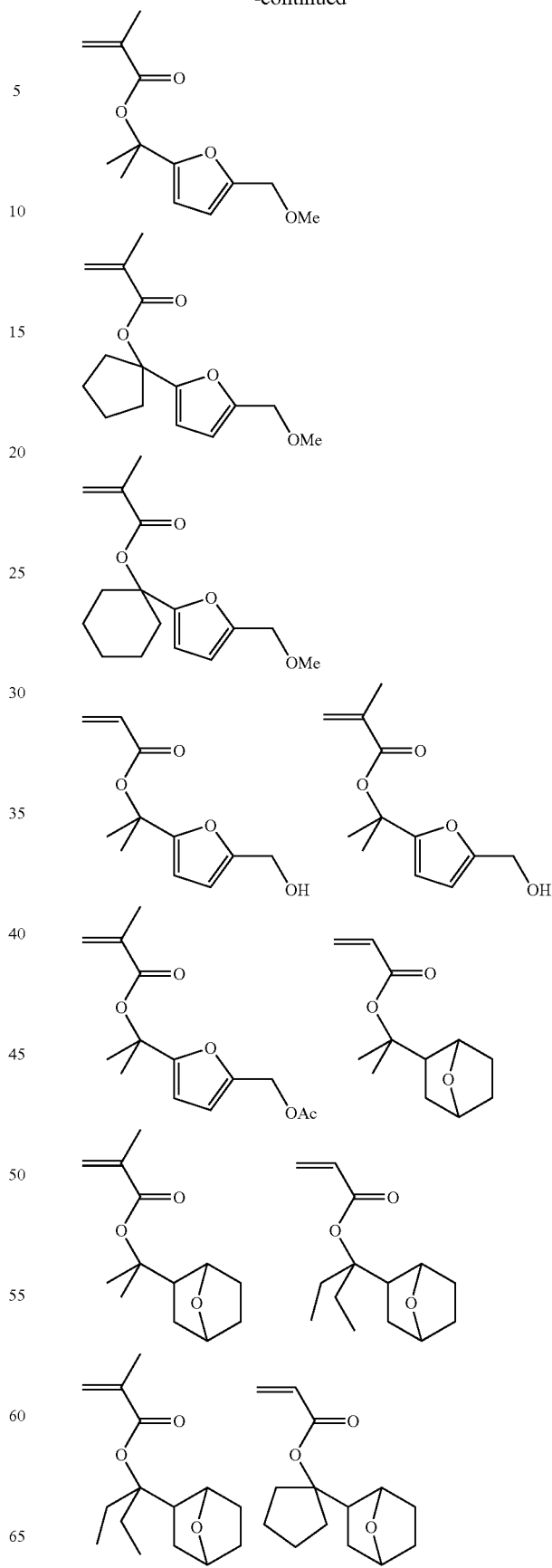

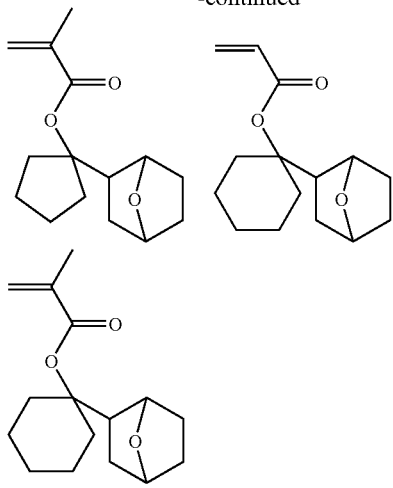

The polymer comprising recurring units (a-1a), (a-2) and (b) represented by formulae (1a) and (2) may further have copolymerized therein hydroxynaphthyl-bearing recurring units (a-3) represented by the general formula (3). The copresence of hydroxyalkylnaphthyl and hydroxynaphthyl ensures stronger crosslinking.

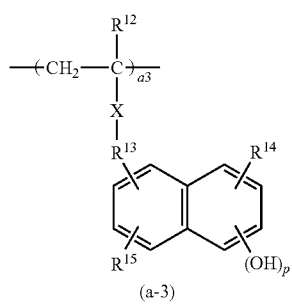

Herein $R^{12}$ is hydrogen or methyl, X is a single bond, —C(=O)—O—, —O— or —C(=O)—NH—, $R^{13}$ is a single bond, or a straight, branched, cyclic or bridged cyclic $C_1a$-$C_6$ alkylene group which may have an ether, thioether or ester group, $R^{14}$ and $R^{15}$ are hydrogen or $C_1a$-$C_4$ alkyl, p is an integer of 1 to 3, and a3 is a number in the range: 0<a3<1.0.

Exemplary monomers from which recurring units (a-3) having formula (3) are derived are shown below.

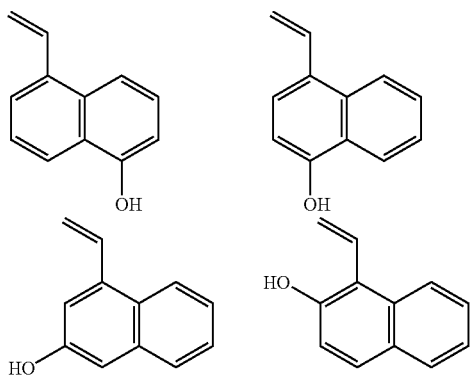
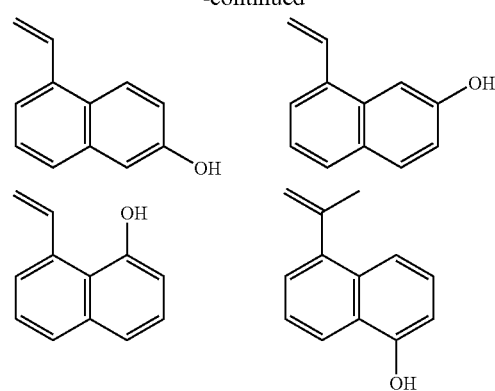
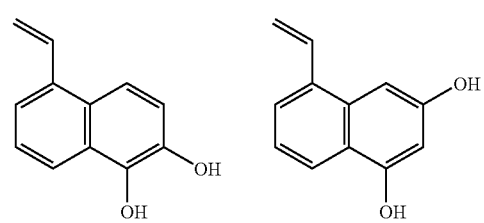
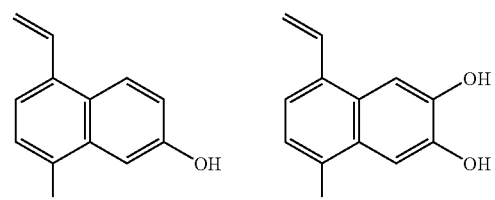
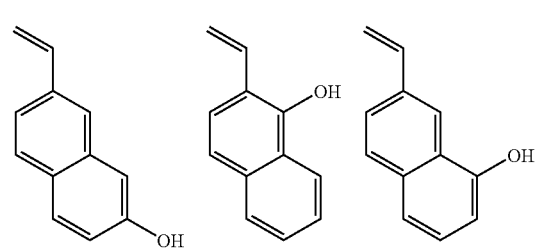
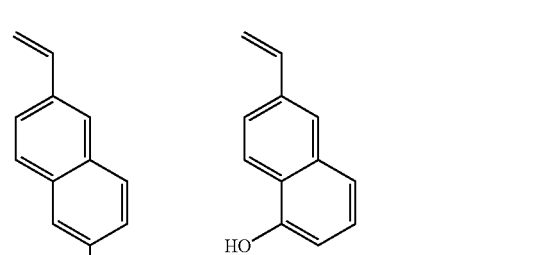
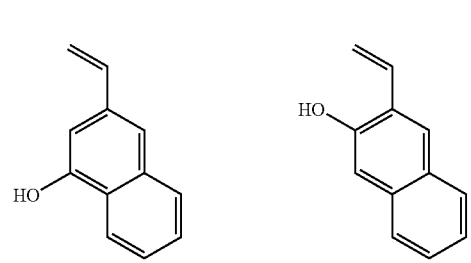

-continued

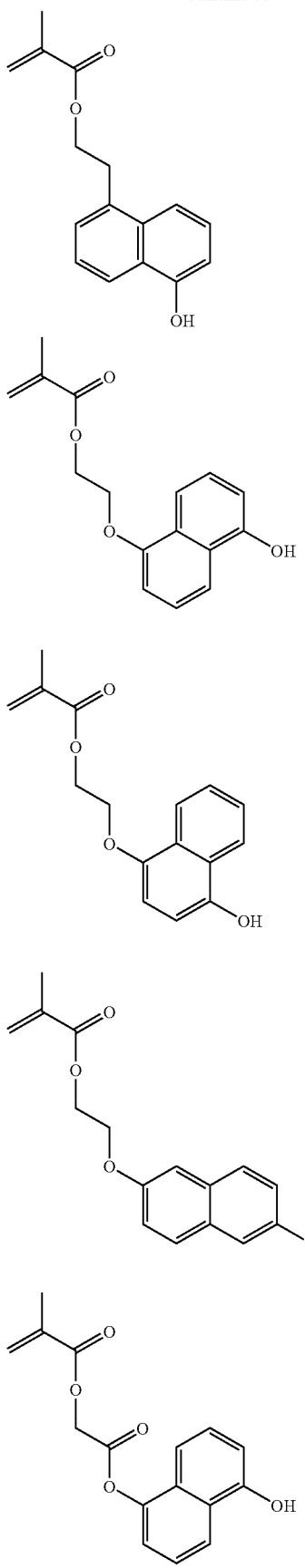

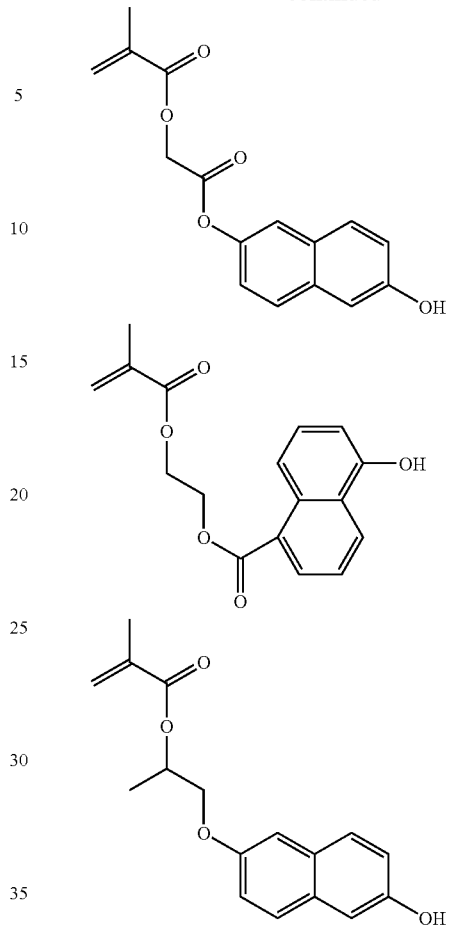

While the polymer used herein preferably comprises recurring units (a-1a) and/or (a-2) and recurring units (b) and more preferably further recurring units (a-3), it may have copolymerized therein recurring units (c) derived from monomers having adhesive groups such as hydroxy, cyano, carbonyl, ester, ether groups, lactone rings, carbonyl or carboxylic anhydride groups. Examples of monomers from which recurring units (c) are derived are given below.

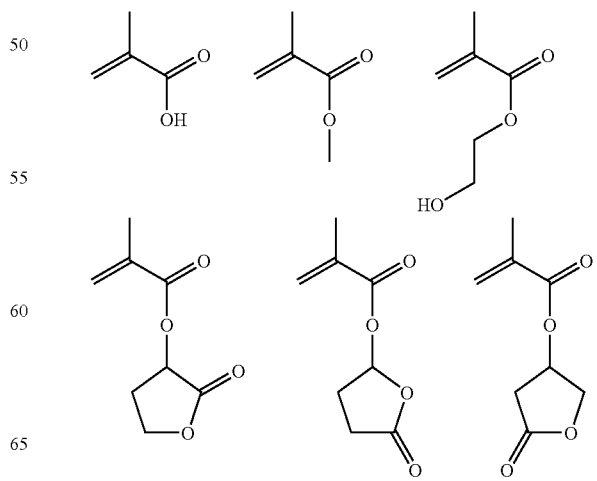

-continued
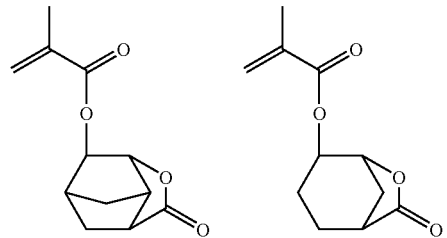
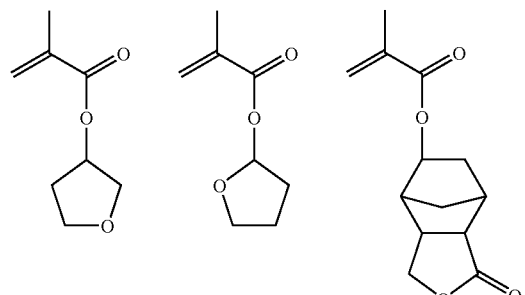
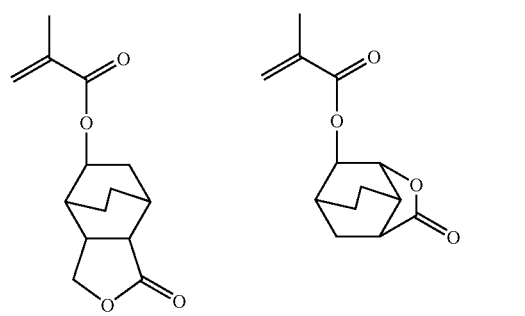
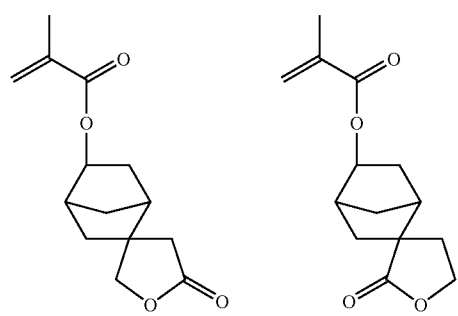
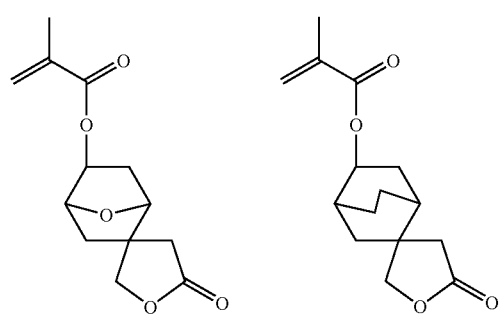
-continued
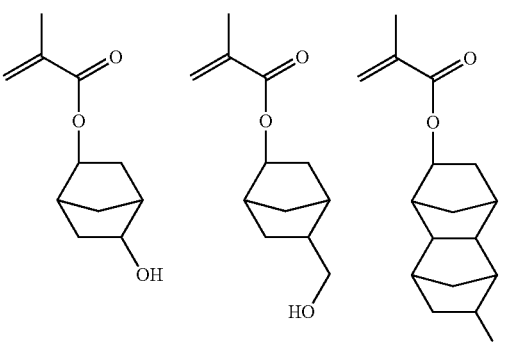
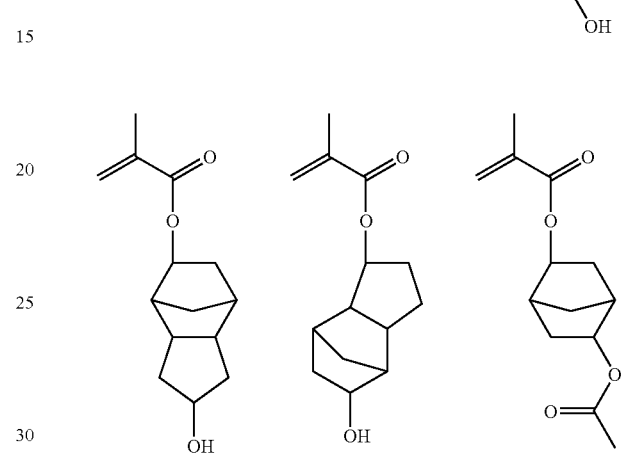
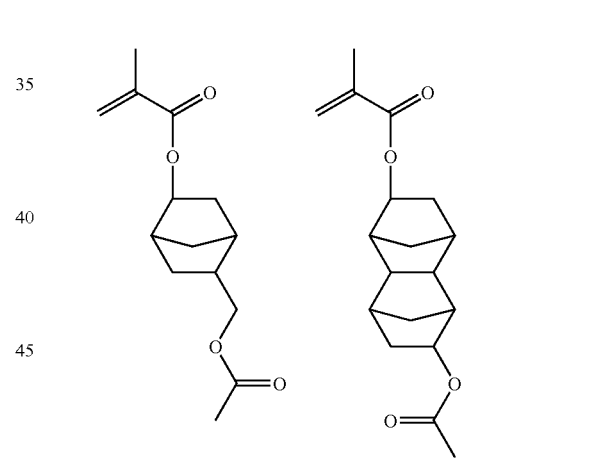
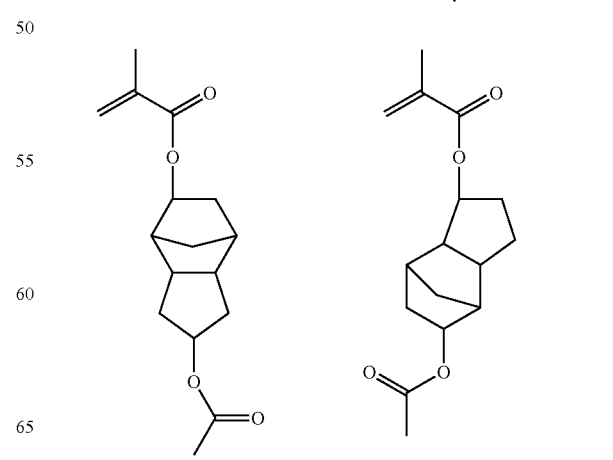

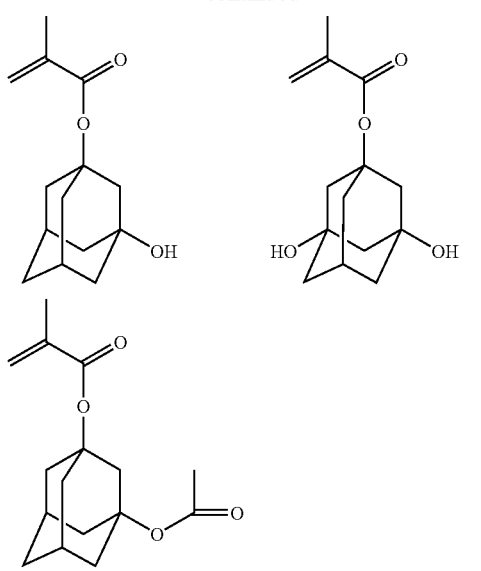
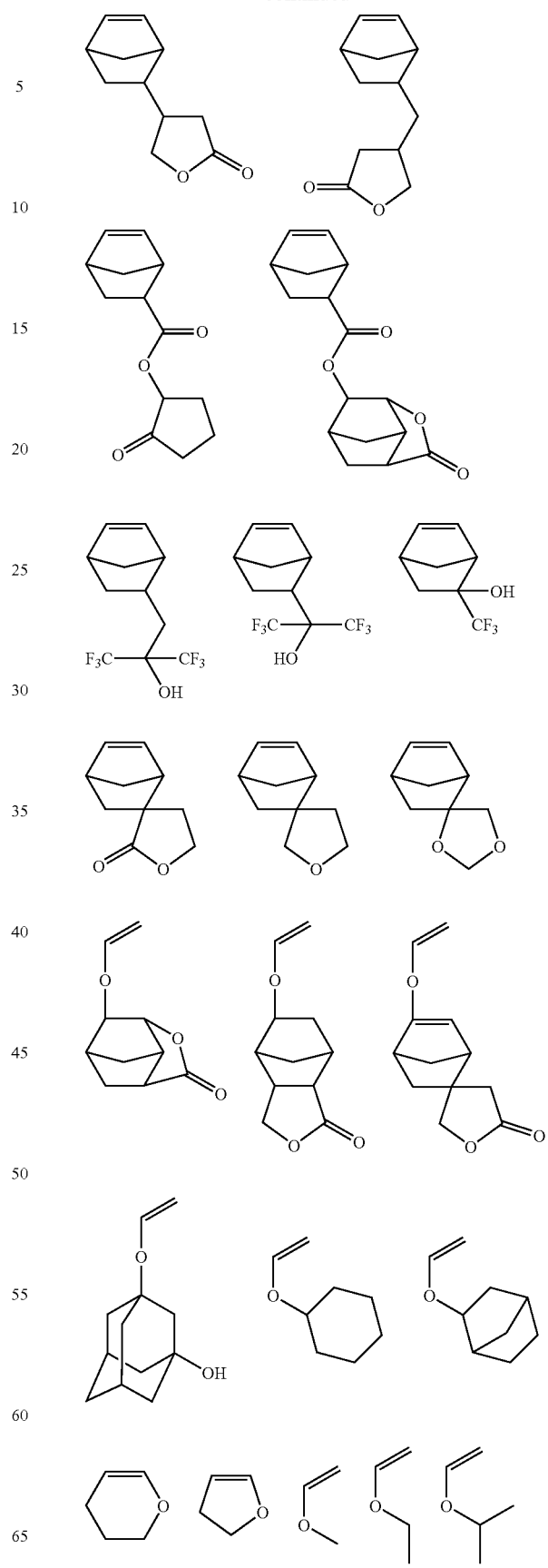

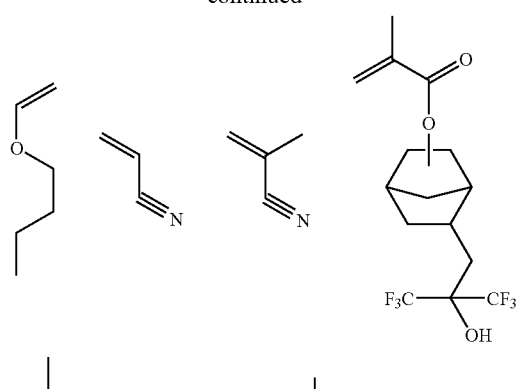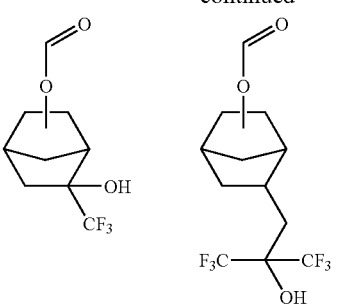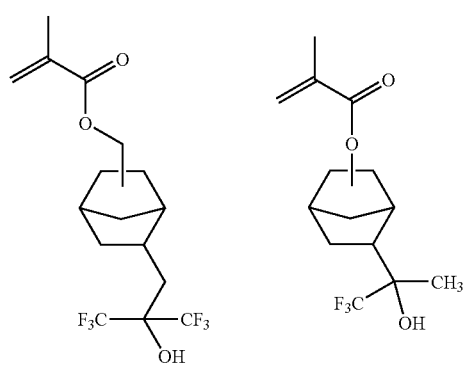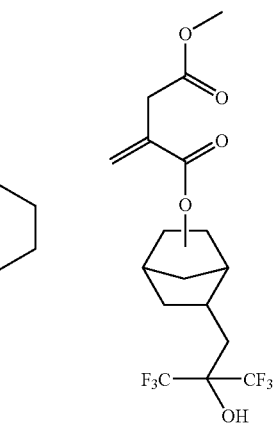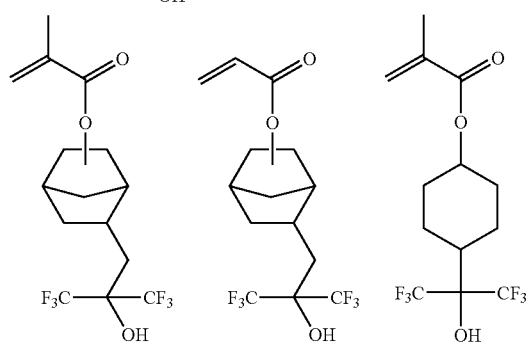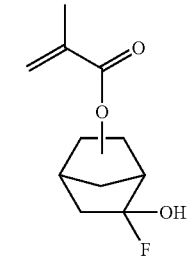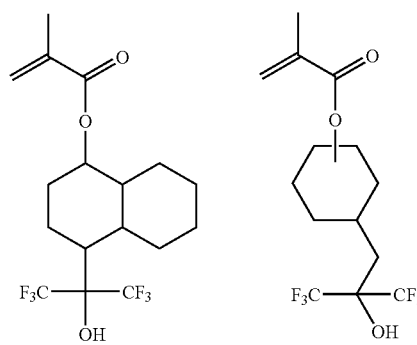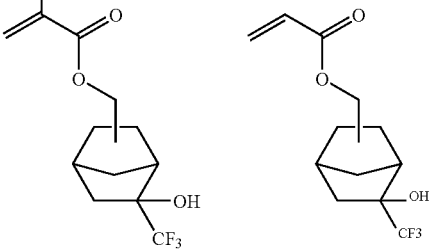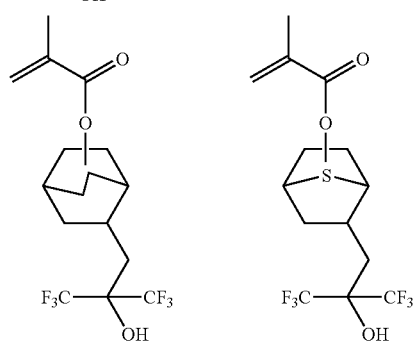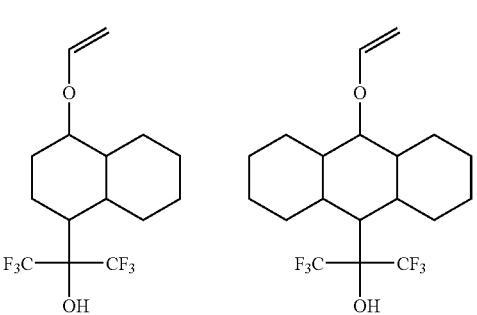

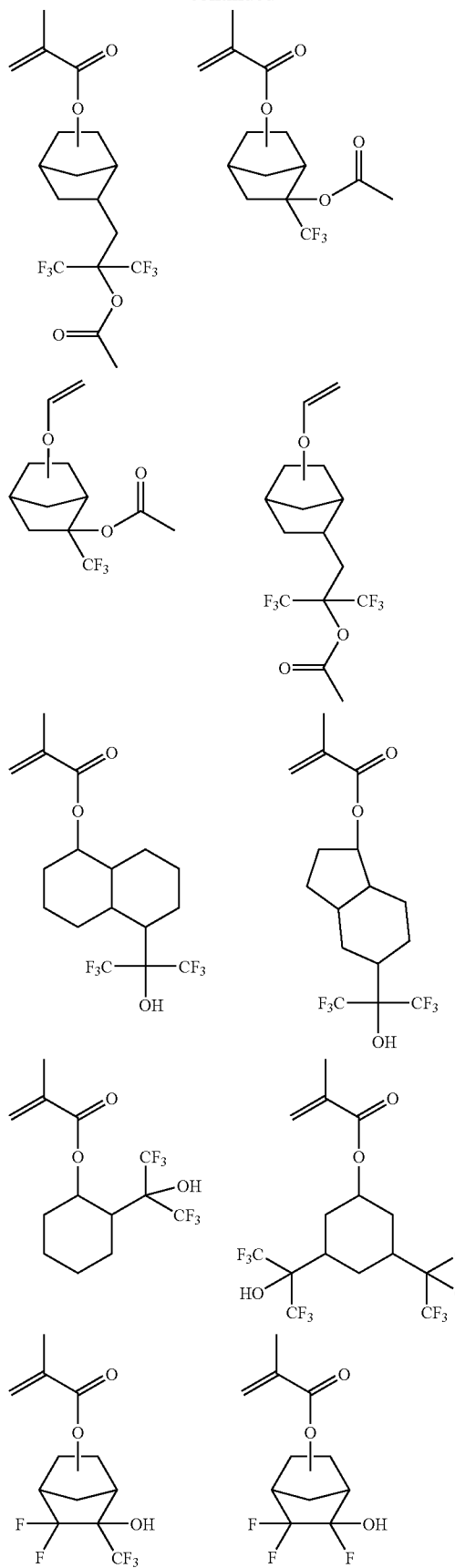
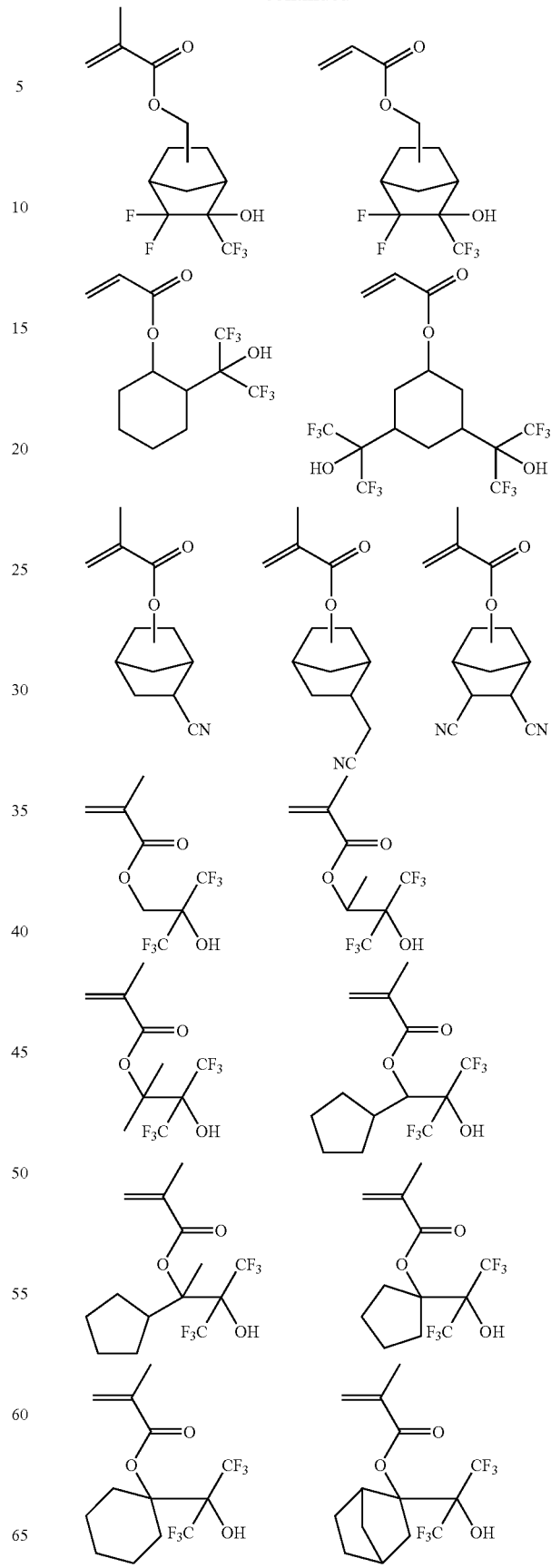

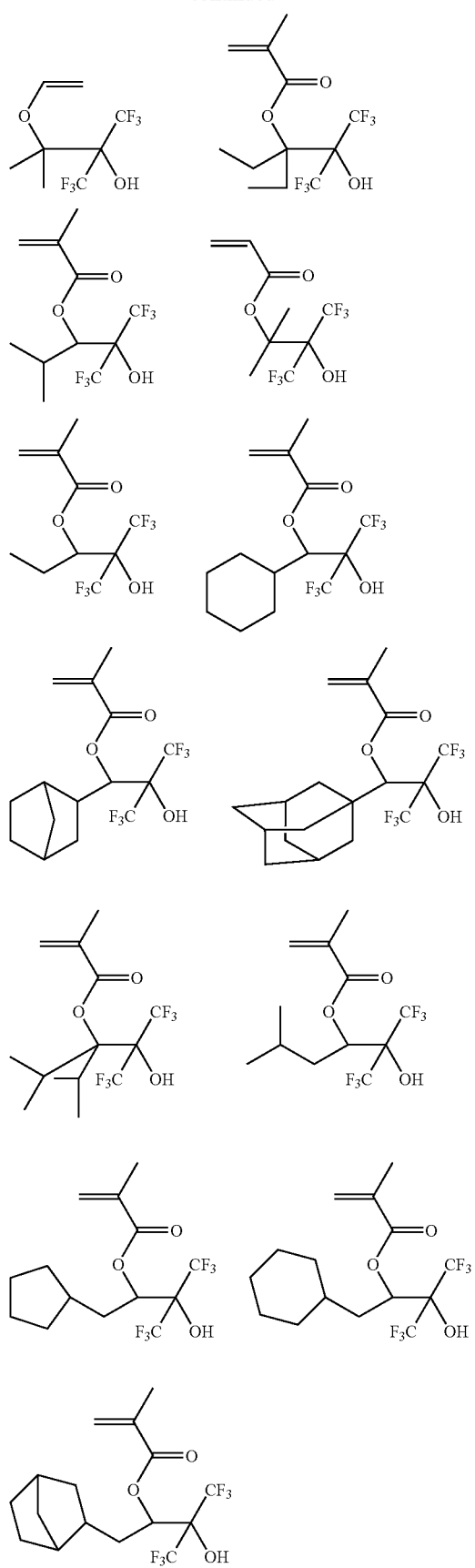
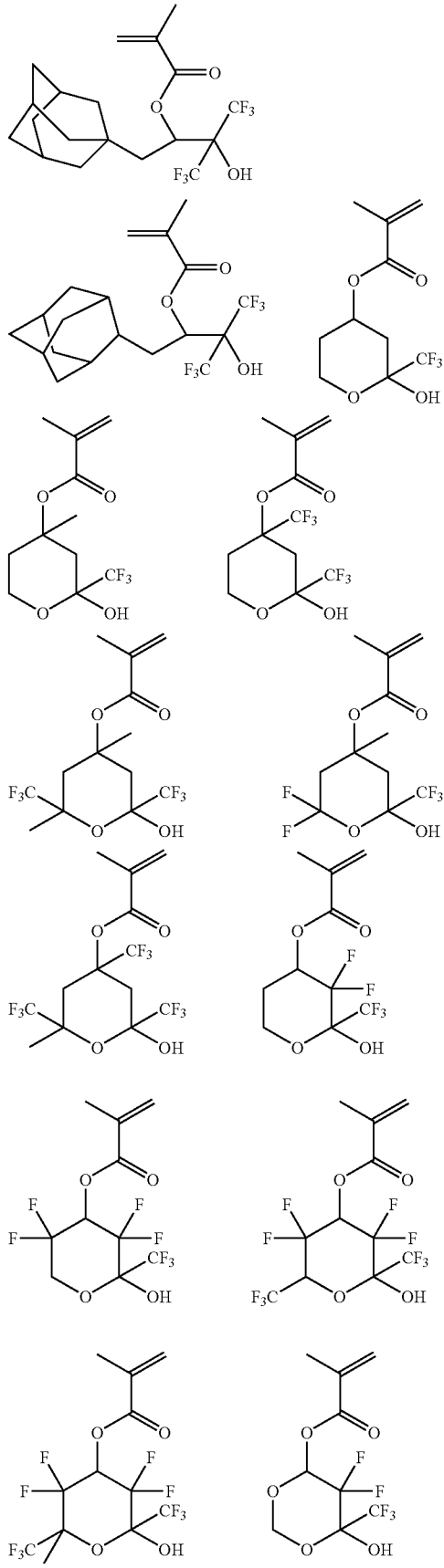

-continued
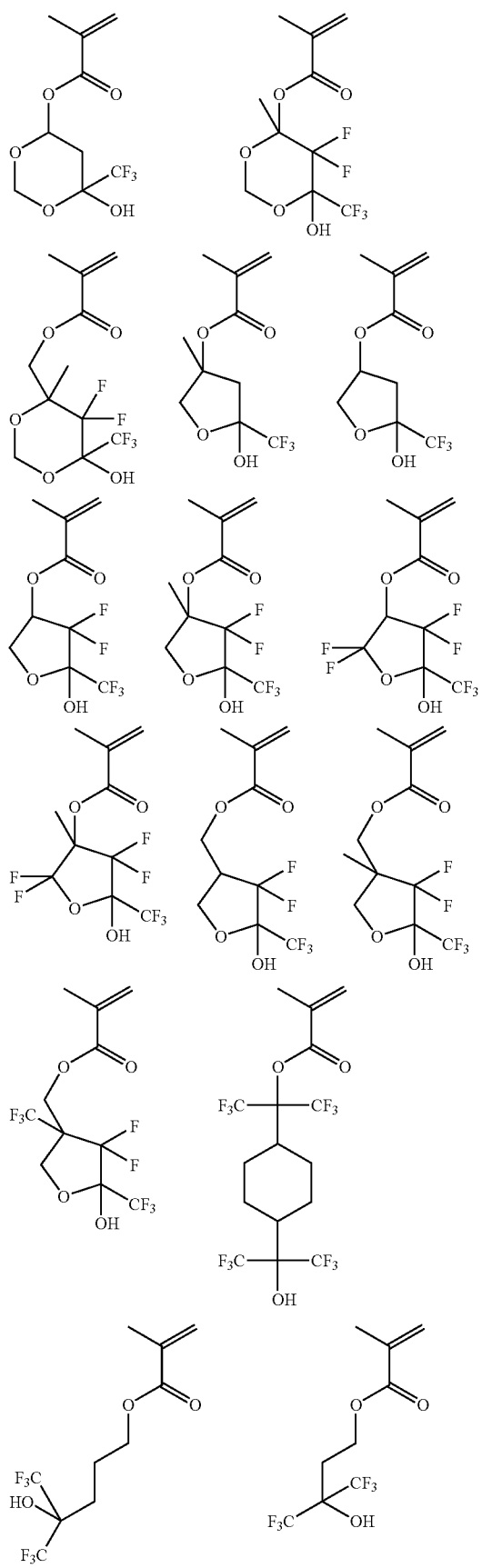
-continued
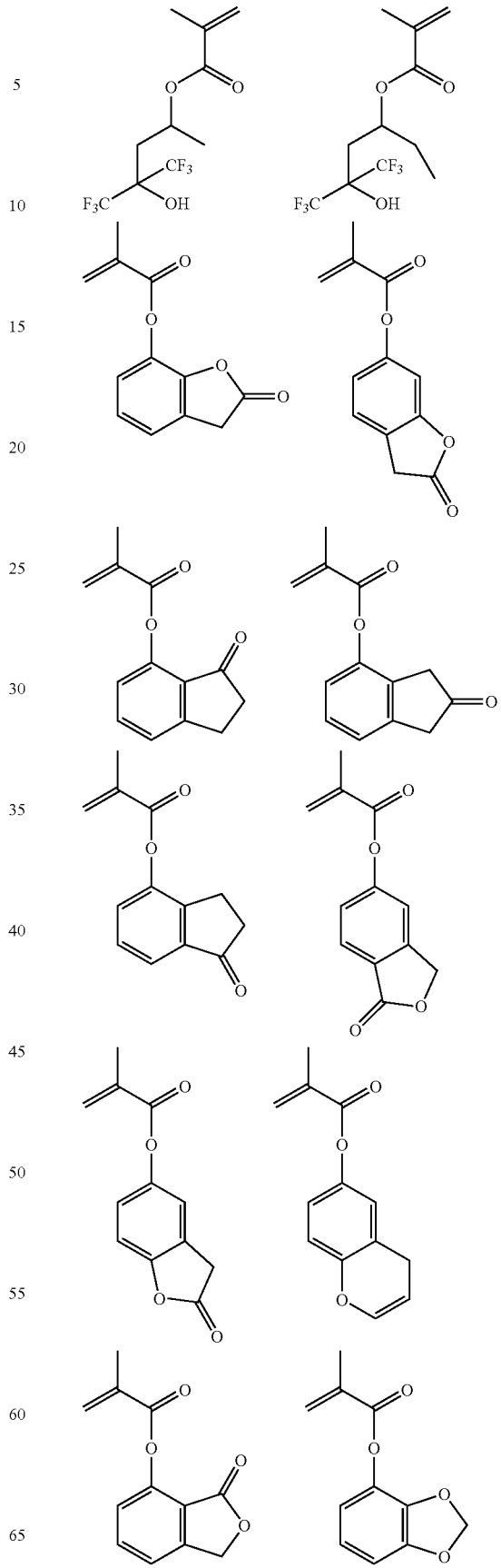

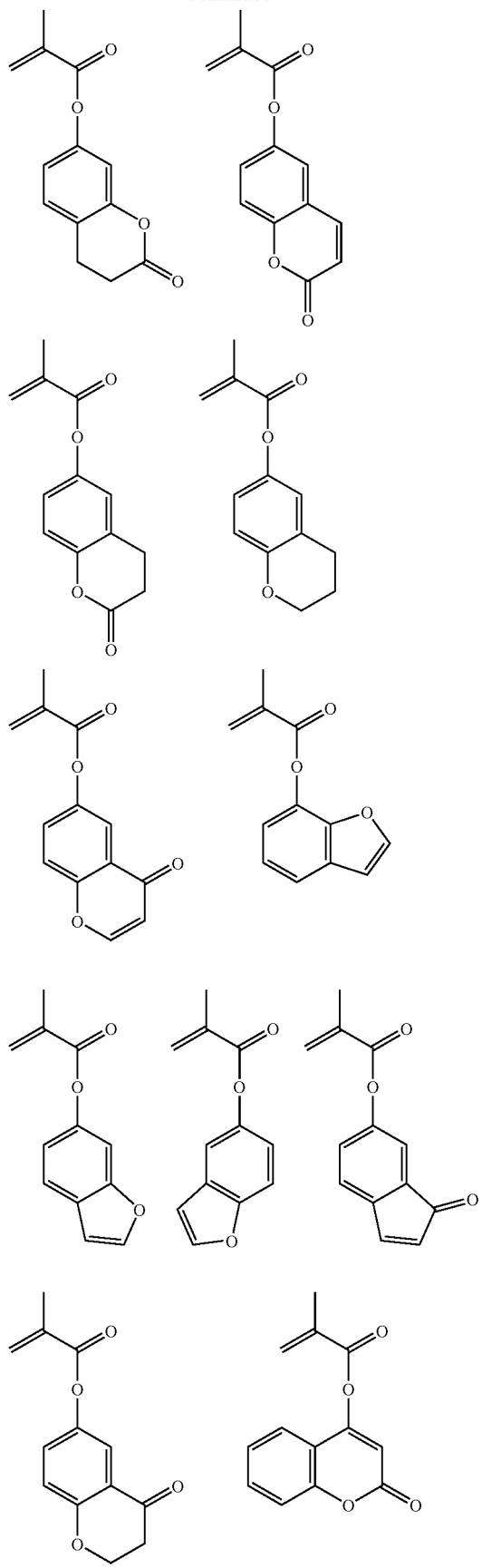
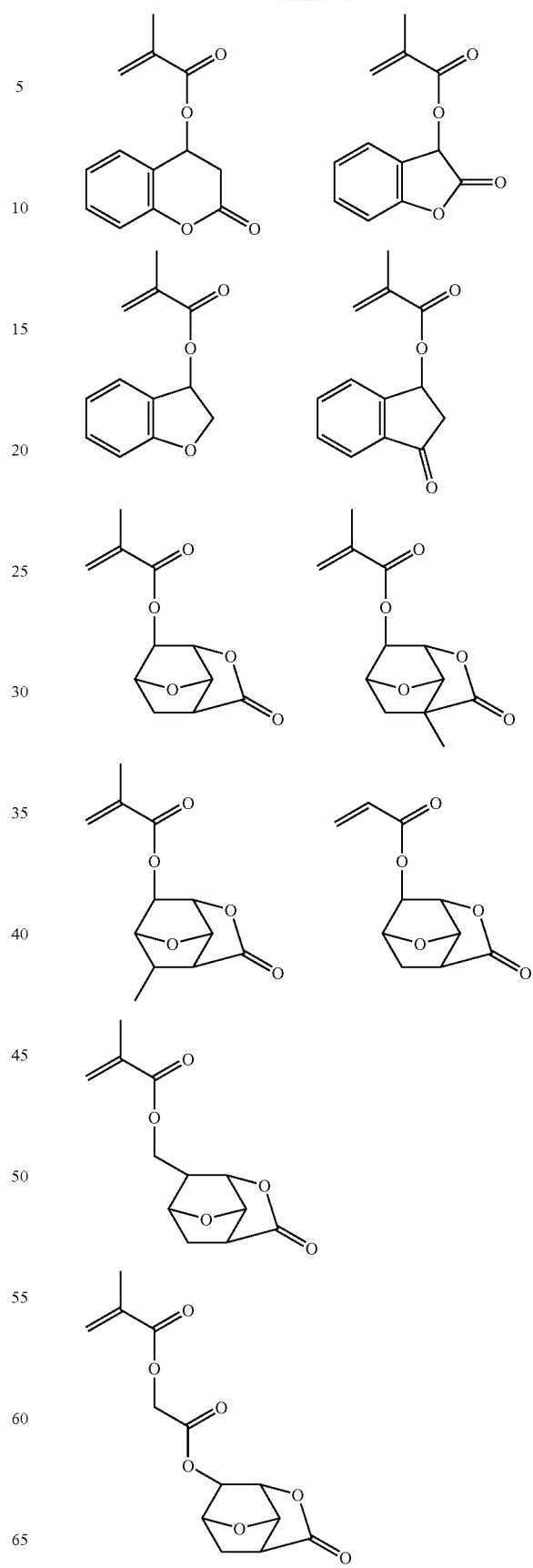

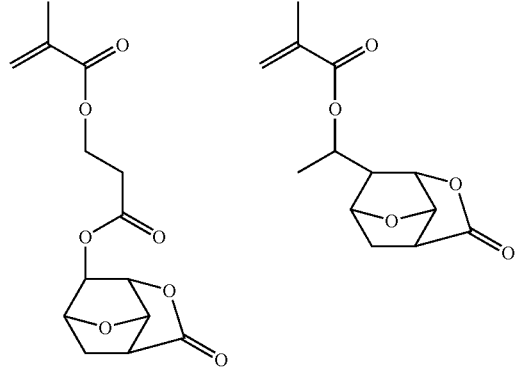
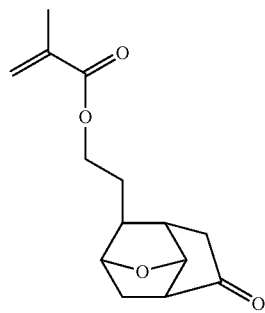
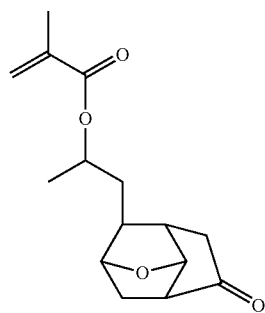
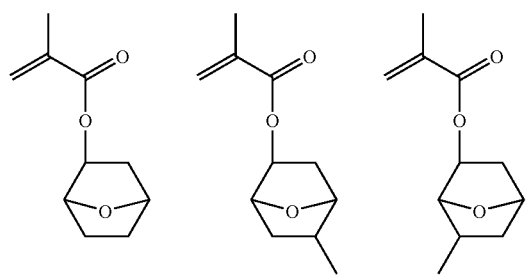
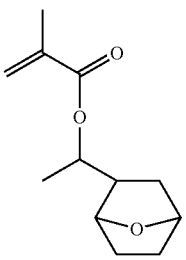
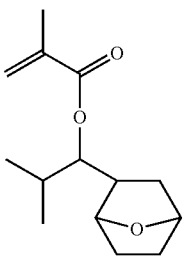
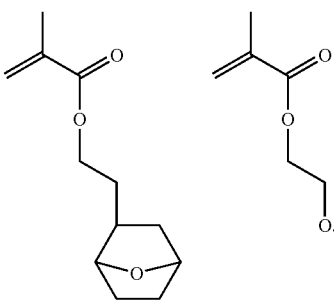
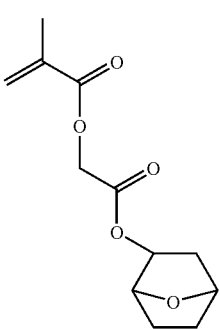
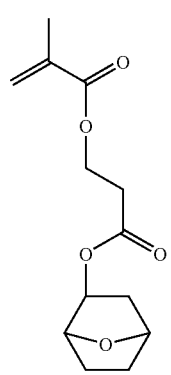
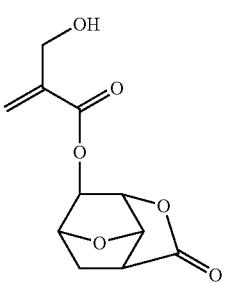
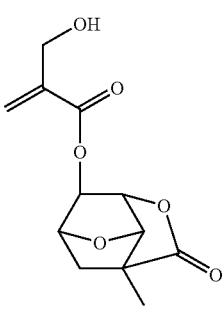
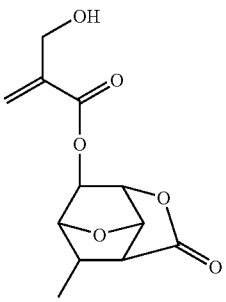
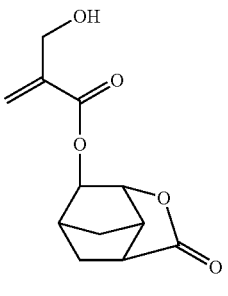

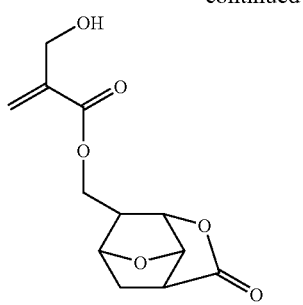
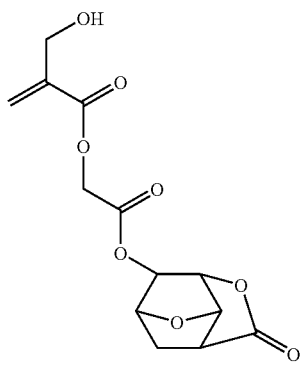
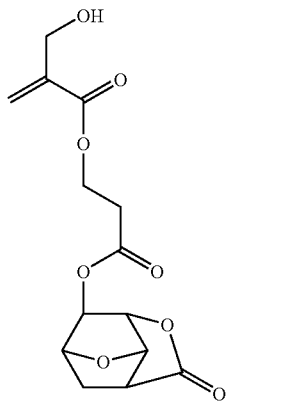
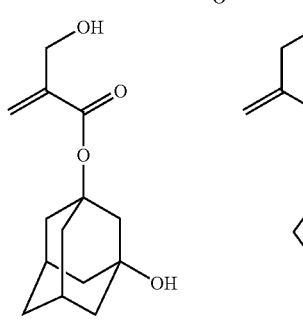
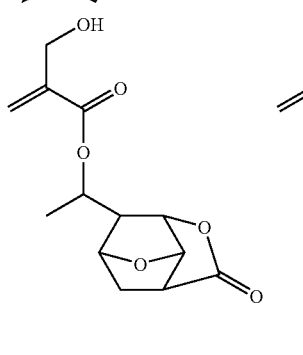
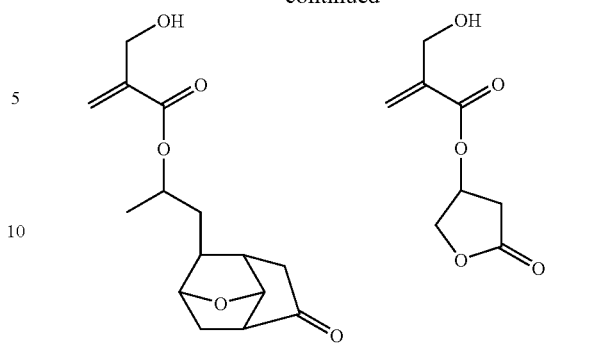
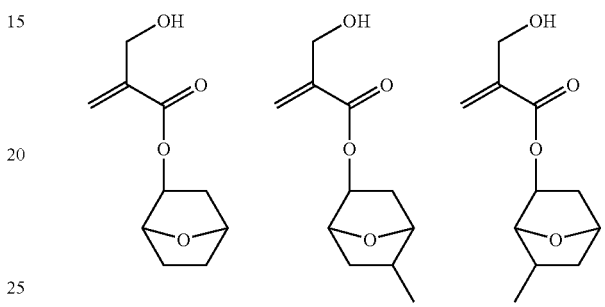
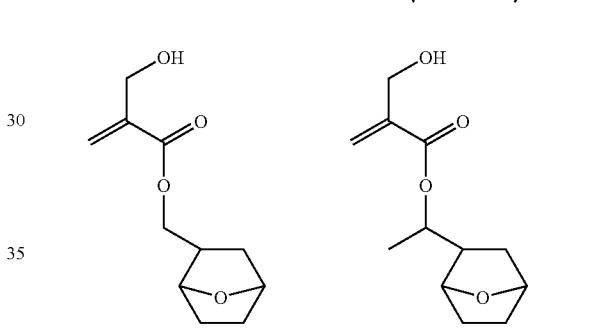
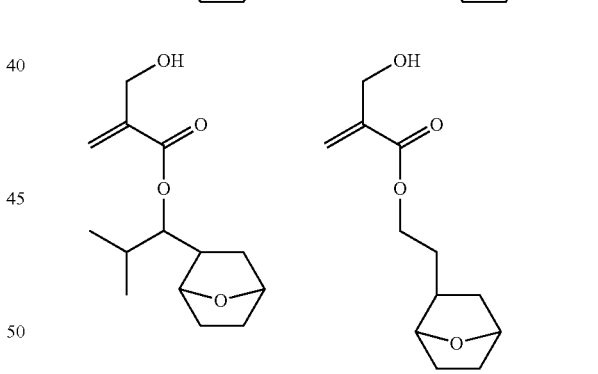
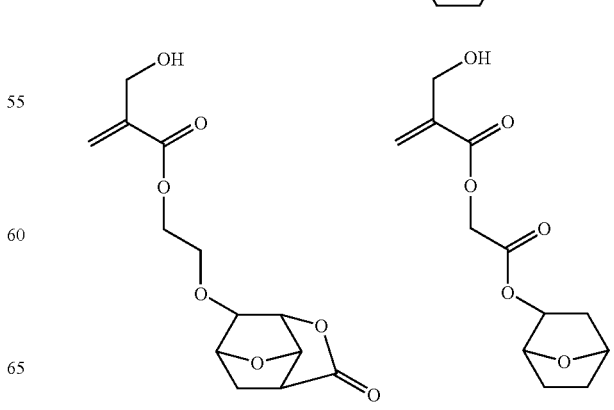

-continued

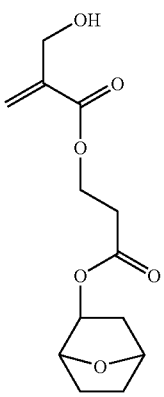

Prior to polymerization, the hydroxy group of α-hydroxymethyl or the phenolic hydroxy group may be substituted by an acetal such as an acetoxy or ethoxyethoxy group, and after polymerization, it may be converted back to the hydroxy group by alkaline hydrolysis or weak acid hydrolysis, typically hydrolysis with oxalic acid. The α-hydroxymethyl or phenolic hydroxy group serves to accelerate intermolecular or intramolecular crosslinking to enhance the efficiency of pattern curing after formation of the first pattern.

In the polymer of the invention, the recurring units (a-1a), (a-2), (a-3), (b) and (c) are present in proportions a1a, a2, a3, b, and c, respectively, which satisfy the range: $0 \leq a1 < 1.0$, $0 \leq a2 < 1.0$, $0 < a1a + a2 < 1.0$, $0 \leq a3 < 1.0$, $0 < b \leq 0.8$, $0.1 \leq a1a + a2 + b \leq 1.0$, $0 \leq c < 1.0$, and $0.2 \leq a1a + a2 + a3 + b + c \leq 1.0$, preferably the range: $0 \leq a1 \leq 0.9$, $0 \leq a2 \leq 0.9$, $0.1 \leq a1a + a2 \leq 0.9$, $0 \leq a3 \leq 0.5$, (more preferably $0.05 \leq a3 \leq 0.4$), $0.1 \leq b \leq 0.7$, $0.2 \leq a1a + a2 + b \leq 1.0$, $0 \leq c \leq 0.9$, and $0.3 \leq a1a + a2 + a3 + b + c \leq 1.0$.

The polymer serving as the base polymer in the resist used in the pattern forming process of the invention should preferably have a weight average molecular weight (Mw) in the range of 1,000 to 500,000, and more preferably 2,000 to 30,000 as measured by gel permeation chromatography (GPC) using polystyrene standards. With too low a Mw, the efficiency of thermal crosslinking in the resist material after development may become low. With too high a Mw, the polymer may lose alkali solubility and give rise to a footing phenomenon after pattern formation.

If a polymer has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer. Therefore, the multi-component copolymer should preferably have a narrow dispersity (Mw/Mn) of 1.0 to 2.0, especially 1.0 to 1.5, in order to provide a resist composition suitable for micropatterning to a small feature size.

It is understood that a blend of two or more polymers which differ in compositional ratio, molecular weight or dispersity is acceptable.

The polymer as used herein may be synthesized by any desired method, for example, by dissolving unsaturated bond-containing monomers corresponding to the respective units (a-1a), (a-2), (a-3), (b) and (c) in an organic solvent, adding a radical initiator thereto, and effecting heat polymerization. Examples of the organic solvent which can be used for polymerization include toluene, benzene, tetrahydrofuran, diethyl ether and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours. The acid labile group that has been incorporated in the monomers may be kept as such, or the acid labile group may be once removed with an acid catalyst and thereafter protected or partially protected.

Resist Composition

In addition to the polymer, the resist composition, specifically chemically amplified positive resist composition, used in the pattern forming process of the invention may comprise an organic solvent, an acid generator, and optionally, a dissolution inhibitor, a basic compound, a surfactant and other additives.

Solvent

The organic solvent used herein may be any organic solvent in which the base resin, acid generator, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1a-methoxy-2-propanol, and 1a-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, diethylene glycol dimethyl ether, 1a-ethoxy-2-propanol and propylene glycol monomethyl ether acetate, and mixtures thereof are preferred because the acid generator is most soluble therein.

The organic solvent is preferably used in an amount of 200 to 1,000 parts by weight, more preferably 400 to 800 parts by weight per 100 parts by weight of the base resin.

Acid Generator

An acid generator may be used either in the positive resist composition. Typically it is a photoacid generator adapted to generate an acid upon receipt of high-energy radiation. Suitable acid generators include the following:
(i) onium salts of the formula (P1aa-1a), (P1aa-2), (P1aa-3) or (P1ab),
(ii) diazomethane derivatives of the formula (P2),
(iii) glyoxime derivatives of the formula (P3),
(iv) bissulfone derivatives of the formula (P4),
(v) sulfonic acid esters of N-hydroxyimide compounds of the formula (P5),
(vi) β-ketosulfonic acid derivatives,
(vii) disulfone derivatives,
(viii) nitrobenzylsulfonate derivatives, and
(ix) sulfonate derivatives.

These acid generators are described in detail.
(i) Onium Salts of Formula (P1aa-1a), (P1aa-2) and (P1aa-3):

(P1a-1)

-continued

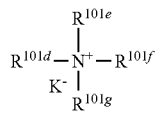

(P1a-2)

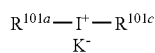

(P1a-3)

Herein, $R^{101a}$, $R^{101b}$, and $R^{101c}$ independently represent straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all hydrogen atoms may be replaced by alkoxy groups. Also, $R^{101b}$ and $R^{101c}$, taken together, may form a ring with the sulfur atom to which they are attached. $R^{101b}$ and $R^{101c}$ each are alkylene groups of 1 to 6 carbon atoms when they form a ring. $K^-$ is a sulfonic acid in which at least one alpha-position is fluorinated, or a perfluoroalkylimide acid or perfluoroalkylmethide acid. $R^{101d}$, $R^{101e}$, $R^{101f}$, and $R^{101g}$ stand for hydrogen atoms, straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all hydrogen atoms may be replaced by alkoxy groups. A pair of $R^{101d}$ and $R^{101e}$ or a combination of $R^{101d}$, $R^{101e}$ and $R^{101f}$ may form a ring with the nitrogen atom to which they are attached, and each of $R^{101d}$ and $R^{101e}$ or each of $R^{101d}$, $R^{101e}$ and $R^{101f}$ is an alkylene group of 3 to 10 carbon atoms or a hetero-aromatic ring having the nitrogen atom (in the formula) incorporated therein when they form a ring.

Of the onium salts having formulae (P1aa-1), (P1aa-2) and (P1aa-3), those of formula (P1aa-1) function as a photoacid generator, those of formula (P1aa-2) function as a thermal acid generator, and those of formula (P1aa-3) have both the functions of a photoacid generator and a thermal acid generator. A combination of photoacid generator (P1aa-1) with (P1aa-2) ensures efficiency in that the acid generated by (P1aa-1) upon exposure contributes to pattern formation, and the acid generated by (P1aa-2) by high-temperature heating after development contributes to crosslinking.

The triphenylsulfonium salts are excellent photoacid generators, but most of them cannot be used as the thermal acid generator because their thermal decomposition temperature exceeds 250° C. However, those sulfonium salts substituted with benzyl, naphthalenemethyl, alkyl and carbonylmethyl groups can be used as the thermal acid generator because their thermal decomposition temperature is low.

Examples of $K^-$ include perfluoroalkanesulfonates such as triflate and nonaflate; imidates such as bis(trifluoromethylsulfonyl)imide, bis(perfluoroethylsulfonyl)imide, and bis(perfluorobutylsulfonyl)imide; methidates such as tris(trifluoromethylsulfonyl)methide and tris(perfluoroethylsulfonyl)methide; sulfonates having fluorine substituted at α-position as represented by of the general formula (K-1a) and sulfonates having fluorine substituted at α-position as represented by of the general formula (K-2).

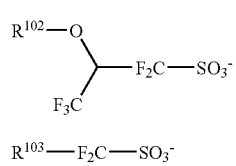

In formula (K-1a), $R^{102}$ is hydrogen, or a straight, branched or cyclic $C_1a$-$C_{20}$ alkyl or acyl group, $C_2$-$C_{20}$ alkenyl group, or $C_6$-$C_{20}$ aryl or aryloxy group, which may have an ether group, ester group, carbonyl group or lactone ring, or in which some or all hydrogen atoms may be substituted by fluorine atoms. In formula (K-2), $R^{103}$ is hydrogen, or a straight, branched or cyclic $C_1a$-$C_{20}$ alkyl group, $C_2$-$C_{20}$ alkenyl group, or $C_6$-$C_{20}$ aryl group.

$R^{101a}$, $R^{101b}$, and $R^{101c}$ may be the same or different and are illustrated below. Exemplary alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Exemplary alkenyl groups include vinyl, allyl, propenyl, butenyl, hexenyl, and cyclohexenyl. Exemplary oxoalkyl groups include 2-oxocyclopentyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl. Exemplary oxoalkenyl groups include 2-oxo-4-cyclohexenyl and 2-oxo-4-propenyl. Exemplary aryl groups include phenyl and naphthyl; alkoxyphenyl groups such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl. Exemplary aralkyl groups include benzyl, phenylethyl, and phenethyl. Exemplary aryloxoalkyl groups are 2-aryl-2-oxoethyl groups such as 2-phenyl-2-oxoethyl, 2-(1a-naphthyl)-2-oxoethyl, and 2-(2-naphthyl)-2-oxoethyl.

Examples of the non-nucleophilic counter ion represented by $K^-$ include halide ions such as chloride and bromide ions; fluoroalkylsulfonate ions such as triflate, 1,1,1a-trifluoroethanesulfonate, and nonafluorobutanesulfonate; arylsulfonate ions such as tosylate, benzenesulfonate, 4-fluorobenzenesulfonate, 1,2,3,4,5-pentafluorobenzenesulfonate; and alkylsulfonate ions such as mesylate and butanesulfonate.

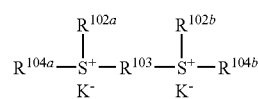

(P1b)

Herein, $R^{102a}$ and $R^{102b}$ independently represent straight, branched or cyclic $C_1a$-$C_8$ alkyl groups. $R^{103}$ represents a straight, branched or cyclic $C_1a$-$C_{10}$ alkylene group. $R^{104a}$ and $R^{104b}$ independently represent 2-oxoalkyl groups of 3 to 7 carbon atoms. $K^-$ is a non-nucleophilic counter ion.

Illustrative of the groups represented by $R^{102a}$ and $R^{102b}$ are methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl, and cyclohexylmethyl. Illustrative of the groups represented by $R^{103}$ are methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene, and 1,4-cyclohexanedimethylene. Illustrative of the groups represented by $R^{104a}$ and $R^{104b}$ are 2-oxopropyl, 2-oxocyclopentyl, 2-oxocyclohexyl, and 2-oxocycloheptyl. Illustrative examples of the counter ion represented by K⁻ are the same as exemplified for formulae (P1aa-1a) and (P1aa-2).

(ii) Diazomethane Derivatives of Formula (P2)

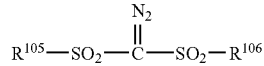
(P2)

Herein, $R^{105}$ and $R^{106}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms.

Of the groups represented by $R^{105}$ and $R^{106}$, exemplary alkyl groups include methyl, ethyl, propyl, isopropyl, n-butyl, sec-butyl, tert-butyl, pentyl, hexyl, heptyl, octyl, amyl, cyclopentyl, cyclohexyl, cycloheptyl, norbornyl, and adamantyl. Exemplary halogenated alkyl groups include trifluoromethyl, 1,1,1a-trifluoroethyl, 1,1,1a-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 1,2,3,4,5-pentafluorophenyl. Exemplary aralkyl groups include benzyl and phenethyl.

(iii) Glyoxime Derivatives of Formula (P3)

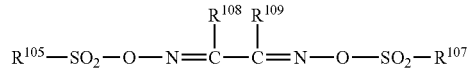
(P3)

Herein, $R^{107}$, $R^{108}$ and $R^{109}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms. Also, $R^{108}$ and $R^{109}$, taken together, may form a cyclic structure with the carbon atom to which they are attached. $R^{108}$ and $R^{109}$ each are a straight or branched alkylene group of 1 to 6 carbon atoms when they form a cyclic structure. $R^{105}$ is as defined in formula (P2).

Illustrative examples of the alkyl, halogenated alkyl, aryl, halogenated aryl, and aralkyl groups represented by $R^{107}$, $R^{108}$, and $R^{109}$ are the same as exemplified for $R^{105}$ and $R^{106}$. Examples of the alkylene groups represented by $R^{108}$ and $R^{109}$ include methylene, ethylene, propylene, butylene, and hexylene.

(iv) Bissulfone Derivatives of Formula (P4)

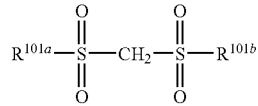
(P4)

Herein, $R^{101a}$ and $R^{101b}$ are as defined above.

(v) Sulfonic Acid Esters of N-Hydroxyimide Compounds of Formula (P5)

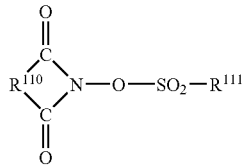
(P5)

Herein, $R^{110}$ is a $C_6$-$C_{10}$ arylene group, $C_1$a-$C_6$ alkylene group, or $C_2$-$C_6$ alkenylene group wherein some or all hydrogen atoms may be replaced by straight or branched $C_1$a-$C_4$ alkyl or alkoxy groups, nitro, acetyl, or phenyl groups. $R^{111}$ is a straight, branched or cyclic $C_1$a-$C_8$ alkyl group, alkenyl, alkoxyalkyl, phenyl or naphthyl group wherein some or all hydrogen atoms may be replaced by $C_1$a-$C_4$ alkyl or alkoxy groups, phenyl groups (which may have substituted thereon a $C_1$a-$C_4$ alkyl or alkoxy, nitro, or acetyl group), hetero-aromatic groups of 3 to 5 carbon atoms, or chlorine or fluorine atoms.

Of the groups represented by $R^{110}$, exemplary arylene groups include 1,2-phenylene and 1,8-naphthylene; exemplary alkylene groups include methylene, ethylene, trimethylene, tetramethylene, phenylethylene, and norbornane-2,3-diyl; and exemplary alkenylene groups include 1,2-vinylene, 1a-phenyl-1,2-vinylene, and 5-norbornene-2,3-diyl. Of the groups represented by $R^{111}$a, exemplary alkyl groups are as exemplified for $R^{101a}$ to $R^{101c}$; exemplary alkenyl groups include vinyl, 1a-propenyl, allyl, 1a-butenyl, 3-butenyl, isoprenyl, 1a-pentenyl, 3-pentenyl, 4-pentenyl, dimethylallyl, 1a-hexenyl, 3-hexenyl, 5-hexenyl, 1a-heptenyl, 3-heptenyl, 6-heptenyl, and 7-octenyl; and exemplary alkoxyalkyl groups include methoxymethyl, ethoxymethyl, propoxymethyl, butoxymethyl, pentyloxymethyl, hexyloxymethyl, heptyloxymethyl, methoxyethyl, ethoxyethyl, propoxyethyl, butoxyethyl, pentyloxyethyl, hexyloxyethyl, methoxypropyl, ethoxypropyl, propoxypropyl, butoxypropyl, methoxybutyl, ethoxybutyl, propoxybutyl, methoxypentyl, ethoxypentyl, methoxyhexyl, and methoxyheptyl.

Of the substituents on these groups, the alkyl groups of 1 to 4 carbon atoms include methyl, ethyl, propyl, isopropyl, n-butyl, isobutyl and tert-butyl; and the alkoxy groups of 1 to 4 carbon atoms include methoxy, ethoxy, propoxy, isopropoxy, n-butoxy, isobutoxy, and tert-butoxy. The phenyl groups which may have substituted thereon an alkyl or alkoxy of 1 to 4 carbon atoms, nitro, or acetyl group include phenyl, tolyl, p-tert-butoxyphenyl, p-acetylphenyl and p-nitrophenyl. The hetero-aromatic groups of 3 to 5 carbon atoms include pyridyl and furyl.

Illustrative examples of the acid generator include:
onium salts such as diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis (p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, trinaphthylsulfonium trifluoromethanesulfonate, (2-norbornyl)methyl(2-oxocyclohexyl)sulfonium trifluoromethanesulfonate, ethylenebis[methyl(2-oxocyclopentyl)sulfonium trifluoromethanesulfonate], and 1,2'-naphthylcarbonylmethyltetrahydrothiophenium triflate;

diazomethane derivatives such as bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1a-cyclohexylsulfonyl-1a-(tert-butylsulfonyl)diazomethane, 1a-cyclohexylsulfonyl-1a-(tert-amylsulfonyl)diazomethane, and 1a-tert-amylsulfonyl-1a-(tert-butylsulfonyl)diazomethane;

glyoxime derivatives such as bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1a-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime;

bissulfone derivatives such as bisnaphthylsulfonylmethane, bistrifluoromethylsulfonylmethane, bismethylsulfonylmethane, bisethylsulfonylmethane, bispropylsulfonylmethane, bisisopropylsulfonylmethane, bis-p-toluenesulfonylmethane, and bisbenzenesulfonylmethane;

β-ketosulfone derivatives such as 2-cyclohexylcarbonyl-2-(p-toluenesulfonyl)propane and 2-isopropylcarbonyl-2-(p-toluenesulfonyl)propane;

disulfone derivatives such as diphenyl disulfone derivatives and dicyclohexyl disulfone derivatives;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; and sulfonic acid esters of N-hydroxyimides such as N-hydroxysuccinimide methanesulfonate, N-hydroxysuccinimide trifluoromethanesulfonate, N-hydroxysuccinimide ethanesulfonate, N-hydroxysuccinimide 1a-propanesulfonate, N-hydroxysuccinimide 2-propanesulfonate, N-hydroxysuccinimide 1a-pentanesulfonate, N-hydroxysuccinimide 1a-octanesulfonate, N-hydroxysuccinimide p-toluenesulfonate, N-hydroxysuccinimide p-methoxybenzenesulfonate, N-hydroxysuccinimide 2-chloroethanesulfonate, N-hydroxysuccinimide benzenesulfonate, N-hydroxysuccinimide 2,4,6-trimethylbenzenesulfonate, N-hydroxysuccinimide 1a-naphthalenesulfonate, N-hydroxysuccinimide 2-naphthalenesulfonate, N-hydroxy-2-phenylsuccinimide methanesulfonate, N-hydroxymaleimide methanesulfonate, N-hydroxymaleimide ethanesulfonate, N-hydroxy-2-phenylmaleimide methanesulfonate, N-hydroxyglutarimide methanesulfonate, N-hydroxyglutarimide benzenesulfonate, N-hydroxyphthalimide methanesulfonate, N-hydroxyphthalimide benzenesulfonate, N-hydroxyphthalimide trifluoromethanesulfonate, N-hydroxyphthalimide p-toluenesulfonate, N-hydroxynaphthalimide methanesulfonate, N-hydroxynaphthalimide benzenesulfonate, N-hydroxy-5-norbornene-2,3-dicarboxylmide methanesulfonate, N-hydroxy-5-norbornene-2,3-dicarboxylmide trifluoromethanesulfonate, and N-hydroxy-5-norbornene-2,3-dicarboxyimide p-toluenesulfonate.

Preferred among these acid generators are onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, tris(p-tert-butoxyphenyl)sulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocyclohexyl)sulfonium trifluoromethanesulfonate, and 1,2'-naphthylcarbonylmethyltetrahydrothiophenium triflate;

diazomethane derivatives such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, and bis(tert-butylsulfonyl)diazomethane;

glyoxime derivatives such as bis-O-(p-toluenesulfonyl)-α-dimethylglyoxime and bis-O-(n-butanesulfonyl)-α-dimethylglyoxime; bissulfone derivatives such as bisnaphthylsulfonylmethane; and sulfonic acid esters of N-hydroxyimide compounds such as N-hydroxysuccinimide methanesulfonate, N-hydroxysuccinimide trifluoromethanesulfonate, N-hydroxysuccinimide 1a-propanesulfonate, N-hydroxysuccinimide 2-propanesulfonate, N-hydroxysuccinimide 1a-pentanesulfonate, N-hydroxysuccinimide p-toluenesulfonate, N-hydroxynaphthalimide methanesulfonate, and N-hydroxynaphthalimide benzenesulfonate.

Also useful are acid generators of the oxime type described in WO 2004/074242 A2.

These acid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The acid generator is preferably added in an amount of 0.1 to 50 parts, and especially 0.5 to 40 parts by weight, per 100 parts by weight of the base resin. Less than 0.1 pbw of the acid generator may generate a less amount of acid upon exposure, sometimes leading to a poor sensitivity and resolution. More than 50 pbw of the acid generator may adversely affect the transmittance and resolution of resist. For example, where (P1aa-1a) and (P1aa-2) are used in combination, they are preferably mixed such that the mixture consists of 1 pbw of (P1aa-1a) and 0.001 to 1 pbw of (P1aa-2).

Dissolution Inhibitor

To the positive resist composition, a dissolution inhibitor or regulator may be added. The dissolution inhibitor is a compound having on the molecule at least two phenolic hydroxyl groups, in which an average of from 0 to 100 mol % of all the hydrogen atoms on the phenolic hydroxyl groups are replaced with acid labile groups or a compound having on the molecule at least one carboxyl group, in which an average of 50 to 100 mol % of all the hydrogen atoms on the carboxyl groups are replaced with acid labile groups, both the compounds having a weight average molecular weight within a range of 100 to 1,000, and preferably 150 to 800.

The degree of substitution of the hydrogen atoms on the phenolic hydroxyl groups with acid labile groups is on average at least 0 mol %, and preferably at least 30 mol %, of all the phenolic hydroxyl groups. The upper limit is 100 mol %, and preferably 80 mol %. The degree of substitution of the hydrogen atoms on the carboxyl groups with acid labile groups is on average at least 50 mol %, and preferably at least 70 mol %, of all the carboxyl groups, with the upper limit being 100 mol %.

Preferable examples of such compounds having two or more phenolic hydroxyl groups or compounds having at least one carboxyl group include those of formulas (D1a) to (D14) below.

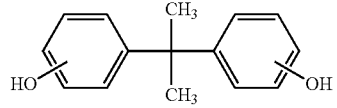
(D1)

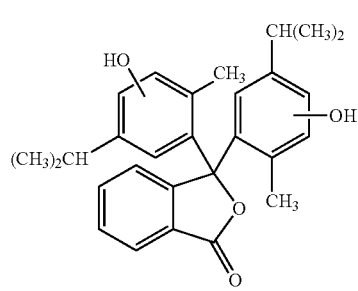
(D2)

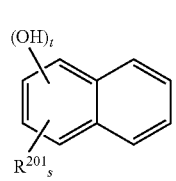
(D3)

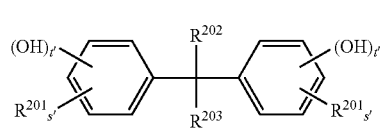
(D4)

-continued

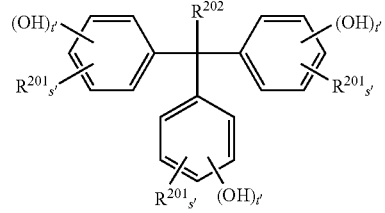
(D5)

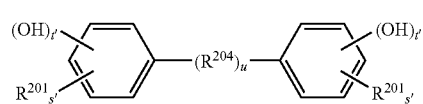
(D6)

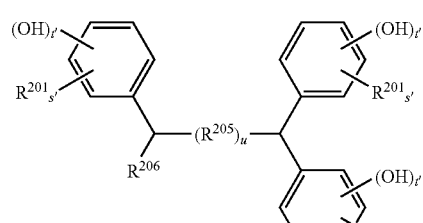
(D7)

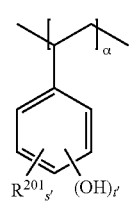
(D8)

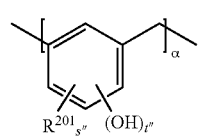
(D9)

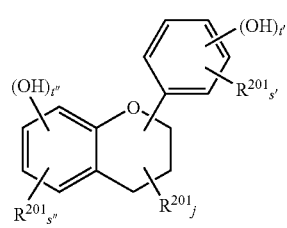
(D10)

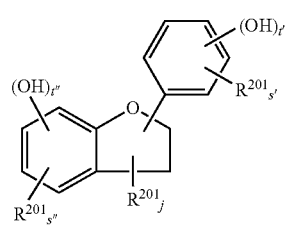
(D11)

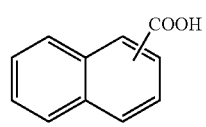
(D12)

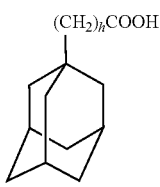

(D13)

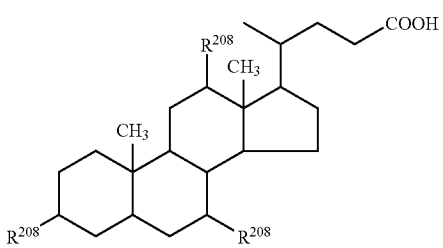

(D14)

In these formulas, $R^{201}$ and $R^{202}$ are each hydrogen or a straight or branched $C_1$a-$C_8$ alkyl or alkenyl; $R^{203}$ is hydrogen, a straight or branched $C_1$a-$C_8$ alkyl or alkenyl, or —$(R^{207})_h$—COOH; $R^{204}$ is —$(CH_2)_i$— (where i=2 to 10), a $C_6$-$C_{10}$ arylene, carbonyl, sulfonyl, an oxygen atom, or a sulfur atom; $R^{205}$ is a $C_1$a-$C_{10}$ alkylene, a $C_6$-$C_{10}$ arylene, carbonyl, sulfonyl, an oxygen atom, or a sulfur atom; $R^{206}$ is hydrogen, a straight or branched $C_1$-$C_8$ alkyl or alkenyl, or a hydroxyl-substituted phenyl or naphthyl; $R^{207}$ is a straight or branched $C_1$a-$C_{10}$ alkylene; $R^{208}$ is hydrogen or hydroxyl; the letter j is an integer from 0 to 5; u and h are each 0 or 1a; s, t, s', t', s'', and t'' are each numbers which satisfy s+t=8, s'+t'=5, and s''+t''=4, and are such that each phenyl structure has at least one hydroxyl group; and α is a number such that the compounds of formula (D8) or (D9) have a molecular weight of from 100 to 1,000.

The dissolution inhibitor may be formulated in an amount of 0 to 50 parts, preferably 5 to 50 parts, and more preferably 10 to 30 parts by weight, per 100 parts by weight of the base resin, and may be used singly or as a mixture of two or more thereof. A less amount of the dissolution inhibitor fails to improve resolution whereas more than 50 parts may lead to slimming of the patterned film, and thus a decline in resolution.

Basic Compound

The basic compound used herein is preferably a compound capable of suppressing the rate of diffusion when the acid generated by the acid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile.

Examples of suitable basic compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, nitrogen-containing alcoholic compounds, amide derivatives, and imide derivatives.

Examples of suitable primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine.

Examples of suitable aromatic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, and diaminonaphthalene. Examples of suitable heterocyclic amines include pyrrole derivatives (e.g., pyrrole, 2H-pyrrole, 1a-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1a-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1a-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1a-methyl-2-pyridone, 4-pyrrolidinopyridine, 1a-methyl-4-phenylpyridine, 2-(1a-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g., nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds having sulfonyl group include 3-pyridinesulfonic acid and pyridinium p-toluenesulfonate. Examples of suitable nitrogen-containing compounds having hydroxyl group, nitrogen-containing compounds having hydroxyphenyl group, and nitrogen-containing alcoholic compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1a-propanol, 4-amino-1a-butanol, 4-(2-hydroxyethyl)morpholine, 2-(2-hydroxyethyl)pyridine, 1a-(2-hydroxyethyl)piperazine, 1a-[2-(2-hydroxyethoxy)ethyl]piperazine, piperidine ethanol, 1a-(2-hydroxyethyl)pyrrolidine, 1a-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1a-methyl-2-pyrrolidine ethanol, 1a-aziridine ethanol, N-(2-hydroxyethyl)phthalimide, and N-(2-hydroxyethyl)isonicotinamide.

Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

One or more basic compounds of the following general formula (B)-1 may also be added.

$$N(X)_n(Y)_{3-n} \quad (B)\text{-}1$$

In the formula, n is equal to 1, 2 or 3; side chain Y is independently hydrogen or a straight, branched or cyclic $C_1$-$C_{20}$ alkyl group which may contain an ether or hydroxyl group; and side chain X is independently selected from groups of the following general formulas (X)-1 to (X)-3, and two or three X's may bond together to form a ring.

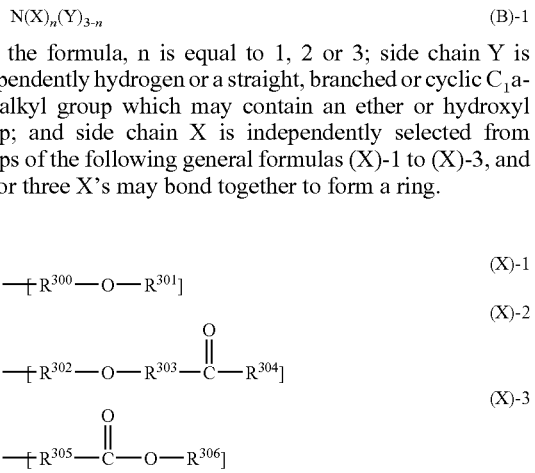

In the formulas, $R^{300}$, $R^{302}$ and $R^{305}$ are independently straight or branched alkylene groups of 1 to 4 carbon atoms; $R^{301}$ and $R^{304}$ are independently hydrogen, straight, branched or cyclic alkyl groups of 1 to 20 carbon atoms, which may contain at least one hydroxyl, ether, ester group or lactone ring; $R^{303}$ is a single bond or a straight or branched alkylene group of 1 to 4 carbon atoms; and $R^{306}$ is a straight, branched or cyclic alkyl group of 1 to 20 carbon atoms, which may contain at least one hydroxyl, ether, ester group or lactone ring.

Illustrative examples of the compounds of formula (B)-1 include tris(2-methoxymethoxyethyl)amine, tris{2-(2-methoxyethoxy)ethyl}amine, tris{2-(2-methoxyethoxymethoxy)ethyl}amine, tris{2-(1a-methoxyethoxy)ethyl}amine, tris{2-(1a-ethoxyethoxy)ethyl}amine, tris{2-(1a-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8] hexacosane, 4,7,13,18-tetraoxa-1,10-diazabicyclo[8.5.5] eicosane, 1,4,10,13-tetraoxa-7,16-diazabicyclooctadecane, 1a-aza-12-crown-4,1a-aza-15-crown-5,1a-aza-18-crown-6, tris(2-formyloxyethyl)amine, tris(2-acetoxyethyl)amine, tris (2-propionyloxyethyl)amine, tris(2-butyryloxyethyl)amine, tris(2-isobutyryloxyethyl)amine, tris(2-valeryloxyethyl) amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl) amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl) amine, N,N-bis(2-hydroxyethyl)-2-(methoxycarbonyl) ethylamine, N,N-bis(2-acetoxyethyl)-2-(methoxycarbonyl) ethylamine, N,N-bis(2-hydroxyethyl)-2-(ethoxycarbonyl) ethylamine, N,N-bis(2-acetoxyethyl)-2-(ethoxycarbonyl) ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl) ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl)methoxycarbonyl]-ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl) ethylamine, N,N-bis(2-acetoxyethyl)-2-(tetrahydrofurfuryloxycarbonyl)ethylamine, N,N-bis(2-hydroxyethyl)-2-[(2-oxotetrahydrofuran-3-yl)oxycarbonyl] ethylamine, N,N-bis(2-acetoxyethyl)-2-[(2-oxotetrahydrofuran-3-yl)oxycarbonyl]ethylamine, N,N-bis (2-hydroxyethyl)-2-(4-hydroxybutoxycarbonyl)ethylamine, N,N-bis(2-formyloxyethyl)-2-(4-formyloxybutoxycarbonyl)ethylamine, N,N-bis(2-formyloxyethyl)-2-(2-formyloxyethoxycarbonyl)ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1a-propyl)-bis [2-(methoxycarbonyl)ethyl]amine, N-(3-acetoxy-1a-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis [2-(2-methoxyethoxycarbonyl)ethyl]amine, N-methyl-bis (2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl) amine, tris(ethoxycarbonylmethyl)amine, N-butyl-bis (methoxycarbonylmethyl)amine, N-hexyl-bis (methoxycarbonylmethyl)amine, and β-(diethylamino)-δ-valerolactone.

Also useful are basic compounds having cyclic structure, represented by the following general formula (B)-2.

Herein X is as defined above, and $R^{307}$ is a straight or branched alkylene group of 2 to 20 carbon atoms which may contain one or more carbonyl, ether, ester or sulfide groups.

Illustrative examples of the compounds having formula (B)-2 include 1a-[2-(methoxymethoxy)ethyl]pyrrolidine, 1a-[2-(methoxymethoxy)ethyl]piperidine, 4-[2-(methoxymethoxy)ethyl]morpholine, 1a-[2-[(2-methoxyethoxy)methoxy]ethyl]pyrrolidine, 1a-[2-[(2-methoxyethoxy)methoxy]ethyl]piperidine, 4-[2-[(2-methoxyethoxy)methoxy]ethyl]morpholine, 2-(1a-pyrrolidinyl)ethyl acetate, 2-piperidinoethyl acetate, 2-morpholinoethyl acetate, 2-(1a-pyrrolidinyl)ethyl formate, 2-piperidinoethyl propionate, 2-morpholinoethyl acetoxyacetate, 2-(1a-pyrrolidinyl)ethyl methoxyacetate, 4-[2-(methoxycarbonyloxy)ethyl]morpholine, 1a-[2-(t-butoxycarbonyloxy)ethyl]piperidine, 4-[2-(2-methoxyethoxycarbonyloxy)ethyl]morpholine, methyl 3-(1a-pyrrolidinyl)propionate, methyl 3-piperidinopropionate, methyl 3-morpholinopropionate, methyl 3-(thiomorpholino)propionate, methyl 2-methyl-3-(1a-pyrrolidinyl) propionate, ethyl 3-morpholinopropionate, methoxycarbonylmethyl 3-piperidinopropionate, 2-hydroxyethyl 3-(1a-pyrrolidinyl)propionate, 2-acetoxyethyl 3-morpholinopropionate, 2-oxotetrahydrofuran-3-yl 3-(1a-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1a-pyrrolidinyl)propionate, butyl 3-morpholinopropionate, cyclohexyl 3-piperidinopropionate, α-(1a-pyrrolidinyl)methyl-γ-butyrolactone, β-piperidino-γ-butyrolactone, β-morpholino-δ-valerolactone, methyl 1a-pyrrolidinylacetate, methyl piperidinoacetate, methyl morpholinoacetate, methyl thiomorpholinoacetate, ethyl 1a-pyrrolidinylacetate, and 2-methoxyethyl morpholinoacetate.

Also, basic compounds having cyano group, represented by the following general formulae (B)-3 to (B)-6 are useful.

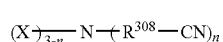
(B)-3

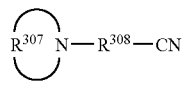
(B)-4

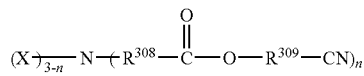
(B)-5

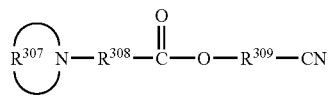
(B)-6

Herein, X, $R^{307}$ and n are as defined above, and $R^{308}$ and $R^{309}$ are each independently a straight or branched alkylene group of 1 to 4 carbon atoms.

Illustrative examples of the basic compounds having cyano group, represented by formulae (B)-3 to (B)-6, include 3-(diethylamino)propionitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiononitrile, N-(2-cyanoethyl)-N-(3-hydroxy-1a-propyl)-3-aminopropiononitrile, N-(3-acetoxy-1a-propyl)-N-(2-cyanoethyl)-3-aminopropiononitrile, N-(2-cyanoethyl)-N-(3-formyloxy-1a-propyl)-3-aminopropiononitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl)aminoacetonitrile, N,N-bis(2-acetoxyethyl)aminoacetonitrile, N,N-bis(2-formyloxyethyl)aminoacetonitrile, N,N-bis(2-methoxyethyl)aminoacetonitrile, N,N-bis[2-(methoxymethoxy)ethyl]aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl]aminoacetonitrile, N-cyanomethyl-N-(3-hydroxy-1a-propyl)aminoacetonitrile, N-(3-acetoxy-1a-propyl)-N-(cyanomethyl)aminoacetonitrile, N-cyanomethyl-N-(3-formyloxy-1a-propyl) aminoacetonitrile, N,N-bis(cyanomethyl)aminoacetonitrile, 1a-pyrrolidinepropiononitrile, 1a-piperidinepropiononitrile, 4-morpholinepropiononitrile, 1a-pyrrolidineacetonitrile, 1a-piperidineacetonitrile, 4-morpholineacetonitrile, cyanomethyl 3-diethylaminopropionate, cyanomethyl N,N-bis (2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-aminopropionate, cyanomethyl 1a-pyrrolidinepropionate, cyanomethyl 1a-piperidinepropionate, cyanomethyl 4-morpholinepropionate, 2-cyanoethyl 1a-pyrrolidinepropionate, 2-cyanoethyl 1a-piperidinepropionate, and 2-cyanoethyl 4-morpholinepropionate.

The basic compound is preferably formulated in an amount of 0.001 to 2 parts, and especially 0.01 to 1 part by weight, per 100 parts by weight of the base resin. Less than 0.001 part of the basic compound may achieve no or little addition effect whereas more than 2 parts may result in too low a sensitivity.

Other Components

In the positive resist composition, a compound having a group ≡C—COOH in the molecule may be blended. Exemplary, non-limiting compounds having a carboxyl group include one or more compounds selected from Groups I and II below. Including this compound improves the post-exposure delay (PED) stability of the resist and ameliorates edge roughness on nitride film substrates.

Group I:

Compounds of the general formulas (A1a) to (A10) below in which some or all of the hydrogen atoms on the phenolic hydroxyl groups have been replaced by —$R^{401}$a—COOH (wherein $R^{401}$ is a straight or branched alkylene of 1 to 10 carbon atoms), and in which the molar ratio C/(C+D) of phenolic hydroxyl groups (C) to =C—COOH groups (D) in the molecule is from 0.1 to 1.0.

(A1)
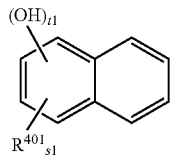

(A2)
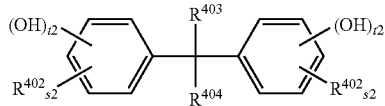

(A3)
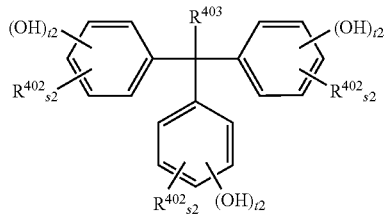

(A4)
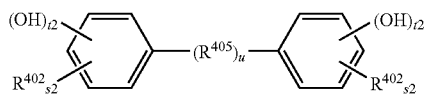

(A5)
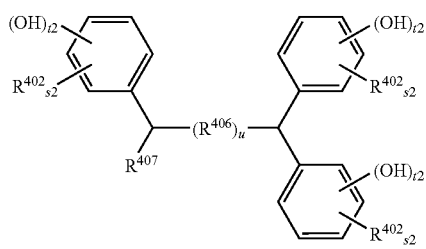

(A6)
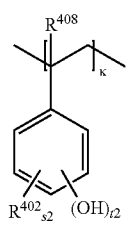

(A7)
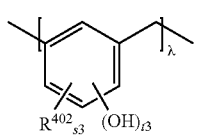

(A8)
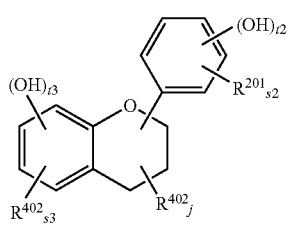

(A9)
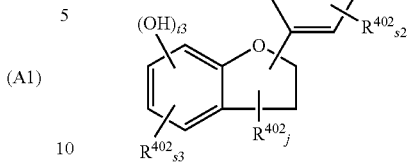

(A10)
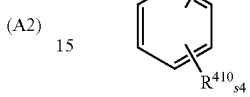

In these formulas, $R^{408}$ is hydrogen or methyl; $R^{402}$ and $R^{403}$ are each hydrogen or a straight or branched $C_1a$-$C_8$ alkyl or alkenyl; $R^{404}$ is hydrogen, a straight or branched $C_1a$-$C_8$ alkyl or alkenyl, or a —$(R^{409})_h$—COOR' group (R' being hydrogen or —$R^{409}$—COOH); $R^{405}$ is —$(CH_2)_i$— (wherein i is 2 to 10), a $C_6$-$C_{10}$ arylene, carbonyl, sulfonyl, an oxygen atom, or a sulfur atom; $R^{406}$ is a $C_1a$-$C_{10}$ alkylene, a $C_6$-$C_{10}$ arylene, carbonyl, sulfonyl, an oxygen atom, or a sulfur atom; $R^{407}$ is hydrogen, a straight or branched $C_1a$-$C_8$ alkyl or alkenyl, or a hydroxyl-substituted phenyl or naphthyl; $R^{409}$ is a straight or branched $C_1a$-$C_{10}$ alkyl or alkenyl or a —$R^{411}a$—COOH group; $R^{410}$ is hydrogen, a straight or branched $C_1a$-$C_8$ alkyl or alkenyl, or a —$R^{411}a$—COOH group; $R^{411}$ is a straight or branched $C_1a$-$C_{10}$ alkylene; h is an integer of 1 to 4, j is an integer from 0 to 3; s1a, t1a, s2, t2, s3, t3, s4, and t4 are each numbers which satisfy s1a+t1=8, s2+t2=5, s3+t3=4, and s4+t4=6, and are such that each phenyl structure has at least one hydroxyl group; u is an integer of 1 to 4; κ is a number such that the compound of formula (A6) may have a weight average molecular weight of 1,000 to 5,000; and λ is a number such that the compound of formula (A7) may have a weight average molecular weight of 1,000 to 10,000.

Group II:
Compounds of general formulas (A11a) to (A15) below.

(A11)
(OH)$_{t5}$ — [ring] — $R^{403}$ — [ring] — (OH)$_{t5}$
$R^{402}_{s5}$                $R^{411}$                $R^{402}_{s5}$
                              COOH (A12)
(OH)$_{t5}$ — [ring] — $R^{411}$—COOH
$R^{402}_{s5}$ (A13)
[naphthyl]—COOH

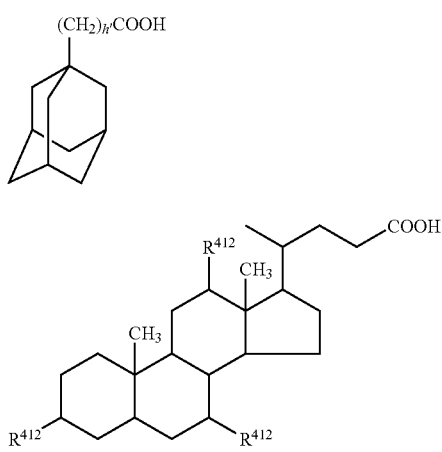

(A14)

(A15)

In these formulas, $R^{402}$, $R^{403}$, and $R^{411}$ are as defined above; $R^{412}$ is hydrogen or hydroxyl; s5 and t5 are numbers which satisfy $s5 \geqq 0$, $t5 \geqq 0$, and $s5+t5=5$; and h' is 0 or 1.

Illustrative, non-limiting examples of the compound having a carboxyl group include compounds of the general formulas AI-1 to AI-14 and AII-1 to AII-10 below.

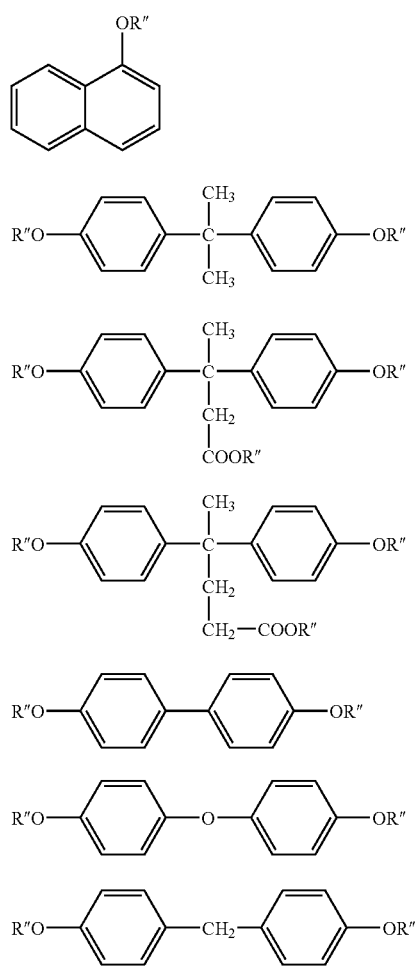

(AI-1)
(AI-2)
(AI-3)
(AI-4)
(AI-5)
(AI-6)
(AI-7)

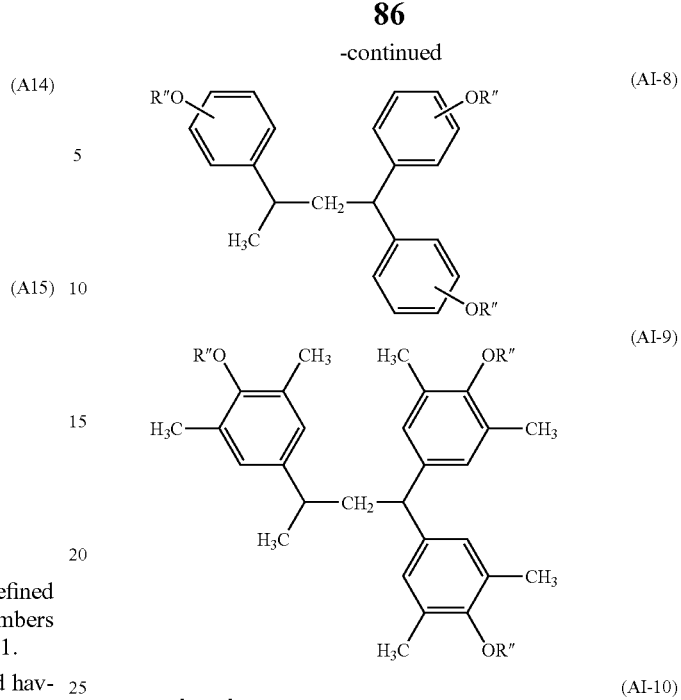

(AI-8)
(AI-9)
(AI-10)
(AI-11)
(AI-12)
(AI-13)
(AI-14)

In the above formulas, R" is hydrogen or a —CH$_2$COOH group such that the —CH$_2$COOH group accounts for 10 to 100 mol % of R" in each compound, κ and λ are as defined above.

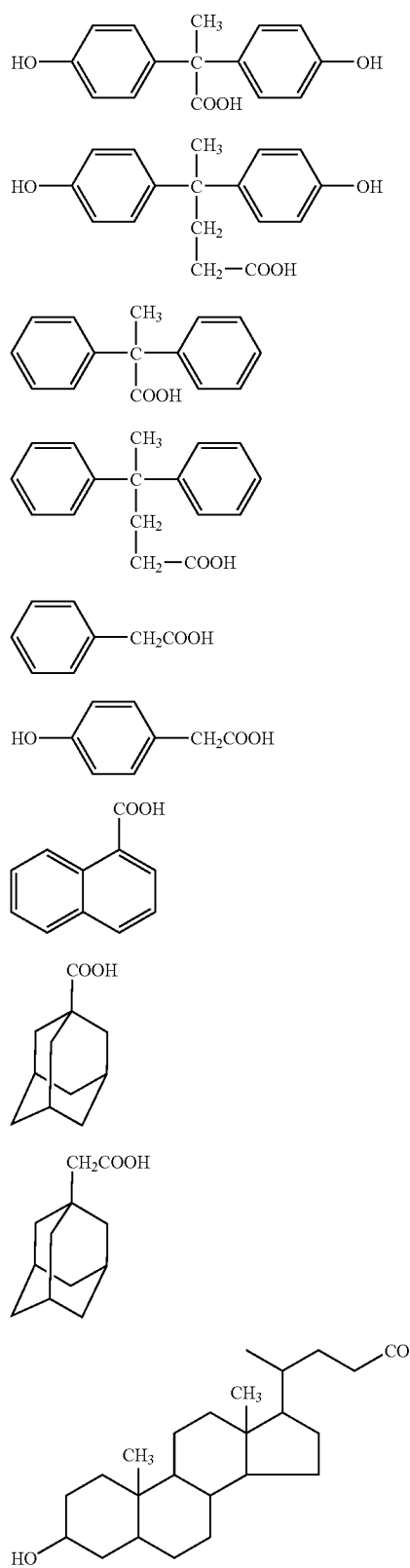

(AII-1)
(AII-2)
(AII-3)
(AII-4)
(AII-5)
(AII-6)
(AII-7)
(AII-8)
(AII-9)
(AII-10)

The compound having a group =C—COOH is added in an amount ranging from 0 to 5 parts, preferably 0.1 to 5 parts, more preferably 0.1 to 3 parts, further preferably 0.1 to 2 parts by weight, per 100 parts by weight of the base resin. More than 5 parts of the compound can reduce the resolution of the resist composition.

In the resist composition, a crosslinker having substituted or unsubstituted hydroxyalkylnaphthalene may be added to enhance the efficiency of acid-catalyzed crosslinking reaction. Suitable crosslinkers are shown below wherein $R^3$ is as defined previously.

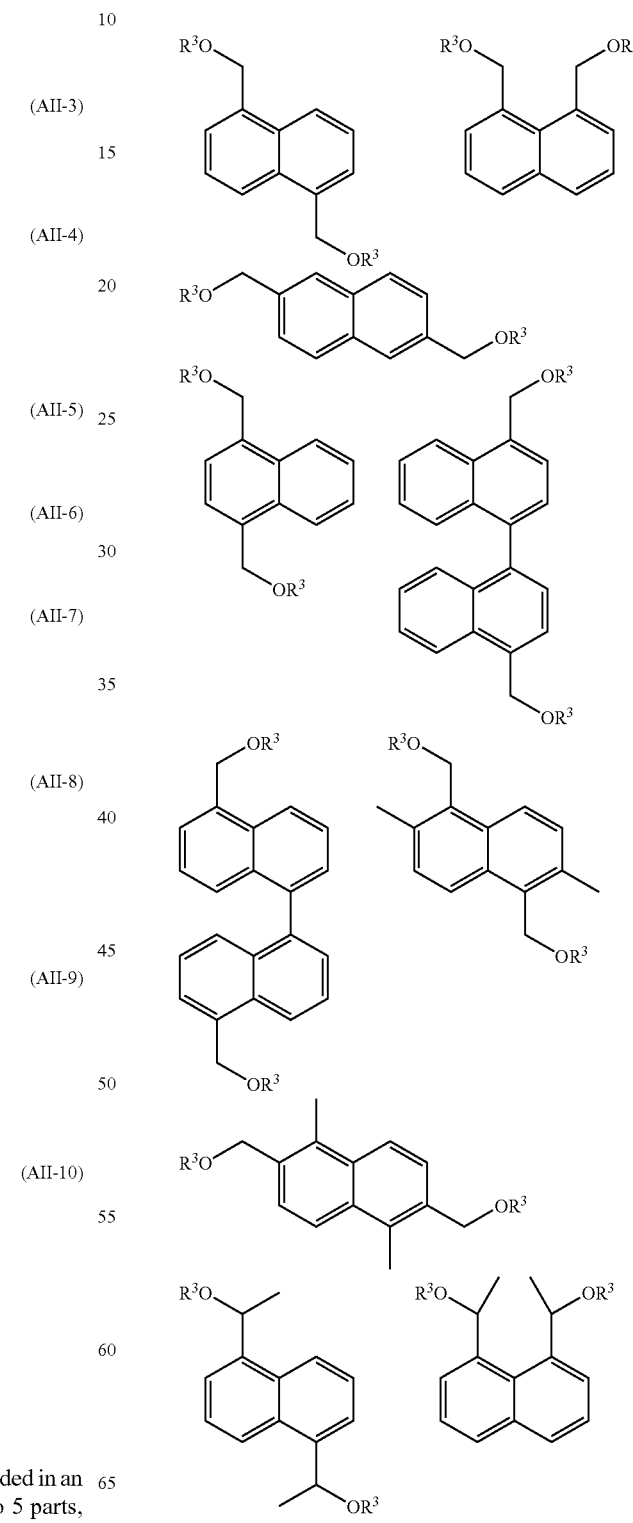

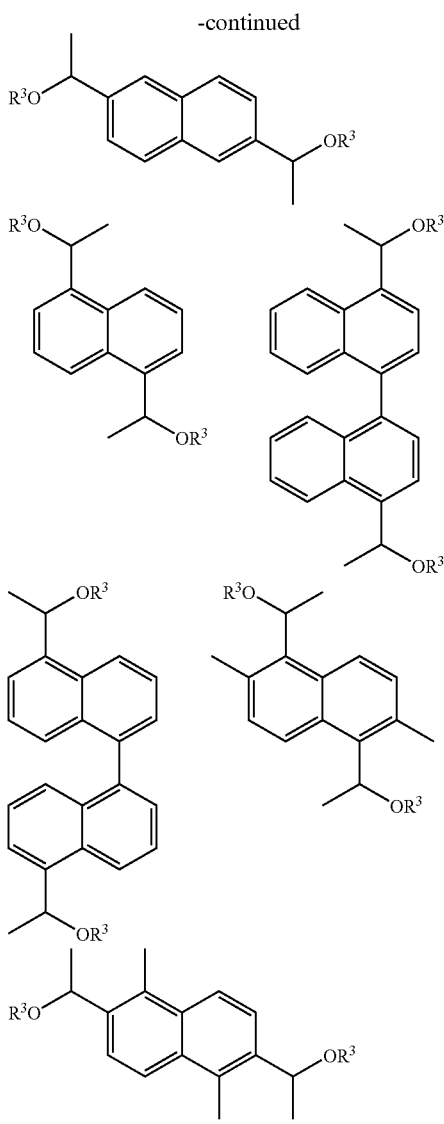

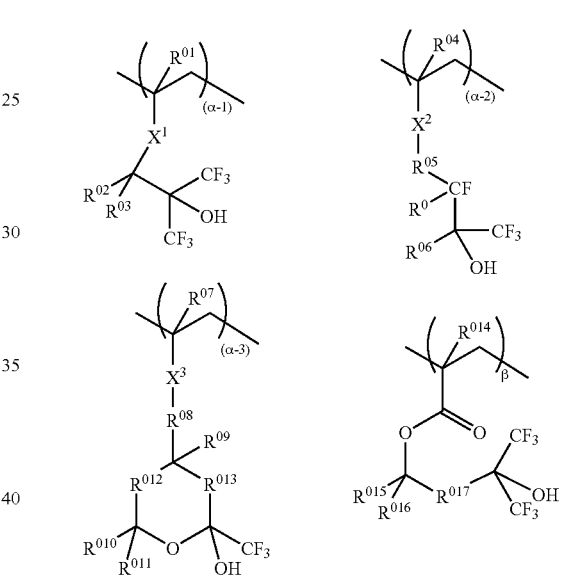

The positive resist composition used in the pattern forming process of the invention may further include a surfactant which is commonly used for improving the coating characteristics.

Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301a, EF303 and EF352 (Tohkem Products Co., Ltd.), Megaface F171a, F172 and F173 (Dai-Nippon Ink & Chemicals, Inc.), Fluorad FC-430 and FC-431 (Sumitomo 3M Co., Ltd.), Asahiguard AG710, Surflon S-381a, S-382, SC101a, SC102, SC103, SC104, SC105, SC106, KH-10, KH-20, KH-30 and KH-40 (Asahi Glass Co., Ltd.), and Surfynol E1004 (Nisshin Chemical Industry Co., Ltd.); organosiloxane polymers KP341a, X-70-092 and X-70-093 (Shin-Etsu Chemical Co., Ltd.), acrylic acid or methacrylic acid Polyflow No. 75 and No. 95 (Kyoeisha Yushi Kagaku Kogyo Co., Ltd.). Inter alia, FC-430, Surflon S-381a, Surfynol E1004, KH-20 and KH-30 are preferred. These surfactants may be used alone or in admixture.

To the positive resist composition, the surfactant is added in an amount of up to 2 parts, preferably up to 1 part by weight, per 100 parts by weight of the base resin.

In the resist composition, a surfactant which tends to segregate near the resist surface after spin coating and has the function of minimizing penetration and leaching of water may be added, particularly in the absence of a resist protective film. These surfactants are polymeric surfactants. They are insoluble in water and soluble in alkali, and preferably highly water repellent and water slippery. Suitable polymeric surfactants have the following formula.

Herein $R^{01}a$, $R^{04}$, $R^{07}$ and $R^{014}$ are each independently hydrogen or methyl, $R^{02}$, $R^{03}$, $R^{015}$ and $R^{016}$ are each independently hydrogen, or straight, branched or cyclic $C_1$a-$C_{20}$ alkyl or fluoroalkyl, $R^{02}$ and $R^{03}$, or $R^{015}$ and $R^{016}$ may bond together to form a non-aromatic ring with the carbon atom to which they are attached, and in the ring-forming case, $R^{02}$ and $R^{03}$, or $R^{015}$ and $R^{016}$ denote straight, branched or cyclic alkylene or fluoroalkylene groups having 2 to 20 carbon atoms in total, $R^0$ is fluorine or hydrogen or may bond with $R^{05}$ to form a non-aromatic ring having 3 to 10 carbon atoms in total, $R^{05}$ is straight, branched or cyclic $C_1$a-$C_6$ alkylene in which one or more hydrogen atoms may be substituted by fluorine, $R^{06}$ is straight or branched $C_1$a-$C_{10}$ alkyl in which one or more hydrogen atoms are substituted by fluorine, $R^{05}$ and $R^{06}$ may bond together to form a non-aromatic ring with the carbon atoms to which they are attached, and in the ring-forming case, $R^{05}$ and $R^{06}$ denote trivalent organic groups having 2 to 12 carbon atoms in total, $R^{08}$ is a single bond or $C_1$a-$C_4$ alkylene, $R^{010}$ and $R^{011}$ are each independently hydrogen, fluorine, methyl or trifluoromethyl, $R^{012}$ and $R^{013}$ are each independently a single bond, —O— or —$CR^{018}R^{019}$—, $R^{09}$, $R^{018}$ and $R^{019}$ are hydrogen, fluorine, methyl or trifluoromethyl, $R^{017}$ is straight or branched $C_1a$-$C_4$ alkylene, or may bond with $R^{015}$ and $R^{016}$ to form a non-aromatic ring with the carbon atom to which they are attached, $X^1a$, $X^2$ and $X^3$ are each independently —C(=O)—O—, —O— or —C(=O)—$R^{020}$—C(=O)— wherein $R^{020}$ is straight, branched or cyclic $C_1a$-$C_{10}$ alkylene, α-1a, α-2, α-3 and β are numbers in the range: $0 \leq (\alpha\text{-}1a) < 1$, $0 \leq (\alpha\text{-}2) < 1$, $0 \leq (\alpha\text{-}3) < 1$, $0 < (\alpha\text{-}1a)+(\alpha\text{-}2)+(\alpha\text{-}3) < 1$, $0 < \beta < 1a$, and $0 < (\alpha\text{-}1a)+(\alpha\text{-}2)+(\alpha\text{-}3)+\beta \leq 1$.

To the resist composition, the polymeric surfactant is added in an amount of 0.001 to 20 parts, preferably 0.01 to 10 parts by weight, per 100 parts by weight of the base polymer.

Process

Now, the double patterning process is described. FIGS. 1 to 3 illustrate prior art double patterning processes.

Referring to FIG. 1, one exemplary double patterning process 1 is illustrated. A photoresist film 30 is coated and formed on a processable substrate 20 on a substrate 10. To prevent the photoresist pattern from collapsing, the technology intends to reduce the thickness of photoresist film. One approach taken to compensate for a lowering of etch resistance of thinner film is to process the processable substrate using a hard mask. The double patterning process illustrated in FIG. 1 uses a multilayer coating in which a hard mask 40 is laid between the photoresist film 30 and the processable substrate 20 as shown in FIG. 1-A. In the double patterning process, the hard mask is not always necessary, and an underlayer film in the form of a carbon film and a silicon-containing intermediate film may be laid instead of the hard mask, or an organic antireflective coating may be laid between the hard mask and the photoresist film. The hard mask used herein may be of $SiO_2$, SiN, SiON or p-Si, for example. The resist material used in double patterning process 1 is a positive resist composition. In the process, the resist film 30 is exposed and developed (FIG. 1-B), the hard mask 40 is then dry etched (FIG. 1-C), the photoresist film is stripped, and a second photoresist film 50 is coated, formed, exposed, and developed (FIG. 1-D). Then the processable substrate 20 is dry etched (FIG. 1-E). Since this etching is performed using the hard mask pattern and the second photoresist pattern as a mask, variations occur in the pattern size after etching of the processable substrate due to a difference in etch resistance between hard mask 40 and photoresist film 50.

To solve the above problem, a double patterning process 2 illustrated in FIG. 2 involves laying two layers of hard mask 41 and 42. The upper layer of hard mask 42 is processed using a first resist pattern, the lower layer of hard mask 41 is processed using a second resist pattern, and the processable substrate is dry etched using the two hard mask patterns. It is essential to establish a high etching selectivity between first hard mask 41 and second hard mask 42. Thus the process is rather complex.

FIG. 3 illustrates a double patterning process 3 using a trench pattern. This process requires only one layer of hard mask. However, since the trench pattern is lower in optical contrast than the line pattern, the process has the drawbacks of difficult resolution of the pattern after development and a narrow margin. It is possible to form a wide trench pattern and induce shrinkage by the thermal flow or RELACS method, but this process is more intricate. Using negative resist materials enables exposure at a high optical contrast, but the negative resist materials generally have the drawbacks of low contrast and low resolution capability as compared with positive resist materials.

The double patterning processes 1 to 3 described above have the drawback that two hard mask etchings are involved.

FIG. 4 illustrates a double patterning process of the invention. As in FIG. 1-A, a first photoresist film 30 of positive resist composition is formed on a processable substrate 20 on a substrate 10 via a hard mask 40 (FIG. 4-A). The resist film 30 is then exposed and developed to form a first resist pattern (FIG. 4-B). The resist film is then caused to crosslink and cure with the aid of heat or of acid and heat to form a crosslinked film 30a (FIG. 4-C). Further, a second resist composition is coated thereon to form a second resist film 50, which is exposed and developed to form a pattern of second resist film 50 in the space area of the pattern of first resist film 30 (FIG. 4-D). Then the hard mask 40 is etched (FIG. 4-E). The processable substrate 20 is dry etched, and finally, the first (crosslinked) resist film 30a and second resist film 50 are removed (FIG. 4-F).

Figure 5A:
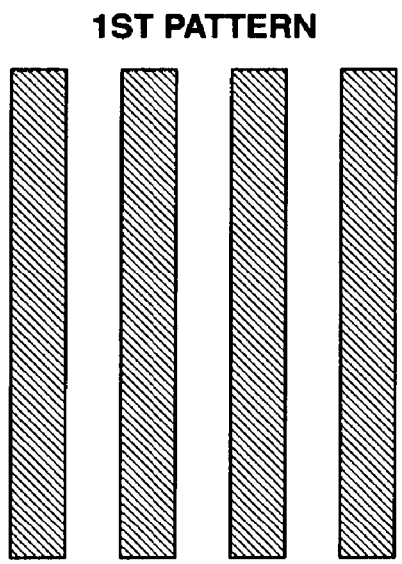
FIG. 5 is a top-down view of a double patterning process according an embodiment of the invention.
Figure 5B:
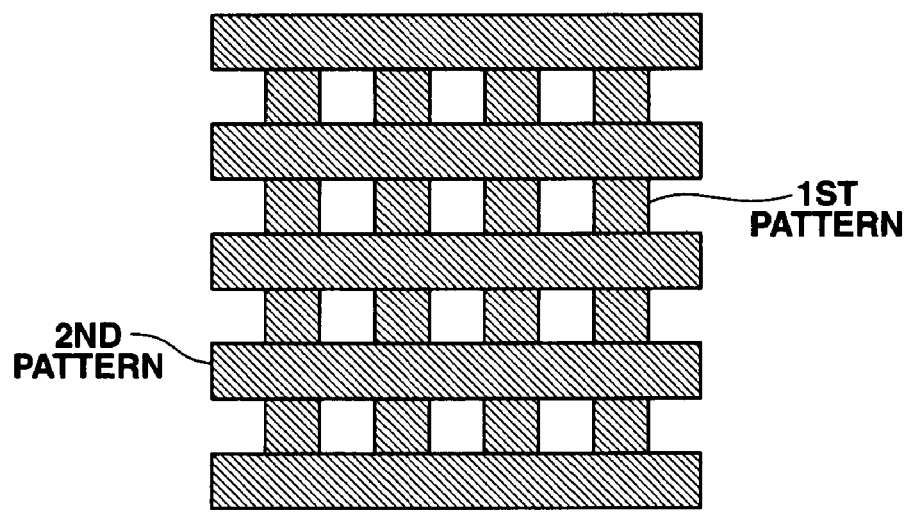
Figure 6A:
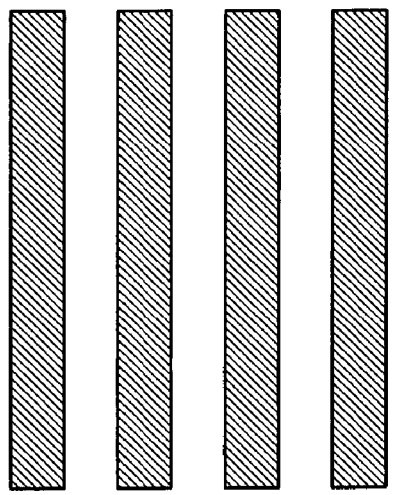
FIG. 6 is a top-down view of a double patterning process according another embodiment of the invention.
Figure 6B:
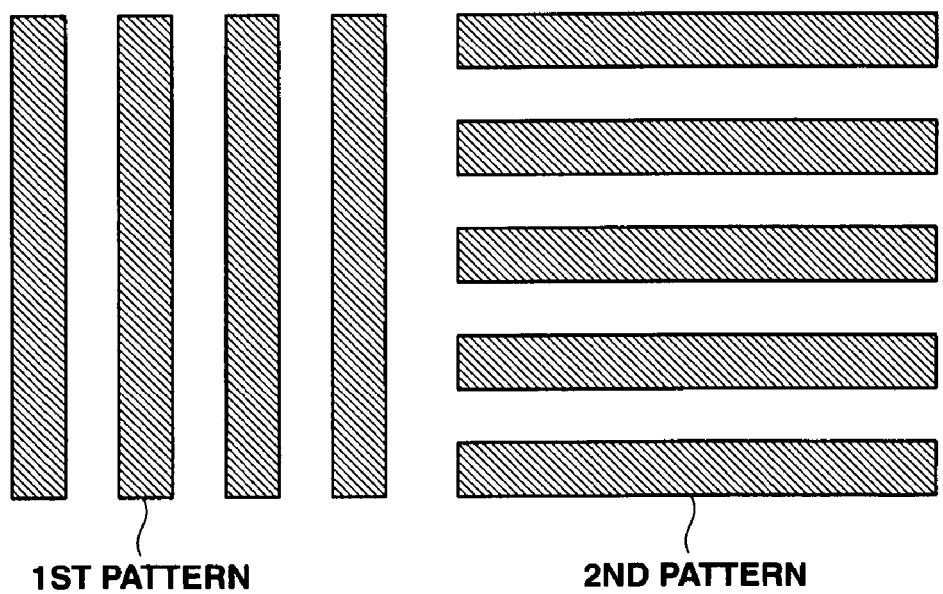

Although the process illustrated in FIG. 4 forms the second pattern between lines of the first pattern, it is also acceptable to form the second pattern so as to cross the first pattern orthogonally as shown in FIG. 5. Although such a pattern may be formed through a single exposure step, an orthogonal line pattern may be formed at a very high contrast by a combination of dipolar illumination with polarized illumination. Specifically, pattern lines in Y-direction are formed as shown in FIG. 5-A and then insolubilized by the process of the invention. Thereafter, a second resist is coated and processed to form pattern lines in X-direction as shown in FIG. 5-B. Combining X and Y lines defines a grid pattern while empty areas become holes. The pattern that can be formed by such a process is not limited to the orthogonal pattern, and may include a T-shaped pattern (not shown) or a separated pattern as shown in FIG. 6.

The substrate 10 used herein is generally a silicon substrate. The processable substrate 20 used herein includes $SiO_2$, SiN, SiON, SiOC, p-Si, α-Si, TiN, WSi, BPSG, SOG, Cr, CrO, CrON, MoSi, low dielectric film, and etch stopper film. The hard mask 40 is as described above.

In the process of the invention, a first resist film of positive resist material is formed on the processable substrate directly or via the intermediate intervening layer. The first resist film preferably has a thickness of 10 to 1,000 nm, and more preferably 20 to 500 nm. The resist film is heated or pre-baked prior to exposure, with the preferred pre-baking conditions including a temperature of 60 to 180° C., especially 70 to 150° C. and a time of 10 to 300 seconds, especially 15 to 200 seconds.

This is followed by exposure. For the exposure, preference is given to high-energy radiation having a wavelength of 140 to 250 nm, and especially ArF excimer laser radiation of 193 nm. The exposure may be done either in air or in a dry atmosphere with a nitrogen stream, or by immersion lithography in water. The ArF immersion lithography uses deionized water or liquids having a refractive index of at least 1 and highly transparent to the exposure wavelength such as alkanes as the immersion solvent. The immersion lithography involves prebaking a resist film and exposing the resist film to light through a projection lens, with water (or liquid) introduced between the resist film and the projection lens. Since this allows lenses to be designed to a NA of 1.0 or higher, formation of finer feature size patterns becomes possible. The immersion lithography is important for the ArF lithography to survive to the 45-nm node. In the case of immersion lithography, deionized water rinsing (or post-soaking) may be carried out after exposure for removing water droplets left on the resist film, or a protective coating may be applied onto the resist film after pre-baking for preventing any leach-out from the resist film and improving water slip on the film surface. The resist protective coating used in the immersion lithography is preferably formed from a solution of a polymer having 1,1,1,3,3,3-hexafluoro-2-propanol residues which is insoluble in water, but soluble in an alkaline developer liquid, in a solvent selected from alcohols of at least 4 carbon atoms, ethers of 8 to 12 carbon atoms, and mixtures thereof. After formation of the photoresist film, deionized water rinsing (or post-soaking) may be carried out for extracting the acid generator and the like from the film surface or washing away particles, or after exposure, rinsing (or post-soaking) may be carried out for removing water droplets left on the resist film.

Exposure is preferably carried out so as to provide an exposure dose of about 1 to 200 mJ/cm$^2$, more preferably about 10 to 100 mJ/cm$^2$. This is followed by baking on a hot plate at 60 to 150° C. for 1 to 5 minutes, preferably at 80 to 120° C. for 1 to 3 minutes (post-exposure baking=PEB).

Thereafter the resist film is developed with a developer in the form of an aqueous alkaline solution, for example, an aqueous solution of 0.1 to 5 wt %, preferably 2 to 3 wt % tetramethylammonium hydroxide (TMAH) for 0.1 to 3 minutes, preferably 0.5 to 2 minutes by conventional techniques such as dip, puddle or spray techniques. In this way, a desired resist pattern is formed on the substrate.

To cure the resist pattern as developed, crosslinking must be induced with the aid of acid or heat. The acid may be generated by subjecting the wafer as developed to flood exposure to decompose the photoacid generator. The flood exposure may be performed at an exposure wavelength of 120 to 400 nm to provide an exposure dose of 10 mJ/cm$^2$ to 10 J/cm$^2$. Irradiation from an excimer laser of sub-200 nm wavelength, especially 193 nm, 172 nm, 146 nm, and 122 nm, or an excimer lamp not only causes the photoacid generator to generate an acid, but also promotes photo-induced crosslinking reaction. If light of wavelength below 180 nm is irradiated in air, ozone forms, with which the resist surface is oxidized, leading to a substantial loss of film thickness. Since ozone oxidation by light irradiation is generally utilized for cleaning off the organic deposits on substrates, the resist film is also cleaned by ozone, with the risk that the film can be extinguished if the exposure dose is substantial. Thus, where an excimer laser of wavelength 172 nm, 157 nm, 146 nm or 122 nm, or an excimer lamp is used, it is recommended to purge the chamber with an inert gas such as nitrogen, He, Ar, or Kr gas, so that light may be irradiated in an atmosphere having an oxygen or moisture concentration of up to 10 ppm.

In an embodiment wherein a thermal acid generator such as an ammonium or sulfonium salt has been added to the photoresist composition, the acid may be generated by heating. In this embodiment, acid generation and crosslinking reaction take place simultaneously. Preferred heating conditions include a temperature of 100 to 300° C., especially 120 to 250° C. and a time of 10 to 500 seconds. This results in a crosslinked resist film which is insoluble in solvents and alkaline developers.

Next, a second resist composition is coated on the intermediate intervening layer (e.g., hard mask) having the pattern of crosslinked resist film thereon, to form a second resist film. Preferably the second resist composition is a positive resist composition, more preferably positive chemically amplified resist composition. As the second resist composition, any well-known resist compositions may be used as well as the above-described resist composition. The pattern forming process of the invention is characterized in that development of the first resist pattern is followed by crosslinking reaction with the aid of heat or of acid and heat, whereas development of the second resist pattern need not be followed by crosslinking reaction. Namely, for the resist material for forming the second resist pattern, the substituted or unsubstituted hydroxyalkylnaphthalene units having formula (1a) are not essential.

Preferably the second resist film is exposed and developed in a conventional way to form a pattern of second resist film in the space area of the pattern of crosslinked resist film, for thereby reducing the distance between patterns to one half. The conditions of exposure and development of the second resist film may be the same as the previous conditions.

Next, using the first (crosslinked) resist film and second resist film as a mask, the intermediate intervening layer (e.g., hard mask) is etched, and the processable substrate further etched. For etching of the intermediate intervening layer such as hard mask, dry etching with fluorocarbon or halogen gases may be used. For etching of the processable substrate, the etching gas and conditions may be properly chosen so as to establish an etching selectivity relative to the hard mask, and specifically, dry etching with fluorocarbon, halogen, oxygen, hydrogen or similar gases may be used. Thereafter, the first (crosslinked) resist film and second resist film are removed. Removal of these films may be carried out after etching of the intermediate intervening layer such as hard mask. It is noted that removal of the crosslinked resist film may be achieved by dry etching with oxygen or radicals and removal of the second resist film may be achieved as previously described, or using strippers such as amines, sulfuric acid/aqueous hydrogen peroxide or organic solvents.

EXAMPLE

Examples of the invention are given below by way of illustration and not by way of limitation. The abbreviations used herein are GPC for gel permeation chromatography, Mw for weight average molecular weight, Mn for number average molecular weight, Mw/Mn for molecular weight distribution or dispersity, NMR for nuclear magnetic resonance, and LER for line edge roughness. For all polymers, Mw and Mn are determined by GPC versus polystyrene standards.

Synthesis Example 1

Synthesis of (6-hydroxymethyl-2-naphthyl)methyl methacrylate

To a mixture of 10.0 g of naphthalene-2,6-dimethanol, 200 ml of tetrahydrofuran, and 20 g of a 25% sodium hydroxide aqueous solution at room temperature, 10.2 g of methacryloyl chloride was added dropwise over one hour. Ethyl acetate was added to the reaction mixture whereupon the organic layer was separated, washed with saturated sodium chloride solution, and vacuum concentrated, yielding 17.3 g of a crude product. The crude product was purified by silica gel column chromatography, collecting 6.60 g (yield 53%) of the target compound and 7.2 g of the by-product, (6-methacryloyloxymethyl-2-naphthyl)methyl methacrylate.

(6-hydroxymethyl-2-naphthyl)methyl methacrylate

Colorless Solid
IR (film): ν=3266, 1710, 1637, 1457, 1319, 1168, 1016 cm$^{-1}$a,
$^1$H-NMR (600 MHz in DMSO-d$_6$):
δ=1.92 (3H, s), 4.67 (1H, d, J=5.5 Hz), 5.32 (2H, s), 5.34 (1H, t, J=5.5 Hz), 5.70-5.72 (1H, m), 6.10 (1H, t, J=1 Hz), 7.49 (2H, dt, J=1.8, 8.3 Hz), 7.82 (1H, s), 7.86-7.90 (3H, m) ppm
$^{13}$C-NMR (150 MHz in DMSO-d$_6$):

δ=18.03, 62.92, 66.00, 124.09, 125.64, 125.88, 126.10, 126.52, 127.63, 127.98, 131.83, 132.52, 133.19, 135.80, 140.62, 166.41 ppm (6-methacryloyloxymethyl-2-naphthyl)methyl methacrylate Colorless Solid IR (film): ν=1714, 1641, 1457, 1322, 1176, 1014 cm$^{-1}$a, $^1$H-NMR (600 MHz in DMSO-d$_6$):

δ=1.91 (6H, s), 5.33 (4H, s), 5.71 (2H, t, J=1.8 Hz), 6.10 (2H, s), 7.54 (2H, dd, J=1, 8.5 Hz), 7.91a-7.95 (4H, m) ppm $^{13}$C-NMR (150 MHz in DMSO-d$_6$):

δ=17.99, 65.86, 126.11, 126.16, 128.19, 132.27, 134.08, 135.75, 166.36 ppm

Synthesis Example 2

Polymers to be used in resist compositions were prepared by combining various monomers, effecting copolymerization reaction in tetrahydrofuran medium, crystallization in methanol, repeatedly washing with hexane, isolation, and drying. The resulting polymers (Polymers 1 to 14, Comparative Polymers 1 to 2) had the composition shown below. The composition of each polymer was analyzed by $^1$H-NMR, and the Mw and Mw/Mn determined by GPC.

Polymer 1

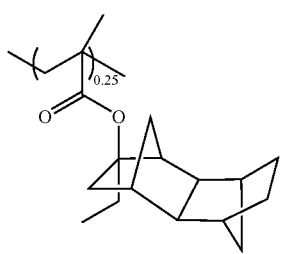 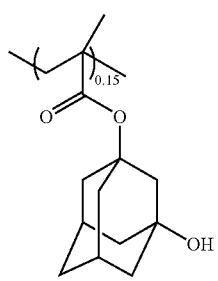

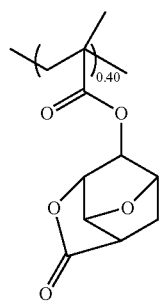 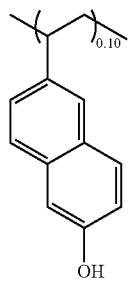

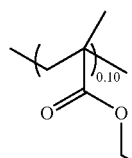

Mw = 9,100
Mw/Mn = 1.81

Polymer 2

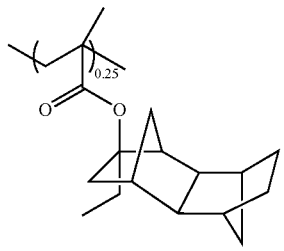 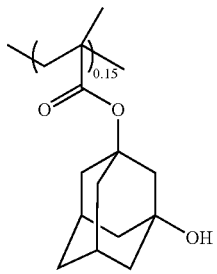

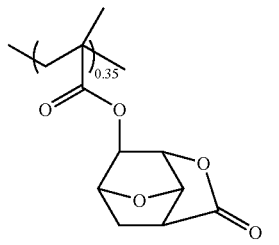 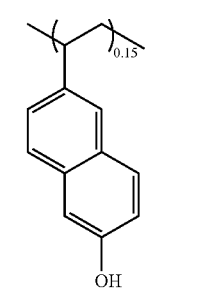

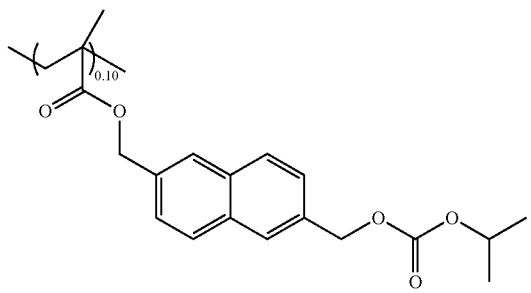

Mw = 9,100
Mw/Mn = 1.89

Polymer 3

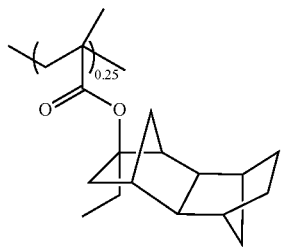 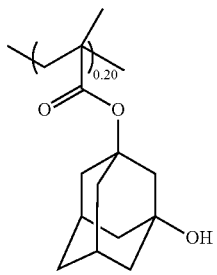

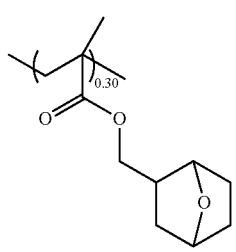 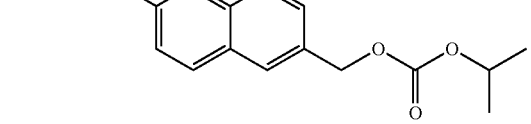

Mw = 6,100
Mw/Mn = 1.56

Polymer 4
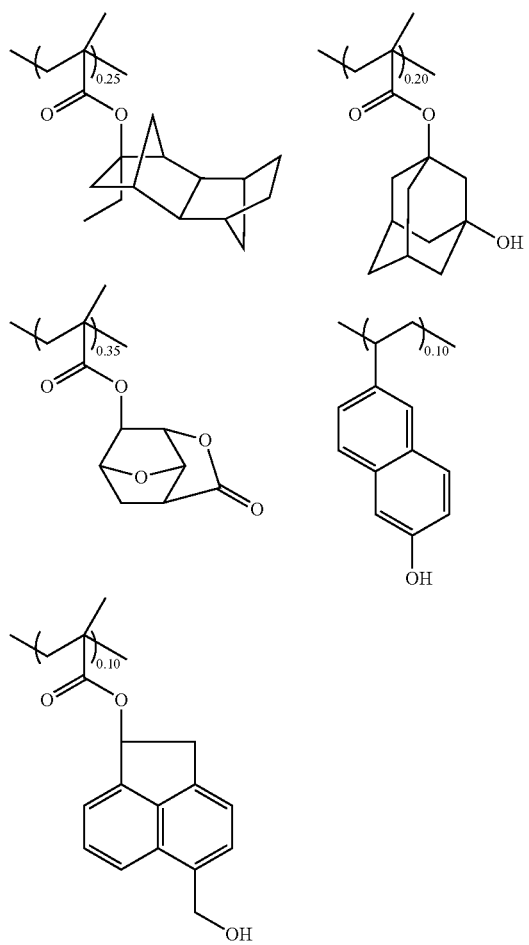
Mw = 10,400
Mw/Mn = 1.97
Polymer 6
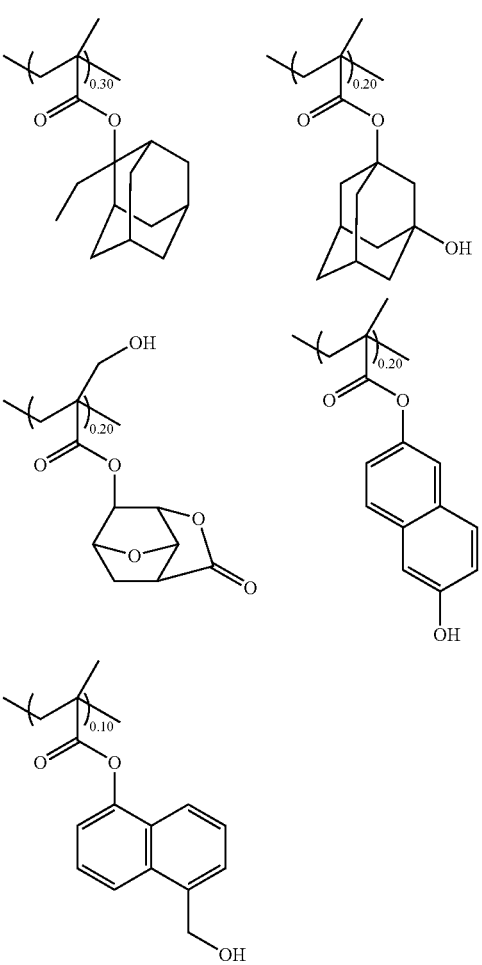
Mw = 7,100
Mw/Mn = 1.71
Polymer 5
Polymer 7
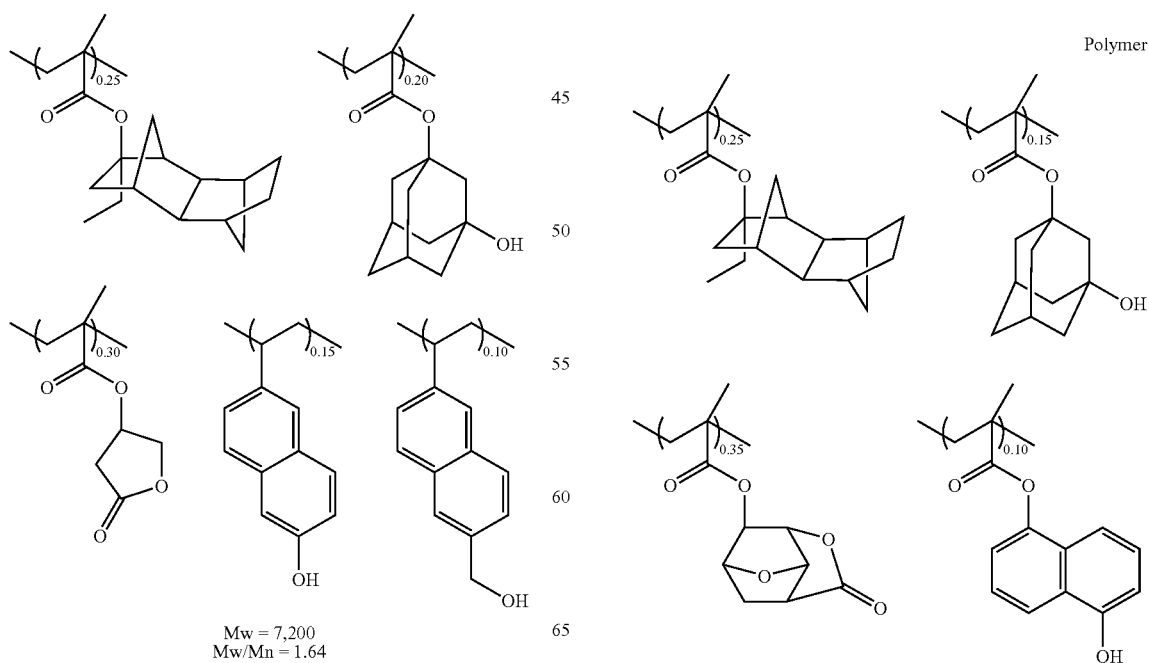
Mw = 7,200
Mw/Mn = 1.64

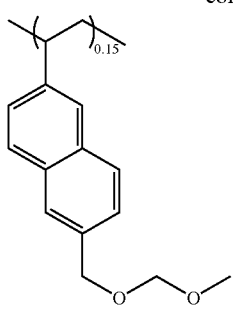
Mw = 7,300
Mw/Mn = 1.52
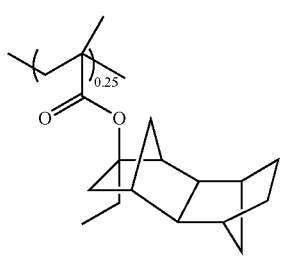 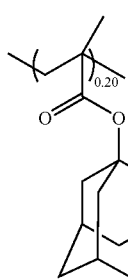
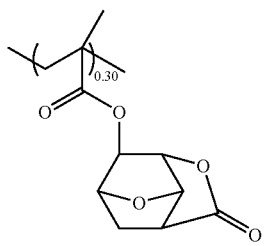
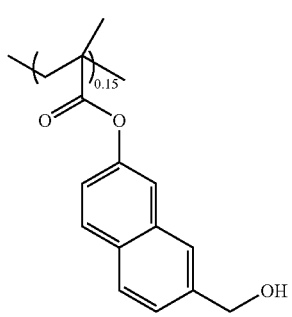
Mw = 9,900
Mw/Mn = 1.75
Polymer 8
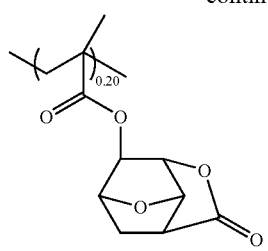 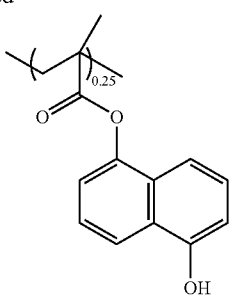
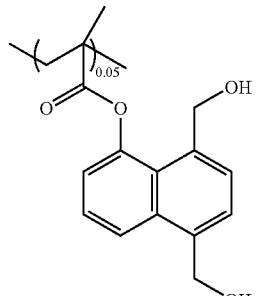
Mw = 7,900
Mw/Mn = 1.89
Polymer 10
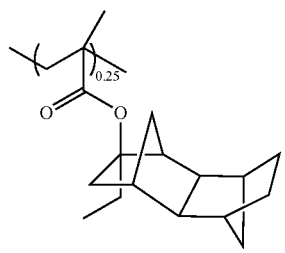 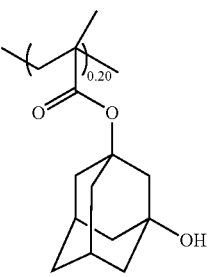
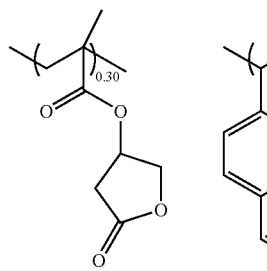
Mw = 7,900
Mw/Mn = 1.61
Polymer 9
Polymer 11
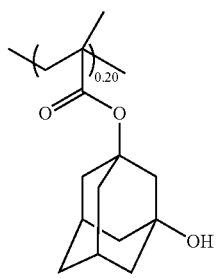 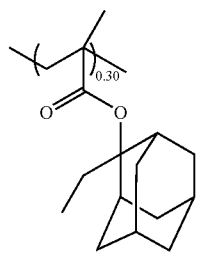 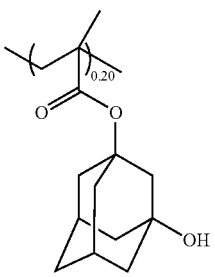

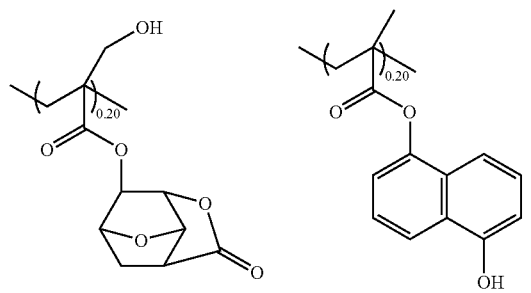
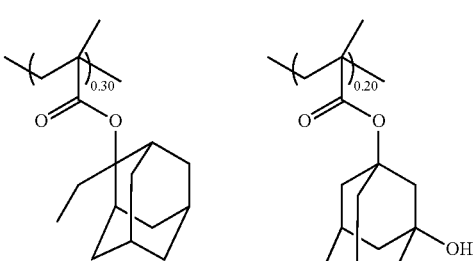
Polymer 13
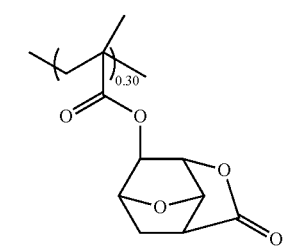
Mw = 7,800
Mw/Mn = 1.73
Polymer 12
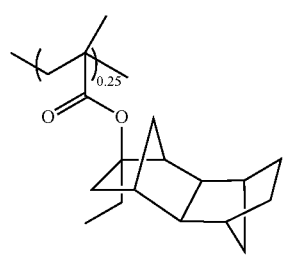
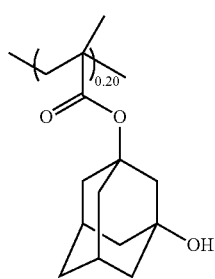
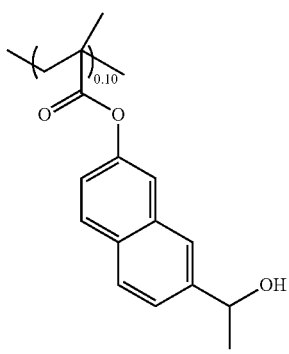
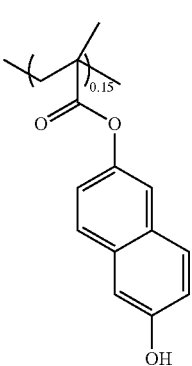
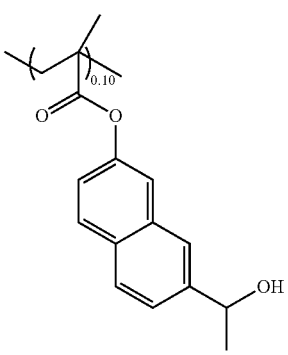
Mw = 7,300
Mw/Mn = 1.52
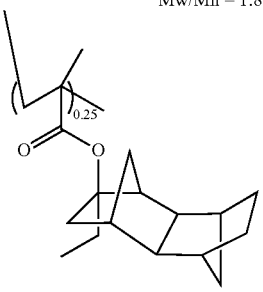
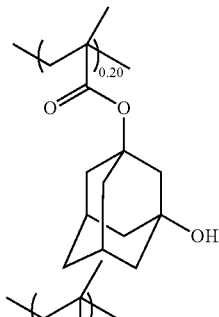
Polymer 14
Mw = 8,100
Mw/Mn = 1.85
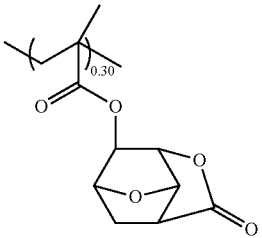

Examples 1 to 16 and Comparative Examples 1 to 2

Polymer Crosslinking Test

The above-synthesized polymers (Polymers 1 to 14, Comparative Polymers 1 to 2) were examined for thermal crosslinking with the aid of an acid catalyst. A solution was prepared by mixing each polymer, a thermal acid generator and a solvent in accordance with the recipe shown in Table 1a, and filtering through a Teflon® filter with a pore size of 0.2 µm.

The components in Table 1 are identified below.

Thermal acid generators: TAG1 to 3 of the following structural formulae

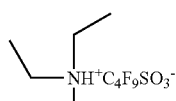
TAG 1

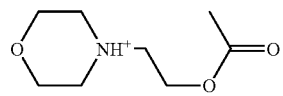
TAG 2

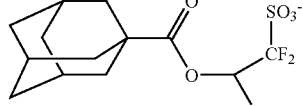

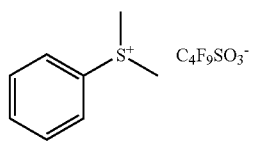
TAG 3

Organic solvent: propylene glycol monomethyl ether acetate (PGMEA)

Each polymer solution was coated onto a 8-inch silicon substrate, baked at 100° C. for 60 seconds and then at 180° C. for 60 seconds to form a polymer film, which was measured for thickness by an optical film thickness gauge. On the polymer film, a solvent mixture of PGMEA and cyclohexanone in a weight ratio of 70/30 was dispensed for 20 seconds, spin dried at 2,000 rpm for 30 seconds, and dried at 100° C. for 60 seconds. The film thickness was measured again, from which a difference in film thickness before and after solvent application was computed.

Separately, each polymer solution was coated onto a 8-inch silicon substrate, baked at 100° C. for 60 seconds and then at 180° C. for 60 seconds to form a polymer film, which was measured for thickness by an optical film thickness gauge. The film was developed with a 2.38 wt % aqueous solution of tetramethylammonium hydroxide (TMAH) for 30 seconds, rinsed with deionized water, and spin dried. The film thickness was measured again, from which a difference in film thickness before and after development was computed.

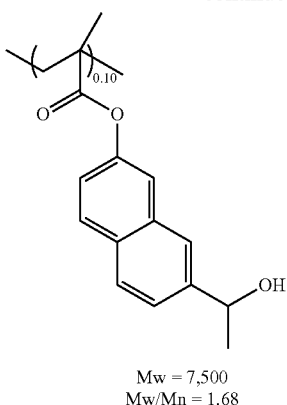

Mw = 7,500
Mw/Mn = 1.68

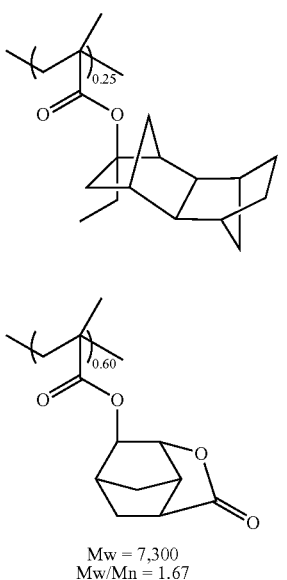

Comparative Polymer 1

Mw = 7,300
Mw/Mn = 1.67

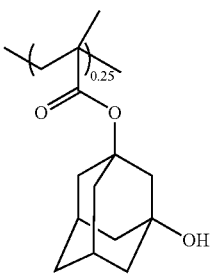

Comparative Polymer 2

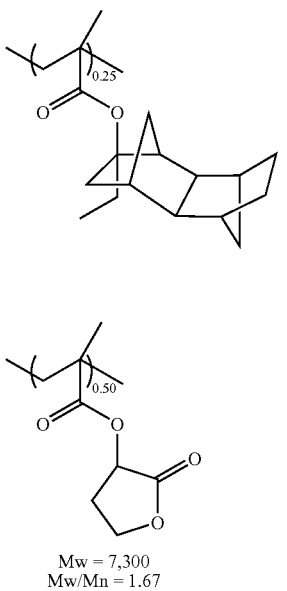

Mw = 7,300
Mw/Mn = 1.67

The results are shown in Table 1a.

TABLE 1

Curing test

| | Polymer (pbw) | TAG (pbw) | Organic solvent (pbw) | Film thickness reduction after solvent application (nm) | Film thickness reduction after development (nm) |
|---|---|---|---|---|---|
| Example 1 | Polymer 1 (100) | TAG1 (4.0) | PGMEA (800) | 1.2 | 1.9 |
| Example 2 | Polymer 2 (100) | TAG1 (4.0) | PGMEA (800) | 1.4 | 1.8 |
| Example 3 | Polymer 3 (100) | TAG1 (4.0) | PGMEA (800) | 1.5 | 2.2 |
| Example 4 | Polymer 4 (100) | TAG1 (4.0) | PGMEA (800) | 1.3 | 1.8 |
| Example 5 | Polymer 5 (100) | TAG1 (4.0) | PGMEA (800) | 1.8 | 1.7 |
| Example 6 | Polymer 6 (100) | TAG1 (4.0) | PGMEA (800) | 2.3 | 1.8 |
| Example 7 | Polymer 7 (100) | TAG1 (4.0) | PGMEA (800) | 0.3 | 2.1 |
| Example 8 | Polymer 8 (100) | TAG1 (4.0) | PGMEA (800) | 0.2 | 2.2 |
| Example 9 | Polymer 9 (100) | TAG1 (4.0) | PGMEA (800) | 0.2 | 1.3 |
| Example 10 | Polymer 1 (100) | TAG2 (4.0) | PGMEA (800) | 1.5 | 1.9 |
| Example 11 | Polymer 1 (100) | TAG3 (4.0) | PGMEA (800) | 1.8 | 1.5 |
| Example 12 | Polymer 10 (100) | PAG2 (10.0) | PGMEA (800) | 0.6 | 2.5 |
| Example 13 | Polymer 11 (100) | TAG1 (4.0) | PGMEA (800) | 0.3 | 1.1 |
| Example 14 | Polymer 12 (100) | TAG1 (4.0) | PGMEA (800) | 0.2 | 1.2 |
| Example 15 | Polymer 13 (100) | TAG1 (4.0) | PGMEA (800) | 0.2 | 1.3 |
| Example 16 | Polymer 14 (100) | TAG1 (4.0) | PGMEA (800) | 0.2 | 1.3 |
| Comparative Example 1 | Comparative Polymer 1 (100) | TAG1 (4.0) | PGMEA (800) | 50 | 150 |
| Comparative Example 2 | Comparative Polymer 2 (100) | TAG1 (4.0) | PGMEA (800) | 65 | 180 |

It is seen from the data in Table 1 that when compositions comprising a base polymer having optionally substituted hydroxyalkylnaphthalene and a thermal acid generator are coated and baked at 180° C., the resulting films are rendered insoluble in both the solvent and developer. This proves a progress of crosslinking.

Examples 17 to 40 and Comparative Examples 3 to 7

Preparation of Positive Resist Composition

A resist solution was prepared by dissolving each of the above-synthesized polymers (Polymers 1 to 14, Comparative Polymers 1 to 2) and other components in a solvent in accordance with the recipe shown in Table 2, and filtering through a Teflon® filter with a pore size of 0.2 μm.

The components in Table 2 are identified below.

Acid generators: PAG1 and PAG2 of the following structural formulae

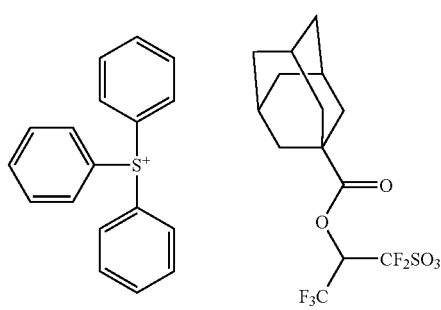

PAG1

PAG 2

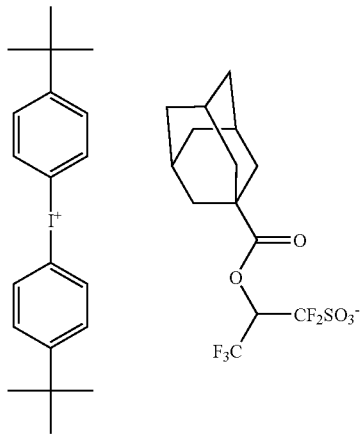

Basic compound: Quencher 1 of the following structural formula

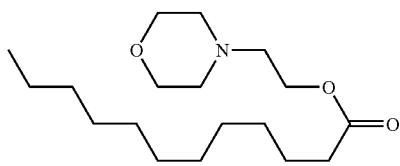

Quencher 1

Crosslinker: Crosslinker of the following structural formula

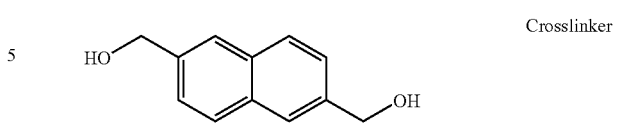

Crosslinker

Organic solvent: PGMEA

ArF Exposure/Patterning Test

On a substrate (silicon wafer) having deposited thereon an antireflective coating (ARC-29A, Nissan Chemical Industries, Ltd.) of 80 nm thick, a resist solution prepared in accordance with the recipe of Table 2 was spin coated, then baked on a hot plate at 100° C. for 60 seconds to give a resist film having a thickness of 120 nm.

The resist film was exposed by means of an ArF excimer laser scanner model NSR-S307E (Nikon Corp., NA 0.85, a 0.93/0.70, 20° dipole illumination, 6% halftone phase shift mask). Immediately after exposure, the resist film was baked (PEB) at 100° C. for 60 seconds and then developed for 30 seconds with a 2.38 wt % TMAH aqueous solution, obtaining a positive pattern.

The resist pattern was evaluated. The sensitivity of the resist was the exposure dose (mJ/cm$^2$) which provided a 1:1 resolution to a 65-nm line-and-space pattern. Using a measuring SEM model S-9380 (Hitachi Ltd.), the edge roughness of 65-nm line at this exposure dose was measured.

Next, the coated wafers in Examples 17 to 24, 26 and Comparative Examples 3 and 4 were exposed over their entire surface to ArF excimer laser in a dose of 100 mJ/cm$^2$ and then heated on a hot plate at 180° C. for 60 seconds. The coated wafers in Examples 25, 27 to 34 and Comparative Example 5 were directly heated at 180° C. for 60 seconds without ArF excimer laser exposure. Using a measuring SEM model S-9380 (Hitachi Ltd.), the edge roughness of 65-nm line was measured after heating. The results are shown in Table 2.

TABLE 2

| | Polymer (pbw) | Acid generator (pbw) | Basic compound (pbw) | Crosslinker (pbw) | Organic solvent (pbw) | Sensitivity (mJ/cm$^2$) | LER after development (3σ, nm) | LER after heating (3σ, nm) |
|---|---|---|---|---|---|---|---|---|
| Example 17 | Polymer 1 (100) | PAG1 (14.0) | Quencher1 (1.20) | — | PGMEA (2,000) | 28 | 7.9 | 5.6 |
| Example 18 | Polymer 2 (100) | PAG1 (14.0) | Quencher1 (1.20) | — | PGMEA (2,000) | 37 | 7.3 | 5.3 |
| Example 19 | Polymer 3 (100) | PAG1 (14.0) | Quencher1 (1.20) | — | PGMEA (2,000) | 32 | 8.2 | 6.3 |
| Example 20 | Polymer 4 (100) | PAG1 (14.0) | Quencher1 (1.20) | — | PGMEA (2,000) | 37 | 7.7 | 5.8 |
| Example 21 | Polymer 5 (100) | PAG1 (14.0) | Quencher1 (1.20) | — | PGMEA (2,000) | 32 | 7.0 | 5.1 |
| Example 22 | Polymer 6 (100) | PAG1 (14.0) | Quencher1 (1.20) | — | PGMEA (2,000) | 34 | 7.2 | 5.9 |
| Example 23 | Polymer 7 (100) | PAG1 (14.0) | Quencher1 (1.20) | — | PGMEA (2,000) | 35 | 7.8 | 5.3 |
| Example 24 | Polymer 8 (100) | PAG2 (14.0) | Quencher1 (1.00) | — | PGMEA (2,000) | 46 | 8.3 | 6.6 |
| Example 25 | Polymer 2 (100) | PAG2 (14.0) | Quencher1 (1.00) | — | PGMEA (2,000) | 42 | 8.4 | 6.2 |
| Example 26 | Polymer 2 (100) | PAG1 (14.0) | Quencher1 (1.20) | Crosslinker (7) | PGMEA (2,000) | 30 | 7.8 | 4.3 |
| Example 27 | Polymer 8 (100) | PAG1 (14.0) TAG2 (2.0) | Quencher1 (1.20) | — | PGMEA (2,000) | 33 | 7.8 | 5.8 |
| Example 28 | Polymer 9 (100) | PAG1 (14.0) TAG2 (2.0) | Quencher1 (1.20) | — | PGMEA (2,000) | 38 | 7.3 | 5.9 |

TABLE 2-continued

|  | Polymer (pbw) | Acid generator (pbw) | Basic compound (pbw) | Crosslinker (pbw) | Organic solvent (pbw) | Sensitivity (mJ/cm$^2$) | LER after development (3σ, nm) | LER after heating (3σ, nm) |
|---|---|---|---|---|---|---|---|---|
| Example 29 | Polymer 10 (100) | PAG1 (14.0) TAG2 (2.0) | Quencher1 (1.20) | — | PGMEA (2,000) | 38 | 7.3 | 5.9 |
| Example 30 | Polymer 11 (100) | PAG1 (14.0) TAG2 (2.0) | Quencher1 (1.20) | — | PGMEA (2,000) | 38 | 7.3 | 5.9 |
| Example 31 | Polymer 12 (100) | PAG1 (14.0) TAG2 (2.0) | Quencher1 (1.20) | — | PGMEA (2,000) | 38 | 7.3 | 5.9 |
| Example 32 | Polymer 13 (100) | PAG1 (14.0) TAG2 (2.0) | Quencher1 (1.20) | — | PGMEA (2,000) | 38 | 7.3 | 5.9 |
| Example 33 | Polymer 14 (100) | PAG1 (14.0) TAG2 (2.0) | Quencher1 (1.20) | — | PGMEA (2,000) | 38 | 7.3 | 5.9 |
| Example 34 | Polymer 10 (100) | PAG1 (10.0) TAG3 (5.0) | Quencher1 (1.20) | — | PGMEA (2,000) | 26 | 7.1 | 5.5 |
| Comparative Example 3 | Comparative Polymer 1 (100) | PAG1 (14.0) | Quencher1 (1.20) | — | PGMEA (2,000) | 22 | 8.5 | 7.2 |
| Comparative Example 4 | Comparative Polymer 2 (100) | PAG1 (14.0) | Quencher1 (1.20) | — | PGMEA (2,000) | 29 | 5.0 | Pattern vanished |
| Comparative Example 5 | Comparative Polymer 1 (100) | PAG1 (14.0) TAG2 (2.0) | Quencher1 (1.20) | — | PGMEA (2,000) | 38 | 8.4 | 6.8 |

As seen from Table 2, the resist compositions of Examples 17 to 34 did not flow away or vanish by heating as in Comparative Example 4 and exhibited minimal LER. This is because the crosslinking reaction concomitant with heating is effective for suppressing thermal flow.

Double Patterning Test I

On a substrate (silicon wafer) having an antireflective coating (ARC-29A, Nissan Chemical Industries, Ltd.) of 80 nm thick, each of the resist compositions of Examples 29, 30, and 31 and Comparative Example 5 shown in Table 2 was spin coated, then baked on a hot plate at 100° C. for 60 seconds to form a resist film having a thickness of 120 nm.

The resist film was exposed by means of an ArF excimer laser scanner model NSR-S307E (Nikon Corp., NA 0.85, σ 0.93, normal illumination, 6% halftone phase shift mask). Immediately after exposure, the resist film was baked (PEB) at 100° C. for 60 seconds and then developed for 30 seconds with a 2.38 wt % TMAH aqueous solution, obtaining an isolated positive pattern (1st pattern) having a size of 70 nm and a pitch of 350 nm.

For the resist composition of Comparative Example 5, the coated wafer was exposed over its entire surface by an ArF excimer laser of wavelength 193 nm in an exposure dose of 100 mJ/cm$^2$ and baked at 180° C. for 60 seconds. For the resist compositions of Examples 29, 30 and 31a, after formation of the 1st pattern by development, it was baked at 180° C. for 60 seconds.

Next, the same resist composition was coated on the 1st pattern-bearing wafer so as to form a resist film of 120 nm thick, and baked. The coated wafer was exposed by means of an ArF excimer laser scanner in the same manner as the 1st pattern formation, but using a mask having a line pattern which was shifted 170 nm relative to the first line pattern on the wafer, followed by PEB and development.

For the resist compositions of Examples 29, 30 and 31a, the formation of a 2nd pattern having lines located between lines of the 1st pattern was observed. For the resist composition of Comparative Example 5, a 2nd pattern was formed, but the 1st pattern did not exist because it had been dissolved upon coating of the second resist material.

Double Patterning Test II

In the next test, a protective topcoat composition of Table 3 was used. The polymer for the protective topcoat is identified below.

On a substrate (silicon wafer) having an antireflective coating (ARC-29A, Nissan Chemical Industries, Ltd.) of 80 nm thick, each of the resist compositions of Examples 29, 30 and 31 and Comparative Example 5 shown in Table 2 was spin coated, then baked on a hot plate at 100° C. for 60 seconds to form a resist film of 100 nm thick. A topcoat solution of the composition shown in Table 3 was coated thereon and baked at 90° C. for 60 seconds to form a topcoat of 50 nm thick. By immersion lithography using an ArF excimer laser scanner model NSR-S610C (Nikon Corp., NA 1.30, σ 0.98/0.78, 20° dipole illumination, 6% halftone phase shift mask) with s-polarized illumination, the coated substrate was exposed to radiation in a 40-nm line-and-space pattern in X-direction. Immediately after exposure, the resist film was baked (PEB) at 100° C. for 60 seconds and then developed for 30 seconds with a 2.38 wt % TMAH aqueous solution, obtaining a first line-and-space pattern with a size of 40 nm. It was further baked at 180° C. for 60 seconds.

Next, the same resist composition and the same topcoat composition as above were coated and baked to form a second resist film on the first resist pattern. By immersion lithography using an ArF excimer laser scanner model NSR-S610C (Nikon Corp., NA 1.30, σ 0.98/0.78, 20° dipole illumination, 6% halftone phase shift mask) with s-polarized illumination, the second resist film was exposed to radiation in a 40-nm line-and-space pattern in Y-direction. Immediately after exposure, the resist film was baked (PEB) at 100° C. for 60 seconds and then developed for 30 seconds with a 2.38 wt % TMAH aqueous solution, obtaining a second resist pattern (40-nm line-and-space pattern) crossing orthogonally the first pattern. The line width of the orthogonally crossing first and second patterns was measured by a measuring SEM S-9380 (Hitachi, Ltd.).

The results are shown in Table 4.

Protective Topcoat Polymer
  Mw=8,800
  Mw/Mn=1.69

TABLE 3

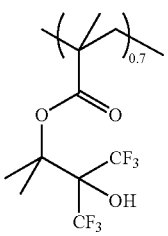

|  | Polymer (pbw) | Organic solvent (pbw) |
| --- | --- | --- |
| TC1 | Protective topcoat polymer (100) | diisoamyl ether (2700)<br>2-methyl-1-butanol (270) |

TABLE 4

|  | Resist | Size of 1st pattern after 2nd pattern formation (nm) | Size of 2nd pattern (nm) |
| --- | --- | --- | --- |
| Example 35 | Example 29 | 38 | 40 |
| Example 36 | Example 30 | 36 | 40 |
| Example 37 | Example 31 | 38 | 41 |
| Comparative Example 6 | Comparative Example 5 | 10 | 41 |

Double Patterning Test III

On a substrate (silicon wafer) having an antireflective coating (ARC-29A, Nissan Chemical Industries, Ltd.) of 80 nm thick, each of the resist compositions of Examples 29, 30 and 31 and Comparative Example 5 shown in Table 2 was spin coated, then baked on a hot plate at 100° C. for 60 seconds to form a resist film of 100 nm thick. A topcoat solution of the composition shown in Table 3 was coated thereon and baked at 90° C. for 60 seconds to form a topcoat of 50 nm thick. By immersion lithography using an ArF excimer laser scanner model NSR-S610C (Nikon Corp., NA 1.30, σ 0.98/0.78, 20° dipole illumination, 6% halftone phase shift mask) with s-polarized illumination, the coated substrate was exposed to radiation in a line-and-space pattern including Y-direction lines of 40 nm at a pitch of 160 nm. Immediately after exposure, the resist film was baked (PEB) at 100° C. for 60 seconds and then developed for 30 seconds with a 2.38 wt % TMAH aqueous solution, obtaining a first 1:3 line-and-space pattern with a line size of 40 nm. It was further baked at 180° C. for 60 seconds.

Next, the same resist composition and the same topcoat composition as above were coated and baked to form a second resist film on the first resist pattern. By immersion lithography using an ArF excimer laser scanner model NSR-S610C (Nikon Corp., NA 1.30, σ 0.98/0.78, 20° dipole illumination, 6% halftone phase shift mask) with s-polarized illumination, the second resist film was exposed to radiation in a line-and-space pattern including Y-direction lines of 40 nm at a pitch of 160 nm and at a position shifted 80 nm in X-direction from the first pattern. Immediately after exposure, the resist film was baked (PEB) at 100° C. for 60 seconds and then developed for 30 seconds with a 2.38 wt % TMAH aqueous solution, obtaining a second resist pattern (40-nm line-and-space pattern) extending parallel to the first pattern. The line width of the first and second patterns was measured by a measuring SEM S-9380 (Hitachi, Ltd.).

The results are shown in Table 5.

TABLE 5

|  | Resist | Size of 1st pattern after 2nd pattern formation (nm) | Size of 2nd pattern (nm) |
| --- | --- | --- | --- |
| Example 38 | Example 29 | 36 | 40 |
| Example 39 | Example 30 | 34 | 40 |
| Example 40 | Example 31 | 35 | 41 |
| Comparative Example 7 | Comparative Example 5 | 8 | 41 |

In Examples 35, 36 and 37, it was seen that the lines of the 2nd pattern crossed orthogonally the lines of the 1st pattern to define a hole pattern. In Comparative Example 6, although the 2nd pattern was formed, the 1st pattern was dissolved upon coating or development of the 2nd resist so that the line width of the 1st pattern became substantially narrow.

In Examples 38, 39 and 40, the formation of the 2nd pattern having lines located in the spaces of the 1st pattern was observed. In Comparative Example 7, although the 2nd pattern was formed, the 1st pattern was dissolved upon coating or development of the 2nd resist so that the line width of the 1st pattern became substantially narrow.

While the invention has been described with reference to a preferred embodiment, it will be understood by those skilled in the art that various changes may be made and equivalents may be substituted for elements thereof without departing from the scope of the invention. Therefore, it is intended that the invention not be limited to the particular embodiment disclosed as the best mode contemplated for carrying out this invention, but that the invention will include all embodiments falling within the scope of the appended claims.

Japanese Patent Application Nos. 2008-054561 and 2008-200430 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A process for forming a pattern, comprising the steps of:
applying a positive resist composition onto a substrate to form a resist film, said resist composition comprising a polymer comprising recurring units derived from a substituted or unsubstituted hydroxyalkylnaphthalene and recurring units which become alkali soluble under the action of an acid,
heat treating the resist film and exposing it to high-energy radiation,
heat treating the exposed resist film and developing it with a developer, and
then causing the resist film to crosslink and cure with the aid of heat or of acid and heat.

2. A pattern forming process, comprising the steps of:
applying a positive resist composition onto a substrate to form a resist film, said resist composition comprising a polymer comprising recurring units derived from a substituted or unsubstituted hydroxyalkylnaphthalene and recurring units which become alkali soluble under the action of an acid,
heat treating the resist film and exposing it to high-energy radiation,
heat treating the exposed resist film and developing it with a developer, and then causing the resist film to crosslink and cure with the aid of heat or of acid and heat, said recurring units derived from a substituted or unsubstituted hydroxyalkylnaphthalene being recurring units (a-1a) and/or (a-2) represented by the general formula (1a):

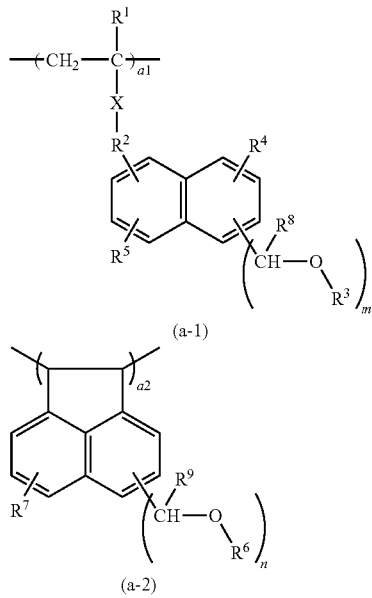

wherein $R^1$ is each independently hydrogen or methyl, X is a single bond, —C(=O)—O—, —O— or —C(=O)—NH—, $R^2$ is a single bond, or a straight, branched, cyclic or bridged cyclic $C_1$a-$C_6$ alkylene group which may have an ether, thioether or ester group, $R^3$ and $R^6$ are hydrogen, straight, branched or cyclic $C_1$a-$C_{10}$ alkyl, acyl or alkoxycarbonyl, or an acid labile group, $R^4$ and $R^5$ are hydrogen, hydroxy, alkoxy, or $C_1$a-$C_4$ alkyl, or $R^2$ and $R^4$, or $R^4$ and $R^5$ may bond together to form a $C_2$-$C_6$ non-aromatic ring with the carbon atoms to which they are attached, $R^7$ is hydrogen, hydroxy, alkoxy, or $C_1$a-$C_6$ alkyl, $R^8$ and $R^9$ are hydrogen or straight, branched or cyclic $C_1$a-$C_6$ alkyl, m and n each are an integer of 1 to 6, and a1 and a2 are numbers in the range: $0 \leq a1 < 1.0$, $0 \leq a2 < 1.0$, and $0 < a1+a2 < 1.0$.

3. A process for forming a pattern, comprising the steps of:
applying a positive resist composition onto a substrate to form a resist film, said resist composition comprising a polymer comprising recurring units (a-1a) and/or (a-2) represented by the general formula (1a) and recurring units which become alkali soluble under the action of an acid,
heat treating the resist film and exposing it to high-energy radiation,
heat treating the exposed resist film and developing it with a developer,
then causing the resist film to crosslink and cure with the aid of heat or of acid and heat, to form a first pattern,
applying a second positive resist composition on the substrate to form a second resist film on the substrate and the first pattern,
heat treating the second resist film and exposing it to high-energy radiation,
heat treating the exposed second resist film and developing it with a developer to form a second pattern, said recurring units (a-1a) and (a-2) being represented by the general formula (1a):

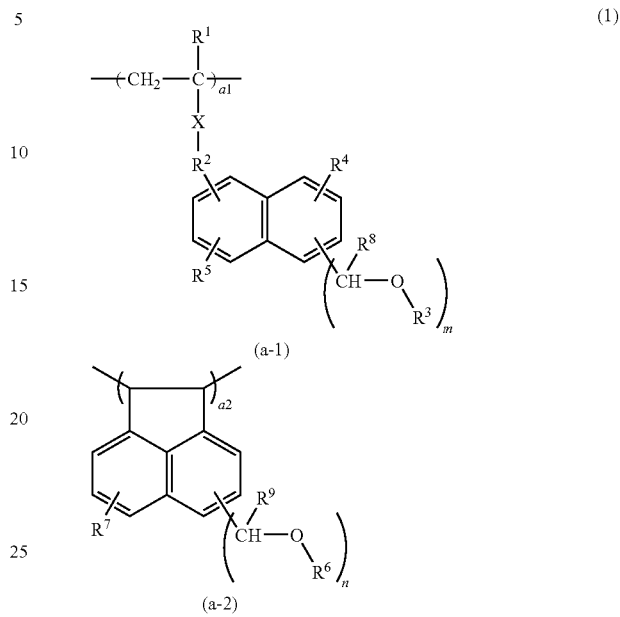

wherein $R^1$ is each independently hydrogen or methyl, X is a single bond, —C(=O)—O—, —O— or —C(=O)—NH—, $R^2$ is a single bond, or a straight, branched, cyclic or bridged cyclic $C_1$a-$C_6$ alkylene group which may have an ether, thioether or ester group, $R^3$ and $R^6$ are hydrogen, straight, branched or cyclic $C_1$a-$C_{10}$ alkyl, acyl or alkoxycarbonyl, or an acid labile group, $R^4$ and $R^5$ are hydrogen, hydroxy, alkoxy, or $C_1$a-$C_4$ alkyl, or $R^2$ and $R^4$, or $R^4$ and $R^5$ may bond together to form a $C_2$-$C_6$ non-aromatic ring with the carbon atoms to which they are attached, $R^7$ is hydrogen, hydroxy, alkoxy, or $C_1$a-$C_6$ alkyl, $R^8$ and $R^9$ are hydrogen or straight, branched or cyclic $C_1$a-$C_6$ alkyl, m and n each are an integer of 1 to 6, and a1 and a2 are numbers in the range: $0 \leq a1 < 1.0$, $0 \leq a2 < 1.0$, and $0 < a1+a2 < 1.0$.

4. The pattern forming process of claim 3 wherein the first pattern includes spaces where the second resist film is left behind to form the second pattern so that the distance between the patterns is reduced by one half.

5. The pattern forming process of claim 3 wherein the second pattern is formed as intersecting the first pattern.

6. The pattern forming process of claim 3 wherein the second pattern is formed in a space portion of the first pattern where first pattern features are absent and in a different direction from the first pattern.

7. The pattern forming process of claim 3 wherein after formation of the first and second patterns, the substrate is processed by dry etching.

8. The pattern forming process of claim 3 wherein the exposure steps for forming the first and second resist patterns are performed by immersion lithography including projecting radiation from an ArF excimer laser of wavelength 193 nm through a lens and holding a liquid having a refractive index of at least 1.4 between the lens and the coated substrate.

9. The pattern forming process of claim 8 wherein the liquid having a refractive index of at least 1.4 is water.

10. The pattern forming process of claim 2 wherein said polymer further comprises recurring units (a-3) having the general formula (3):

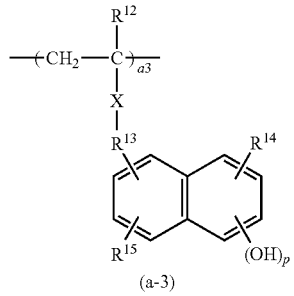

(a-3)

wherein $R^{12}$ is hydrogen or methyl, X is a single bond, —C(=O)—O—, —O— or —C(=O)—NH—, $R^{13}$ is a single bond, or a straight, branched, cyclic or bridged cyclic $C_1a$-$C_6$ alkylene group which may have an ether, thioether or ester group, $R^{14}$ and $R^{15}$ are hydrogen or $C_1a$-$C_4$ alkyl, p is an integer of 1 to 3, and a3 is a number in the range: 0<a3<1.0.

11. The pattern forming process of claim 1 wherein the step of causing the resist film to crosslink and cure with the aid of heat or acid and heat includes exposing to radiation or heating the resist film to cause an acid to generate in the resist film and then heating the resist film at 130 to 300° C. to introduce crosslinks in the resist film to convert it to be insoluble in solvent and alkaline developer.

12. The pattern forming process of claim 1 wherein said recurring units which become alkali soluble under the action of an acid are recurring units (b) having the general formula (2):

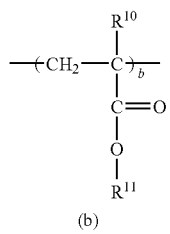

(b)

wherein $R^{10}$ is hydrogen or methyl, $R^{11}$ is an acid labile group, and b is a number in the range: 0<b≦0.8.

13. A positive resist composition for use in the pattern forming process of claim 1, comprising a polymer, an organic solvent, and an acid generator, said polymer comprising recurring units (a-1a) and/or (a-2) represented by the general formula (1a) and recurring units (b) represented by the general formula (2):

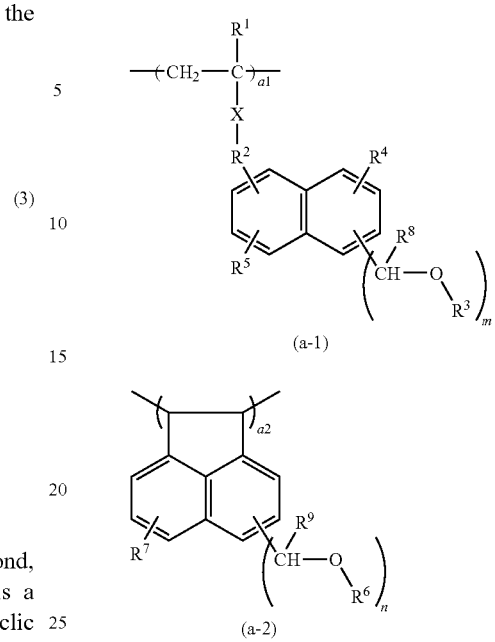

(a-1)

(a-2)

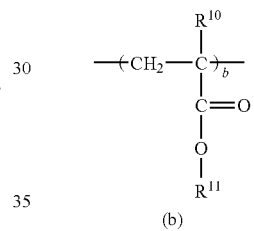

(b)

wherein $R^1$ is each independently hydrogen or methyl, X is a single bond, —C(=O)—O—, —O— or —C(=O)—NH—, $R^2$ is a single bond, or a straight, branched, cyclic or bridged cyclic $C_1a$-$C_6$ alkylene group which may have an ether, thioether or ester group, $R^3$ and $R^6$ are hydrogen, straight, branched or cyclic $C_1a$-$C_{10}$ alkyl, acyl or alkoxycarbonyl, or an acid labile group, $R^4$ and $R^5$ are hydrogen, hydroxy, alkoxy, or $C_1a$-$C_4$ alkyl, or $R^2$ and $R^4$, or $R^4$ and $R^5$ may bond together to form a $C_2$-$C_6$ non-aromatic ring with the carbon atoms to which they are attached, $R^7$ is hydrogen, hydroxy, alkoxy, or $C_1a$-$C_6$ alkyl, $R^8$ and $R^9$ are hydrogen or straight, branched or cyclic $C_1a$-$C_6$ alkyl, $R^{10}$ is hydrogen or methyl, $R^{11}$ is an acid labile group, m and n each are an integer of 1 to 6, a1a, a2 and b are numbers in the range: 0≦a1<1.0, 0≦a2<1.0, 0<a1a+a2<1.0, 0<b≦0.8, and 0.1a≦a1a+a2+b≦1.0;

said acid generator being represented by the general formula (P1aa-1a), (P1aa-2) or (P1aa-3):

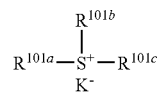

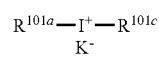

-continued

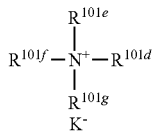
(P1a-3)

wherein $R^{101a}$, $R^{101b}$, and $R^{101c}$ are each independently straight, branched or cyclic $C_1$-$C_{12}$ alkyl, alkenyl, oxoalkyl or oxoalkenyl, $C_6$-$C_{20}$ aryl, or $C_7$-$C_{12}$ aralkyl or aryloxoalkyl group, in which some or all hydrogen atoms may be replaced by alkoxy groups, $R^{101b}$ and $R^{101c}$ may bond together to form a ring with the sulfur atom to which they are attached, each of $R^{101b}$ and $R^{101c}$ is $C_1$-$C_6$ alkylene when they form a ring, $K^-$ is a sulfonate having at least one α-position fluorinated, perfluoroalkylimidate or perfluoroalkylmethidate, $R^{101d}$, $R^{101e}$, $R^{101f}$, and $R^{101g}$ are each independently hydrogen, straight, branched or cyclic $C_1$-$C_{12}$ alkyl, alkenyl, oxoalkyl or oxoalkenyl group, $C_6$-$C_{20}$ aryl group, or $C_7$-$C_{12}$ aralkyl or aryloxoalkyl group, in which some or all hydrogen atoms may be substituted by alkoxy groups, or $R^{101d}$ and $R^{101e}$, or $R^{101d}$, $R^{101e}$ and $R^{101f}$ may bond together to form a ring with the nitrogen atom to which they are attached, and each of $R^{101d}$ and $R^{101e}$, or $R^{101d}$, $R^{101e}$ and $R^{101f}$ is an $C_3$-$C_{10}$ alkylene group or a group forming a hetero-aromatic ring having the nitrogen atom therein when they form a ring.

14. The positive resist composition of claim 13 wherein said polymer comprising recurring units (a-1a) and/or (a-2) represented by the general formula (1a) and recurring units (b) represented by the general formula (2) further comprises hydroxynaphthyl-bearing recurring units (a-3) represented by the general formula (3):

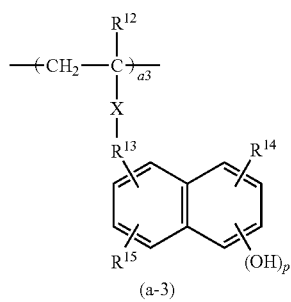
(3)

(a-3)

wherein $R^{12}$ is hydrogen or methyl, X is a single bond, —C(=O)—O—, —O— or —C(=O)—NH—, $R^{13}$ is a single bond, or a straight, branched, cyclic or bridged cyclic $C_1$-$C_6$ alkylene group which may have an ether, thioether or ester group, $R^{14}$ and $R^{15}$ are hydrogen or $C_1$-$C_4$ alkyl, p is an integer of 1 to 3, and a3 is a number in the range: 0<a3<1.0.

15. The positive resist composition of claim 13, further comprising a crosslinker.

16. The positive resist composition of claim 13, further comprising a basic compound and/or a surfactant.

17. A polymerizable monomer compound having the general formula (4):

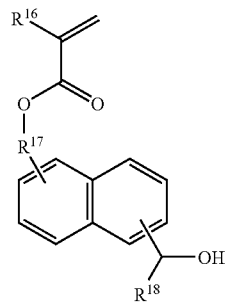
(4)

wherein $R^{16}$ is hydrogen or methyl, $R^{17}$ is a single bond, or a straight, branched, cyclic or bridged cyclic $C_1$-$C_6$ alkylene group which may have an ether, thioether or ester group, $R^{18}$ is hydrogen or straight, branched or cyclic $C_1$-$C_6$ alkyl, with the combination being excluded that $R^{17}$ is a single bond, $R^{18}$ is hydrogen, and the oxygen atom and —$CH_2OH$ bond to the naphthalene at 2- and 6-positions.

* * * * *